United States Patent [19]
Moore et al.

[11] Patent Number: 5,710,407
[45] Date of Patent: Jan. 20, 1998

[54] RAPID THERMAL PROCESSING APPARATUS FOR PROCESSING SEMICONDUCTOR WAFERS

[75] Inventors: Gary M. Moore; Katsuhito Nishikawa, both of San Jose, Calif.

[73] Assignee: Moore Epitaxial, Inc., San Jose, Calif.

[21] Appl. No.: 479,889

[22] Filed: Jun. 7, 1995

Related U.S. Application Data

[63] Continuation of Ser. No. 7,981, Jan. 21, 1993, Pat. No. 5,444,217.
[51] Int. Cl.$^6$ .................................................. C23C 16/00
[52] U.S. Cl. .......................... 219/405; 219/390; 219/411; 118/725; 118/729
[58] Field of Search .................................. 219/388, 390, 219/405, 411; 118/724, 725, 729, 730, 733, 50.1; 392/416, 418; 148/DIG. 3, DIG. 4; 437/173, 174, 247, 248, 946

[56] References Cited

U.S. PATENT DOCUMENTS

| | | | |
|---|---|---|---|
| 3,279,946 | 10/1966 | Schaarschmidt | 117/201 |
| 3,783,822 | 1/1974 | Wollam | 118/49.1 |
| 3,836,751 | 9/1974 | Anderson | 219/411 |
| 3,862,397 | 1/1975 | Anderson et al. | 219/405 |
| 3,916,822 | 11/1975 | Robinson | 118/49 |
| 4,047,496 | 9/1977 | McNeilly | 118/49.1 |
| 4,081,313 | 3/1978 | McNeilly et al. | 156/610 |
| 4,101,759 | 7/1978 | Anthony et al. | 219/343 |
| 4,113,547 | 9/1978 | Katz . | |
| 4,468,260 | 8/1984 | Hiramoto | 148/1.5 |
| 4,493,977 | 1/1985 | Arai et al. | 219/411 |
| 4,497,683 | 2/1985 | Celler et al. | 156/603 |
| 4,511,788 | 4/1985 | Arai et al. | 219/405 |
| 4,533,820 | 8/1985 | Shimizu | 219/411 |
| 4,540,876 | 9/1985 | McGinty | 219/405 |
| 4,545,327 | 10/1985 | Cambell | 118/725 |
| 4,550,245 | 10/1985 | Arai et al. | 219/405 |
| 4,649,261 | 3/1987 | Sheets | 219/390 |
| 4,680,451 | 7/1987 | Gat et al. | 219/411 |
| 4,755,654 | 7/1988 | Crowley | 219/405 |
| 4,789,771 | 12/1988 | Robinson et al. | 219/405 |
| 4,796,562 | 1/1989 | Brors | 118/725 |
| 4,798,165 | 1/1989 | deBoer et al. | 118/715 |

(List continued on next page.)

FOREIGN PATENT DOCUMENTS

| | | | |
|---|---|---|---|
| 0 266 288 | 5/1988 | European Pat. Off. . | |
| 0 339 279 | 11/1989 | European Pat. Off. . | |
| 61-289624 | 12/1986 | Japan | 118/725 |
| 4-202091 | 7/1992 | Japan | 118/725 |
| 1 181 764 | 2/1970 | United Kingdom . | |
| 92 08068 | 5/1992 | WIPO . | |

OTHER PUBLICATIONS

Edited by B. J. Baliga, "Epitaxial Silicon Technology," Academic Press, Inc., 1986, pp. 56–67.
H.M. Liaw and J.W. Rose, "Epitaxial Silicon Technology", Academic Press, Inc. 1986, pp. 56–67.

*Primary Examiner*—Teresa J. Walberg
*Assistant Examiner*—J. Pelham
*Attorney, Agent, or Firm*—Skjerven, Morrill, Macpherson, Franklin & Friel; Forrest E. Gunnison

[57] ABSTRACT

A novel rapid thermal process (RTP) reactor processes a multiplicity of wafers or a single large wafer, e.g., 200 mm (8 inches), 250 mm (10 inches), 300 mm (12 inches) diameter wafers, using either a single or dual heat source. The wafers or wafer are mounted on a rotatable susceptor supported by a susceptor support. A susceptor position control rotates the wafers during processing and raises and lowers the susceptor to various positions for loading and processing of wafers. A heat controller controls either a single heat source or a dual heat source that heats the wafers to a substantially uniform temperature during processing. A gas flow controller regulates flow of gases into the reaction chamber. Instead of the second heat source, a passive heat distribution is used, in one embodiment, to achieve a substantially uniform temperature throughout the wafers. Further, a novel susceptor is used that includes a silicon carbide cloth enclosed in quartz.

6 Claims, 38 Drawing Sheets

Microfiche Appendix Included
(3 Microfiche, 228 Pages)

U.S. PATENT DOCUMENTS

| | | | |
|---|---|---|---|
| 4,821,674 | 4/1989 | deBoer et al. | 118/666 |
| 4,823,735 | 4/1989 | Pichel et al. | 118/730 |
| 4,828,224 | 5/1989 | Crabb et al. | 251/298 |
| 4,836,138 | 6/1989 | Robinson et al. | 118/666 |
| 4,851,358 | 7/1989 | Huber | 437/10 |
| 4,857,689 | 8/1989 | Lee | 219/10.71 |
| 4,920,918 | 5/1990 | Adams et al. | 118/724 |
| 4,924,807 | 5/1990 | Nakayama et al. | 118/725 |
| 4,951,601 | 8/1990 | Maydan et al. | 118/719 |
| 4,975,561 | 12/1990 | Robinson et al. | 219/390 |
| 4,978,567 | 12/1990 | Miller | 428/157 |
| 4,986,838 | 1/1991 | Johnsgard | 55/223 |
| 4,989,540 | 2/1991 | Fuse | 118/719 |
| 5,011,794 | 4/1991 | Grim et al. | 148/DIG. 3 |
| 5,034,199 | 7/1991 | Zavracky et al. | 422/245 |
| 5,044,943 | 9/1991 | Bowman et al. | 432/121 |
| 5,053,247 | 10/1991 | Moore | 427/55 |
| 5,060,354 | 10/1991 | Chizinsky | 29/25.02 |
| 5,074,017 | 12/1991 | Toya et al. | 29/25.01 |
| 5,077,875 | 1/1992 | Hoke et al. | 29/25.01 |
| 5,085,887 | 2/1992 | Adams et al. | 427/55 |
| 5,098,198 | 3/1992 | Nulman et al. | 374/121 |
| 5,104,276 | 4/1992 | Severns et al. | 414/222 |
| 5,106,200 | 4/1992 | Hosokawa | 374/121 |
| 5,108,792 | 4/1992 | Anderson et al. | 118/725 |
| 5,169,684 | 12/1992 | Takagi | 427/248.1 |
| 5,226,056 | 7/1993 | Kikuchi et al. | 373/18 |
| 5,252,807 | 10/1993 | Chizinsky | 219/390 |
| 5,254,171 | 10/1993 | Hayakawa et al. | 118/724 |
| 5,370,739 | 12/1994 | Foster et al. | 118/725 |
| 5,387,557 | 2/1995 | Takagi | 437/247 |
| 5,429,498 | 7/1995 | Okase et al. | 432/152 |

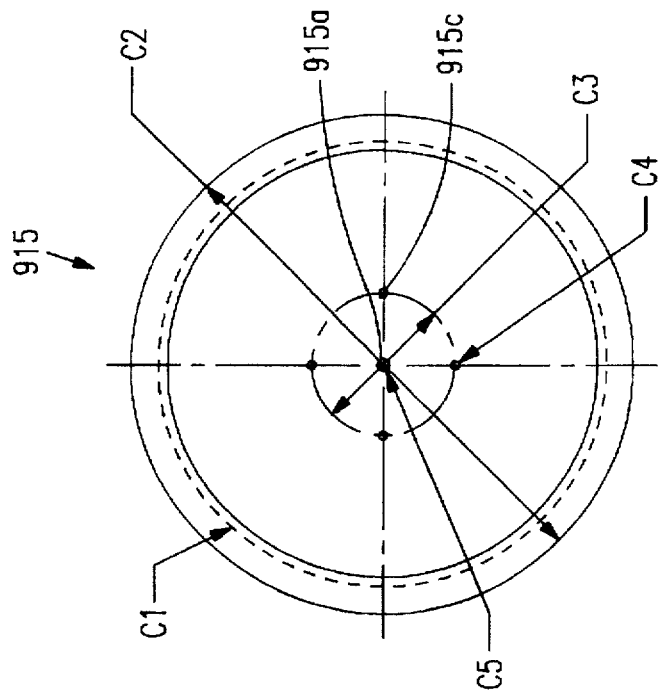
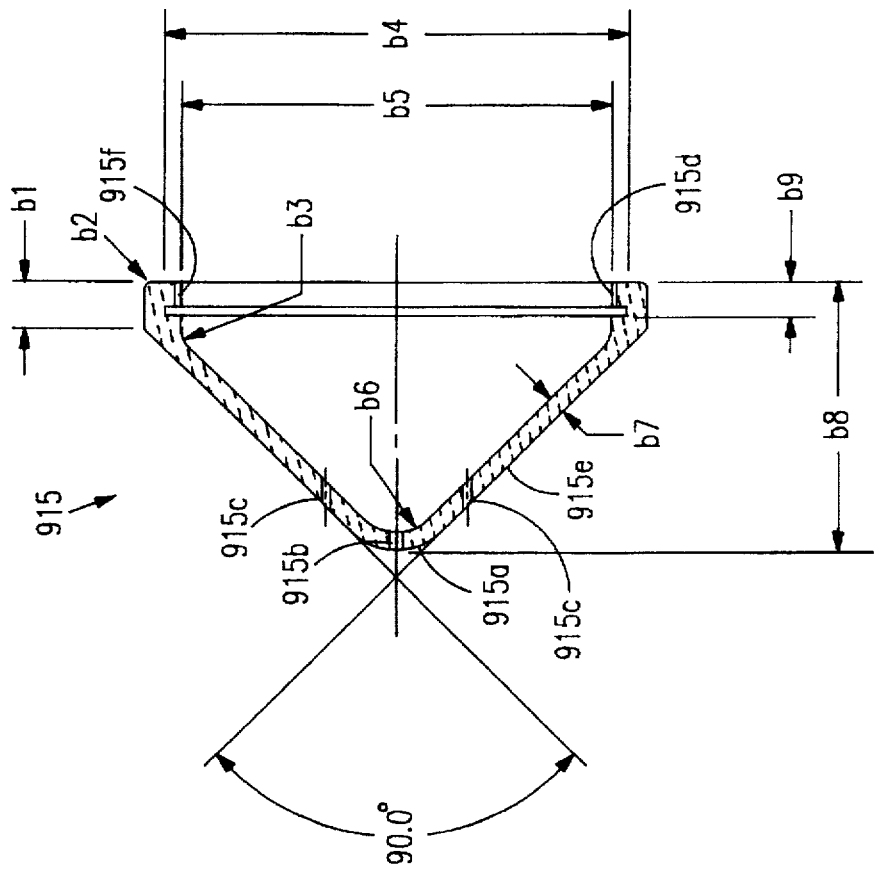
FIG. 9C
FIG. 9B

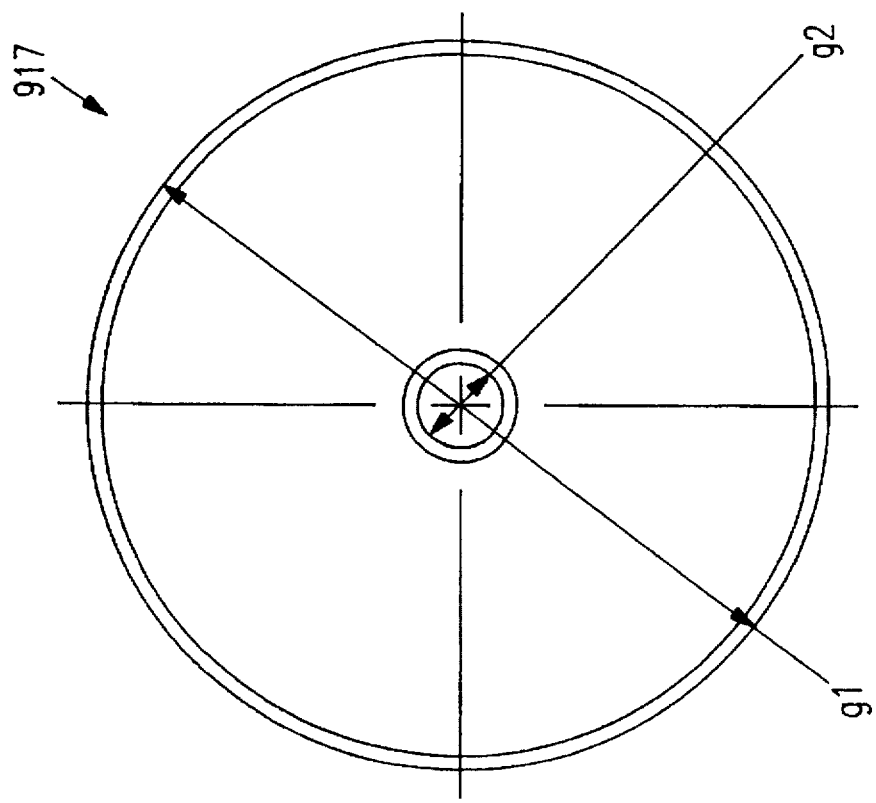
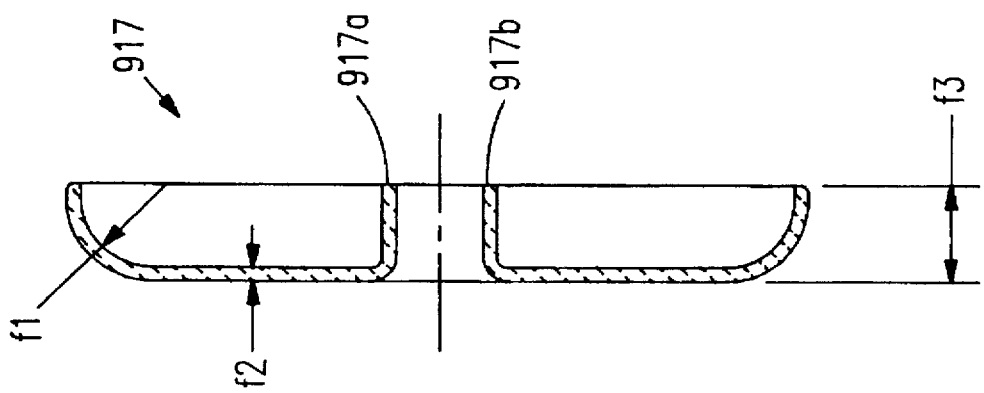

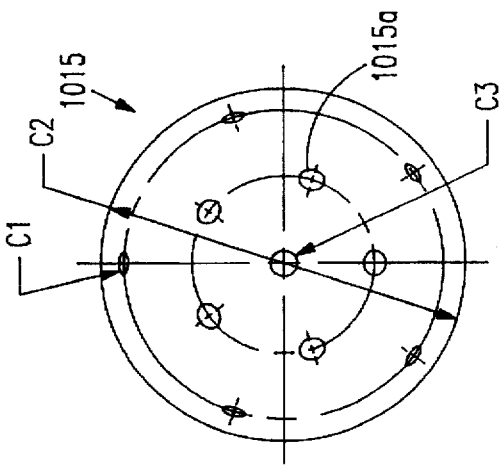
FIG. 10C
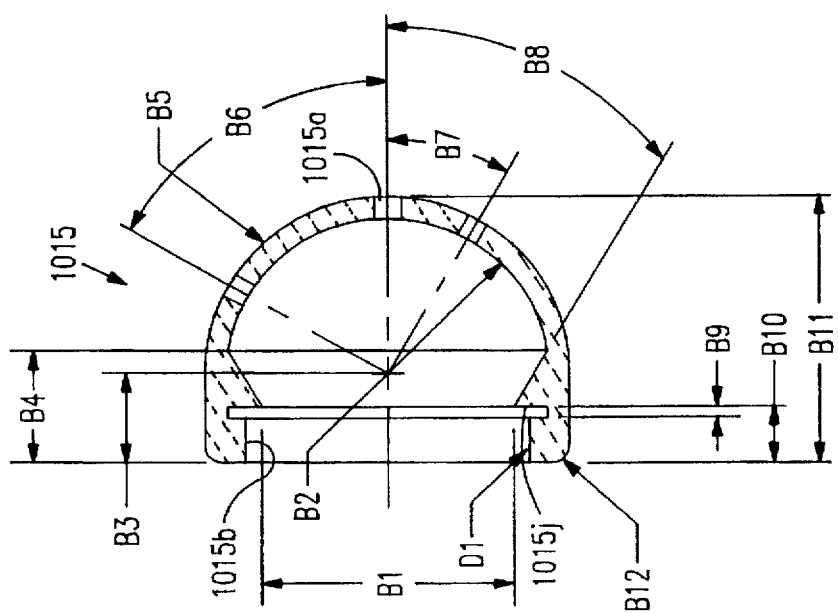
FIG. 10B
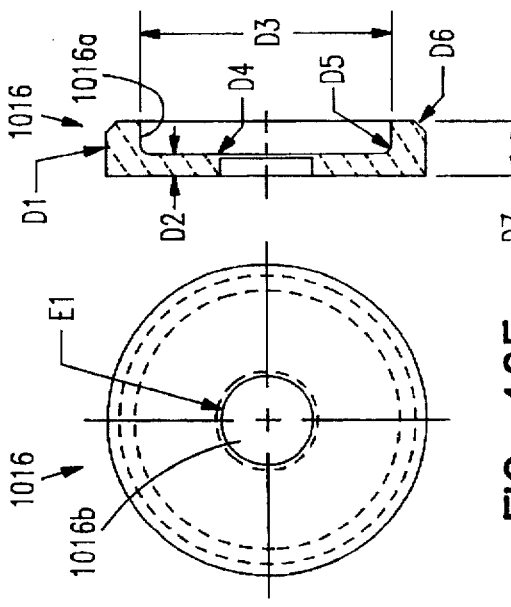
FIG. 10D
FIG. 10E

RAPID THERMAL PROCESSING APPARATUS FOR PROCESSING SEMICONDUCTOR WAFERS

This application is a continuation of application Ser. No. 08/007,981, filed Jan. 21, 1993, now U.S. Pat. No. 5,444,217.

CROSS-REFERENCE TO MICROFICHE APPENDIX

Appendix A, which is a part of the present disclosure, is a microfiche appendix consisting of 3 sheets of microfiche having a total of 228 frames. Microfiche Appendix A is a listing of computer programs and related data in one embodiment of this invention, which is described more completely below.

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

1. Field of the Invention

This invention relates in general to processing semiconductor wafers, and, in particular, to a method and apparatus for rapid thermal processing of a plurality of semiconductor wafers simultaneously and of a single large semiconductor wafer.

2. Related Art

Deposition of a film on the surface of a semiconductor wafer is a common step in semiconductor processing. Typically, selected chemical gases are mixed in a deposition chamber containing a semiconductor wafer. Usually, heat is applied to drive the chemical reaction of the gases in the chamber and to heat the surface of the wafer on which the film is deposited.

In deposition processes, it is desirable to maximize wafer throughput (i.e., the number of wafers processed per unit time), while depositing film layers that have uniform thickness and resistivity. To obtain uniform thickness and resistivity, it is important to maintain the wafer at a uniform temperature.

A number of different deposition reactors have been developed. Generally, each deposition reactor has a reaction chamber, a wafer handling system, a heat source and temperature control, and a gas delivery system (inlet, exhaust, flow control).

FIG. 1A is a simplified cross-sectional view of one type of prior art deposition reactor 100, known as a horizontal furnace, in which susceptor 101 is positioned in horizontal tube 102 (usually of rectangular cross-section), the interior of which is the reaction chamber. Semiconductor wafers, 103a, 103b, and 103c are mounted on surface 101a of susceptor 101. Heat source 104 heats the wafers, and reactant gases 105 are flowed through tube 102 past the wafers. Susceptor 101 is often tilted, as shown in FIG. 1A, so that surface 101a faces into the flow of reactant gases 105 to minimize the problem of reactant depletion in the vicinity of the wafers near the end of the flow of reactant gases 105.

FIG. 1B is a simplified orthogonal view of another type of prior art reactor 110, known as a barrel reactor, in which susceptor 111 is suspended in the interior of bell jar 112 which defines the reaction chamber. Semiconductor wafers, e.g., wafer 113, are mounted substantially vertically on the sides, e.g., side 111a, of susceptor 111. Heat source 114 heats the wafers, and reactant gases are introduced through gas inlet 115 into the top of bell jar 112. The gases pass down the length of susceptor 111, over the surfaces of the wafers, and are exhausted from the reaction chamber through a gas outlet (not shown) at the bottom of bell jar 112.

FIG. 1C is a simplified cross-sectional view of yet another type of prior art conventional chemical vapor deposition reactor 120, known as a pancake reactor, in which vertically fixed susceptor 121 is supported from the bottom of bell jar 122 which defines the reaction chamber. Semiconductor wafers, e.g., wafer 123, are mounted horizontally on surface 121a of susceptor 121. The wafers are heated by a RF heat source (not shown), and reactant gases are introduced into the reaction chamber above the wafers through susceptor support 125. The gases flow down over the wafers and are exhausted through a gas outlet (not shown) at the bottom of bell jar 122.

Deposition reactors may be classified according to characteristics of their operation. For instance, a reactor may be either cold wall or hot wall. Cold wall reactors are usually preferred because undesirable deposits do not build up on the chamber walls.

A reactor may also be characterized by the amount of time that is required to heat up and cool down the wafer. Conventional reactors take on the order of 40–90 minutes for a complete process cycle of a batch of wafers. Rapid thermal process (RTP) reactors, on the other hand, require only 2–15 minutes to process a wafer. Thus, rapid thermal reactors are characterized by the fact that the process cycle time is significantly less than the process cycle time for a conventional reactor.

Conventional reactors have been used to process a plurality of wafers or a single wafer in one batch, while RTP reactors have been used to process single wafer batches. RTP reactors have not been used for processing multiple wafer batches because the rapid temperature changes in RTP reactors make it difficult to achieve a uniform temperature area in the reaction chamber. The area of the reaction chamber with a uniform temperature limits the operation to a single wafer, typically with a diameter of 200 mm (8 inches) or less.

While RTP reactors have been used to process one wafer at a time, as opposed to the multiple wafer processing of conventional reactors, the one wafer batch capacity of the RTP reactor has been acceptable only because these reactors achieve more uniform resistivities and thicknesses than possible with conventional reactors. In conventional reactors, thickness and resistivity variations of 3–10% are achievable. In RTP reactors, thickness variations of 1–2% and resistivity variations of 1–5% are achievable.

A reactor may also be characterized according to the orientation of the wafer in the reaction chamber. A vertical reactor is one in which the surface on which gases are deposited is substantially vertical. A horizontal reactor is one in which the surface on which gases are deposited is substantially horizontal.

A reactor may also be characterized according to the type of heat source used to heat the wafers. Use of radiant heating for semiconductor processing is known in the prior art and relates back to the late sixties. A variety of systems have been developed for semiconductor processing which include either a radiant energy heat source, or a RF energy heat source, and a susceptor. However, each of these apparatus' suffer from one or more problems.

Sheets, U.S. Pat. No. 4,649,261 entitled "Apparatus for Heating Semiconductor Wafers in Order To Achieve Annealing, Silicide Formation, Reflow of Glass, Passivation Layers, etc.", used two radiant heat sources—a continuous wave and a pulsed heat source—to heat a stationary wafer at 200° C. to 500° C. per second. Shimizu, U.S. Pat. No. 4,533,820 entitled "Radiant Heating Apparatus", shows a reaction chamber surrounded by a plurality of planar light sources which heat a semiconductor wafer supported by a pedestal. Shimizu reported that a uniform oxide film was formed on the semiconductor wafer within three minutes after the lights were turned-on.

Other configurations using dual radiant heat sources to heat a semiconductor wafer are shown, for example, in U.S. Pat. No. 4,680,451, entitled "Apparatus Using High Intensity CW Lamps for Improved Heat Treating of Semiconductor Wafer," issued to Gat et al. on Jul. 14, 1987 and U.S. Pat. No. 4,550,245, entitled "Light-Radiant Furnace for Heating Semiconductor Wafers," issued to Arai et al., on Oct. 29, 1985. Gat et al reported heating a four inch wafer to 700° C. in three seconds, maintaining the temperature for ten seconds, and then ramping the temperature down in three seconds. Arai et al. reported applying 1600 watts to each of the lamps in the radiant heat source to heat a silicon wafer of 450 μm in thickness and 4 inches square in area to a temperature of 1200° C. within 10 seconds of when power was applied to the lamps.

In yet another apparatus for heating a semiconductor wafer, Robinson et al., U.S. Pat. No. 4,789,771, a wafer is supported above a susceptor in a reaction chamber. Infrared heat lamps extend directly through the reaction chamber. This design suffers from several shortcomings. The radiant heat lamps are exposed to the gases in the reaction chamber allowing deposits to form on the lamps. Additionally, the only cooling mechanism for the lamps and the inner surface of the reflectors is the gas flow through the chamber; consequently, lamp lifetime is probably adversely affected. Further, the reflectors are apparently at an elevated temperature, as well as the quartz sheets around the radiant energy bulbs so that, over time, deposits are formed on the bulb and reflector surfaces which, in turn, will affect the uniformity of layers formed on the susceptor. Last, special mechanisms are required to uniformly heat the susceptor surface because the susceptor rotation mechanism, which is typically opaque to radiant energy, prevents direct heating of the entire lower surface of the susceptor.

SUMMARY OF THE INVENTION

The novel rapid thermal process (RTP) reactor of this invention processes not only a single semiconductor wafer, but also a plurality of semiconductor wafers. Herein, an RTP reactor is characterized by a short process cycle time in comparison to the same process cycle time in a conventional reactor. The rapid heat-up of the wafer is one of the keys to the shorter process cycle times that characterize the reactor. The RTP reactor, according to the invention, processes a multiplicity of wafers or a single large wafer, e.g., 200 mm (8 inches), 250 mm (10 inches), 300 mm (12 inches) diameter wafers, using either a single or dual heat source. (Hereafter, wafer sizes are indicated without explicitly stating that the dimension given is the diameter of the wafer.)

According to one embodiment of the invention, 125 mm (5 inches) and 150 mm (6 inches) wafers are processed three to a batch, and 200 mm (8 inches), 250 mm (10 inches) and 300 mm (12 inches) wafers are processed individually. However, larger batch sizes could be processed using a larger reactor that utilizes the principles of this invention.

Specifically, the semiconductor processing structure of this invention has a reaction chamber with a rotatable susceptor mounted within the reaction chamber. The rotatable susceptor has a first surface adapted for mounting one of (i) a single wafer and (ii) a plurality of wafers thereon and a second surface. A radiant heat source is mounted outside the reaction chamber so that the radiant heat from the heat source directly heats the wafer or wafers mounted on the rotatable susceptor. The radiant heat source raises the temperature of the wafer or wafers to a substantially uniform processing temperature, i.e., a temperature sufficiently uniform so as to yield acceptable process results, in a time period such that the semiconductor processing structure is characterized as a rapid thermal process reactor.

In another embodiment, the semiconductor processing structure also includes a heater mounted in the reaction chamber in proximity of the second surface of the rotatable susceptor. Preferably, the heater is a resistance heater. Power to the resistance heater is supplied by an insulated electrical supply lines that have insulation that has a temperature rating that is less than a reaction chamber operating temperature. To thermally insulated the insulated electrical supply lines from the reaction chamber operating temperature, the lines are routed through an annular shaft.

The annular shaft has a wall; a first end fixedly attached to the resistance heater; a second end; and a channel extending, in a direction perpendicular to the first and second ends, from the second end to the first end through the wall. The second end of the annular shaft is exterior to the reaction chamber. The insulated electrical supply line passes through the channel to the resistance heater thereby thermally insulating the insulated electrical supply line from the reaction chamber operating temperature. In one embodiment, a screw, preferably a molybdenum screw, connects the insulated electrical supply line to the resistance heater.

In one embodiment of this invention, the rotatable susceptor is quartz and the first surface is bead blasted while the second surface is flame polished. The susceptor has a pocket for each wafer that it supports. The pocket has a depth that is equal to or slightly less than the thickness of the wafer so that when the wafer is placed in the pocket, a surface of the wafer is parallel with or slightly higher than the first surface of the susceptor.

If a single wafer is being processed, the center of the pocket can be either coincident with or offset from the center of the rotatable susceptor. Offsetting the pocket facilitates loading and unloading of the wafer.

To enhance the uniform temperature of a wafer, a silicon carbide cloth is placed in a pocket formed in the susceptor. This pocket typically has a depth greater than the depth of the pocket described above. In this case, an insert having an outer edge surface and a maximum dimension, typically a diameter, less than a maximum dimension, also typically a diameter, of the pocket is placed in the pocket. Since the size of the insert is less than the size of the pocket, upon placement of the insert into the pocket, a uniform recess is formed between the outer edge of the insert and an outer edge of the pocket. A wafer surround ring is placed in the recess formed.

In one embodiment, the wafer surround ring and the insert have the same depth so that when the wafer is placed on the wafer surround ring and the insert, a surface of the wafer is parallel with or slightly higher than the first surface of the susceptor and the wafer is held in place by the outer edge surface of the pocket. In another embodiment, the wafer surround ring has a notch formed in the upper surface of the wafer surround ring. The notch has a bottom surface substantially parallel to an upper surface of the wafer surround ring and an edge surface that connects the upper surface of the wafer surround ring and the bottom surface of the notch. The bottom surface of the notch is aligned with an upper surface of the insert while the upper surface of the wafer surround ring is aligned with the first surface of the susceptor. In this case, the wafer rests on the upper surface of the insert and the bottom surface of the notch. The edge surface of the notch holds the wafer in place on the susceptor.

In yet another embodiment, the heater in the reaction chamber is replaced by a passive heat distribution structure that is mounted in proximity of the second surface of the rotatable susceptor. The passive heat distribution structure includes a silicon carbide cloth contained within a quartz structure. Alternatively, a graphite cloth can be used.

To inject process gasses into the reactor of this invention either a plurality of gas jets mounted in the reaction chamber or a center gas injection head is used. The reaction chamber is bounded by vessel having a water-cooled side wall, a water-cooled bottom wall, and a forced-air-cooled top wall. The forced-air-cooled top wall is a circular domed-shaped quartz wall.

The radiant energy source of this invention includes a plurality of lamp banks where each lamp bank includes at least one lamp. The lamps are quartz-halogen lamps with a tungsten target.

The novel reactor of this invention also includes a susceptor positioning mechanism coupled to the annular shaft and to a susceptor support means where the susceptor positioning mechanism moves the annular shaft and the susceptor support means in a first direction thereby moving the rotatable susceptor in the first direction.

In yet another embodiment of this invention, a reactor for processing semiconductor wafers includes a reaction chamber vessel mounted in a table that has a top. A shell is movably connected to a track extending in a first direction that is turn is rigidly affixed to the table. A coupler means movably connects the shell to the track. The coupler means includes a plurality of connectors attached to the shell. The plurality of connectors are selectively connectable to and disconnectable from the shell.

As the coupler means is moved along the track, the shell is moved in a first direction from a first position contacting the table surface to a second position removed from the table surface. Upon disconnecting one of the plurality of connectors from the shell when the shell is in the second position, the shell is movable in a second direction substantially perpendicular to the first direction thereby allowing access, unrestricted by the shell, to the reaction chamber vessel.

In one embodiment, the coupler means has a yoke movably connected to the track. The yoke has first and second bosses, and third and fourth bosses. The first and second bosses each have a hole formed therein and the center of the holes of the first and second bosses are on the same axis. The third and fourth bosses also each have a hole formed therein and the center of the holes of the third and fourth bosses are on the same axis. The shell has a first boss having a hole extending therethrough and a second boss having a hole extending therethrough.

A first pin extends through the hole in the first boss of the yoke, the hole in the first boss of the shell and the hole in the second boss of the yoke and connects the yoke to the shell. A second pin extends through the hole in the third boss of the yoke, the hole in the second boss of the shell and the hole in the fourth boss of the yoke and connects the yoke to the shell. Upon removing the first pin, the shell can be moved in the second direction.

As described above, the susceptor of this invention has a first surface adapted for mounting a semiconductor wafer thereon and a second surface. In one embodiment, the susceptor also has a plurality of openings extending through the susceptor from the first surface to the second surface. A wafer support pin is contained in each of the susceptor openings. When the wafer support pins are in a first position, the wafer support pins are contained in the susceptor and in a second position, the wafer support pins hold the semiconductor wafer above the first surface. A plurality of supports, one for each wafer support pin, are mounted in the reactor so that when the susceptor is in a predetermined position, the plurality of supports engage the plurality of wafer support pins and hold the wafer support pins in the second position. When the susceptor is in yet another predetermined position, the plurality of wafer support pins are in the first position.

The silicon deposits on the susceptor and quartz parts in the RTP reactor of this invention are etched using a method that includes:

flowing a gas having a predetermined percentage of HCL though the RTP reactor; and reducing coolant flow to a wall of the RTP reactor so that the wall temperature is higher than a normal operating wall temperature for a silicon deposition process.

Particulate contamination in a reaction chamber of a rapid thermal process reactor having a susceptor that can be moved in a direction orthogonal to a surface of the susceptor is reduced by:

mounting the susceptor on a support means that extends through a wall of the reaction chamber;

moving the susceptor in the orthogonal direction by a mechanism attached to the support means external to the reaction chamber thereby limiting the number of parts within the reaction chamber.

BRIEF DESCRIPTION OF THE DRAWINGS

FIGS. 9B and 9C are a cross-sectional view and plan view, respectively, of an injector cone for use with the gas injection head of FIG. 9A.

FIGS. 9F and 9G are a cross-sectional view and plan view, respectively, of an injector umbrella for use with the gas injection head of FIG. 9A.

FIGS. 10B and 10C are a cross-sectional view and plan view, respectively, of an injection head for use with the gas injection head of FIG. 10A.

FIGS. 10D and 10E are a cross-sectional view and plan view, respectively, of an injection head top for use with the gas injection head of FIG. 10A.

DETAILED DESCRIPTION

According to the principles of this invention, a novel rapid thermal process (RTP) reactor processes not only a single semiconductor wafer, but also a plurality of semiconductor wafers. Herein, an RTP reactor is a reactor that has a process cycle time that is short compared to the same process cycle time in a conventional reactor. The RTP reactor of this invention can heat the wafer or wafers at a rate between 10° C./sec and 400° C./sec. The rapid heat-up of the wafer is one of the keys to the shorter process cycle times that characterize the RTP reactor of this invention. The RTP reactor, according to the invention, processes a multiplicity of wafers or a single large wafer, e.g., 200 mm (8 inches), 250 mm (10 inches), 300 or mm (12 inches) diameter wafer, using either a single or dual heat source. (Hereafter, wafer sizes will be indicated without explicitly stating that the dimension given is the diameter of the wafer.)

According to one embodiment of the invention, 125 mm (5 inches) and 150 mm (6 inches) wafers are processed three to a batch, and 200 mm (8 inches), 250 mm (10 inches) and 300 mm (12 inches) wafers are processed individually. However, larger batch sizes could be processed using a larger reactor that utilizes the principles of this invention. For instance, in another embodiment of the invention, a RTP reactor processes 150 mm (6 inches) wafers in batches of four wafers, 200 mm (8 inches) wafers in batches of three wafers and 300 mm (12 inches) wafers in batches of one wafer.

Figure 1A:
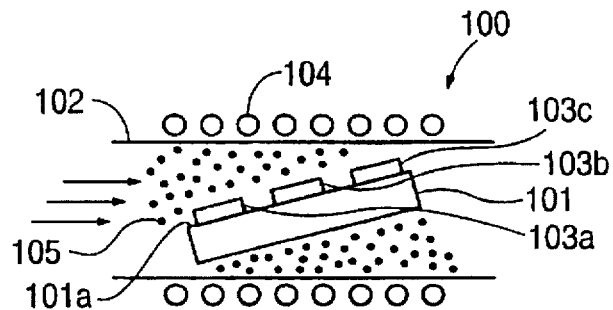
FIG. 1A is a simplified cross-sectional view of a prior art horizontal furnace reactor.
Figure 1B:
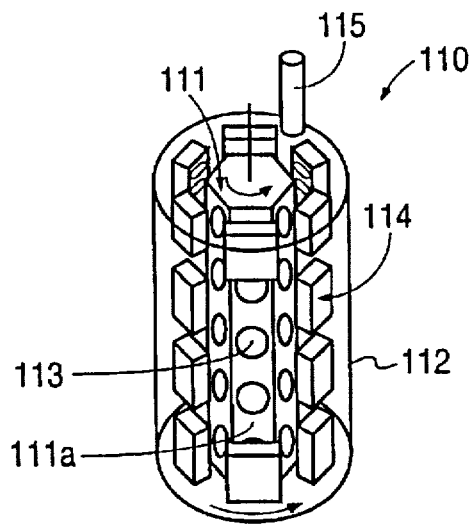
FIG. 1B is a simplified orthogonal view of a prior art barrel reactor.
Figure 1C:
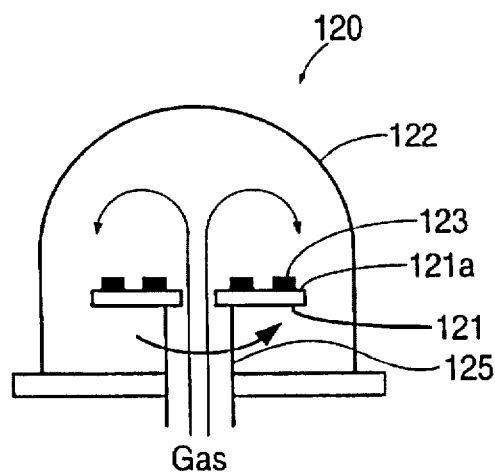
FIG. 1C is a simplified cross-sectional view of a prior art pancake reactor.
Figure 2A:
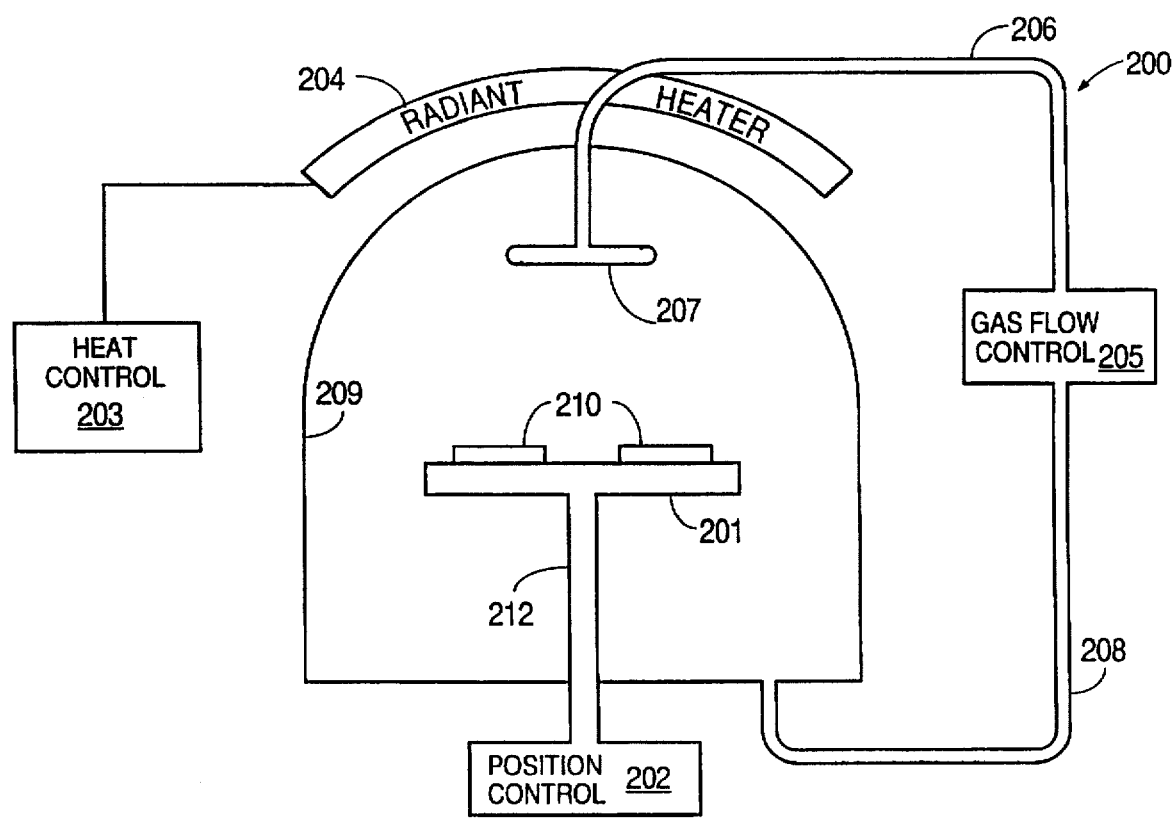
FIG. 2A is a simplified cross-sectional view of a rapid thermal process reactor according to one embodiment of the invention for processing a multiplicity of wafers.

FIG. 2A is a simplified cross-sectional view of an RTP reactor 200, according to one embodiment of the invention, for processing a multiplicity of wafers 210. Wafers 210 are mounted on a susceptor 201 supported by susceptor support 212. Susceptor position control 202 rotates wafers 210 during processing and raises and lowers susceptor 201 to various positions for loading and processing of wafers 210. Heat control 203 controls a single heat source 204 that heats wafers 210 to a substantially uniform temperature during processing. Gas flow control 205 regulates flow of gases into reaction chamber 209 of reactor 200 through inlet channel 206 and gas injection head 207 and exhausts gases from reaction chamber 209 through outlet channel 208.

Herein, a "substantially uniform temperature" is a temperature distribution that yields process results of acceptable quality for the particular process being performed. For example, in epitaxial processes, the temperature distribution must be sufficiently uniform to yield wafers that meet at least industry standards for slip, thickness uniformity, and resistivity uniformity. In fact, in the RTP reactor of this invention, the temperature uniformity is such that for epitaxial processes, the process results are better than industry standard, as discussed more completely below.

Figure 2B:
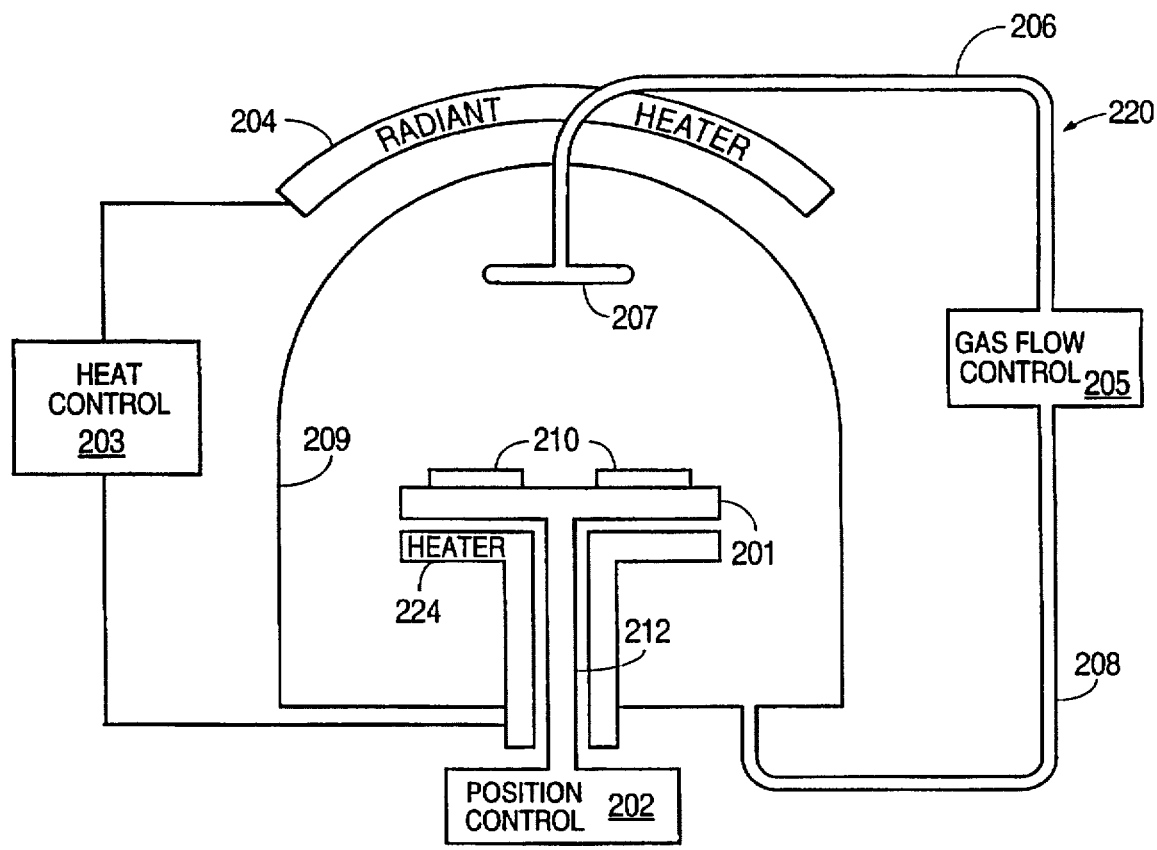
FIG. 2B is a simplified cross-sectional view of a rapid thermal process reactor according to another embodiment of the invention for processing a multiplicity of wafers.

FIG. 2B is a simplified cross-sectional view of an RTP reactor 220, according to another embodiment of the invention, for processing a multiplicity of wafers 230. As in FIG. 2A, reactor 220 includes a susceptor 201, susceptor support 212, susceptor position control 202, heat control 203, heat source 204, gas flow control 205, inlet and outlet channels 206 and 208, gas injection head 207 and reaction chamber 209. Reactor 220 also includes a second heat source 224 that is also controlled by heat control 203.

Figure 2C:
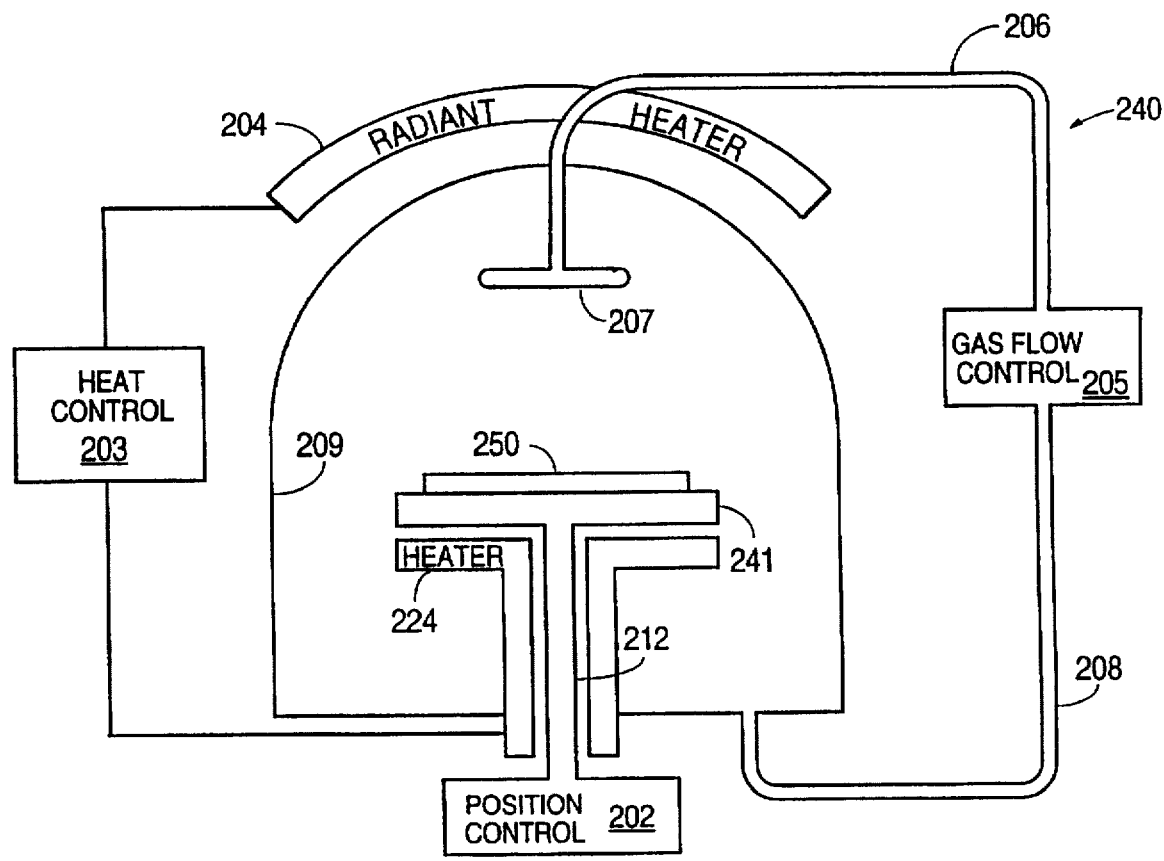
FIG. 2C is a simplified cross-sectional view of a rapid thermal process reactor according to another embodiment of the invention for processing a large single wafer.

FIG. 2C is a simplified cross-sectional view of an RTP reactor 240 according to another embodiment of the invention for processing a large single wafer 250. Wafer 250 is mounted on susceptor 241. The remainder of the components of reactor 240 are the same as in reactor 220. In particular, reactor 240 includes two heat sources 204 and 224. While FIGS. 2A to 2C illustrate an RTP reactor with center gas injection, as explained below, these RTP reactors can also use a plurality of jets for side gas injection.

In prior reactors used for simultaneously processing a multiplicity of wafers or large single wafers, long heat-up, processing, and cool-down cycles are required. For instance, for a deposition process that requires heating to 1100° C., the total time for heat-up, processing and cool-down is typically 45–90 minutes. (In this disclosure, a deposition process is defined to include processes in which a film is grown on a wafer.) For a similar process and temperature, RTP reactors 200, 220 and 240 require a much shorter time for heat-up, processing, and cool-down, i.e., 2–15 minutes.

In reactors 200, 220 and 240, although the thermal mass of susceptor 201 increases the heat-up and cool-down times relative to reactors in which there is not a susceptor, susceptor 201 minimizes temperature differentials between the center and perimeter of each wafer in the multiplicities of wafers 210 or 230 (FIGS. 2A and 2B), or single wafer 250 (FIG. 2C) and thereby enhances the steady-state temperature uniformity across wafers 210, 230 or wafer 250, relative to prior art reactors, during processing of wafers 210, 230 or wafer 250. Moreover, as explained more completely below, the materials of susceptor 201 are selected to minimize adverse thermal effects associated with susceptor 201.

Heat source 204 (FIGS. 2A and 2C) is a radiant energy heat source. Heat source 224 (FIGS. 2B and 2C) is a resistance heater. Alternatively, in view of this disclosure, those skilled in the art can implement heat source 224 of RTP reactors 220 or 240 as an RF heat source rather than a resistance heater.

In each of the embodiments of the invention shown in FIGS. 2A to 2C, heat source 204 (FIG. 2A), or heat sources 204 and 224 (FIGS. 2B and 2C) elevate the temperature of wafers 210, 230 or wafer 250 quickly from the ambient temperature to the steady-state process temperature such that the temperature is substantially uniform throughout wafers 210, 230 or wafer 250, and maintain the substantially uniform temperature for the duration of the process. After processing, wafers 210, 230 or wafer 250 are cooled by hydrogen gas and then nitrogen gas is used to purge reactant gases from reaction chamber 209. Quick heat-up allows wafers 210, 230 or wafer 250 to be processed quickly. Substantially uniform wafer temperature is important for a number of semiconductor processes, such as in formation of an epitaxial layer where substantially uniform temperature is critical in obtaining acceptably uniform thickness and resistivity.

An important aspect of the invention is that the number of components in reaction chamber 209 has been minimized. Specifically, the only components contained within reaction chamber 209 are susceptor 201, susceptor support 212, heat source 224 (if applicable) and gas injection head 207. Thus, potential sources of particulate contamination in reaction chamber 209 have been significantly reduced in comparison to previous reactors which typically include all or part of susceptor position control 202 within reaction chamber 209.

RTP reactors 200, 220 and 240 can be used to perform all of the processes performed by prior art RTP reactors, which processed only single wafers of 200 mm (8 inches) or less. For example, RTP reactors 200, 220 and 240 can be used for annealing or other semiconductor process steps in which no additional layers or conductivity regions are added to a wafer.

For example, an anneal time of about two seconds at a temperature of about 1100° C. fully activates and removes damage from about a $10^{16}$ ion dose of arsenic implanted at about 80 keV. Typically, rapid thermal anneals using reactors 200, 220 and 240 last a few seconds, in the range of from about one second to about 15 seconds, and have peak temperatures ranging from about 800° C. to about 1200° C. The fraction of dopant activated typically ranges from about 50% to about 90%. As is known to those skilled in the art, the particular time and peak temperature depends on the implant dose and species.

In addition to annealing, RTP reactors 200, 220 and 240 can sinter metal contacts. To achieve a good metal-to-semiconductor contact after deposition, any one of RTP reactors 200, 220 and 240 heats the metal-semiconductor combination to a temperature at which some interdiffusion and alloying occurs at the metal-semiconductor interface. For example, for aluminum, the temperature is typically in the range of about 450° C. to about 500° C. in either an inert or hydrogen atmosphere for a time in the range of about 5 seconds to about 20 seconds.

Alternatively, RTP reactors 200, 220 and 240 can be used to form silicide-silicon ohmic contacts. In this application, a thin layer of metal, usually a refractory metal, is deposited over the wafer and the wafer is heated in one of RTP reactors 200, 220 and 240 to form a metal silicide where the metal contacts the silicon. The unreacted metal is then etched away. The formation of the metal silicide is not particularly sensitive to either the temperature or time intervals used in the heating step. For refractory metal silicides, the temperature ranges from about 800° C. to about 1100° C. and the time varies from about 1 to about 80 seconds.

The previous processes only used RTP reactors 200, 220 and 240 to heat a semiconductor wafer with a particular layer or layers. RTP reactors 200, 220 and 240 can also be used to form a particular layer on a support, e.g., an oxide layer on a silicon wafer, various insulating, dielectric, and passivation layers on a silicon wafer or compound semiconductor wafer, or an epitaxial layer on a silicon wafer. RTP reactors 200, 220, 240 can be used for compound semiconductor processing in a temperature range of 300°–600° C. RTP reactors 200, 220, 240 can also be used in the production of flat panel displays.

In addition, in view of this disclosure, those skilled in the art can use RTP reactors 200, 220 and 240 for chemical vapor deposition processes such as growth of polysilicon.

For instance, a silicon epitaxial layer can be formed on the surface of a silicon wafer. The wafers are heated to a temperature between 1000° and 1200° C. and exposed to a gaseous mixture consisting of a hydrogen carrier gas mixed with one or more reactive gases such as a silicon source gas or dopant source gas. A layer of silicon is deposited on the silicon substrate having the same crystal orientation as the substrate.

Below, individual aspects of the invention are described in greater detail. These descriptions are sometimes made with respect to the processing of single wafer batches and sometimes with respect to processing of multiple wafer batches. However, it is to be understood that in each of the descriptions below, one or more wafers can be processed in a single batch. Generally, the invention encompasses the processing of one or more wafers at a single time. Further, while reference may be made below to particular batch sizes for wafers of a particular size, it is to be understood that the invention encompasses batch sizes other than those given. Generally, the invention is not limited to the processing of any particular batch size for a given wafer size, nor is the invention limited to processing of wafers of particular sizes.

FIGS. 3A, 3B, 3C and 3D are simplified cross-sectional views of RTP reactors 300, 320, 340 and 360 according to the invention. These Figures illustrate the basic elements of a reactor according to the invention, and illustrate several possible combinations of heat source and gas injection system for a reactor according to the invention.

Figure 3A:
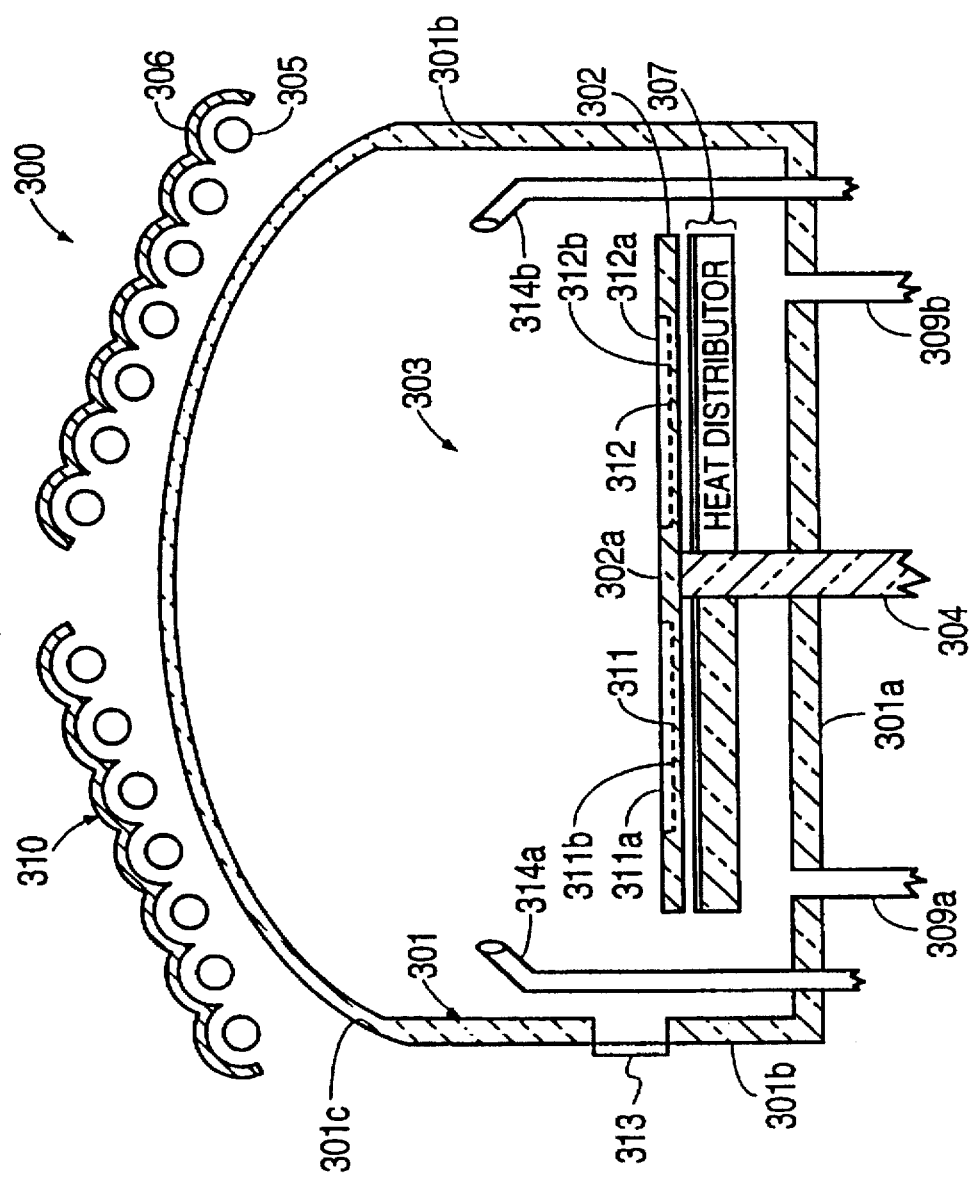
FIG. 3A is a simplified cross-sectional view of a reactor according to the invention in which wafers are heated with a single heat source and process gases are side-injected into the reaction chamber.

FIG. 3A is a simplified cross-sectional view of RTP reactor 300 for processing one or more semiconductor wafers, e.g., wafers 311, 312. Reactor 300 includes vessel 301, susceptor 302, susceptor support 304, radiant heat source 310 (including a plurality of lamps 305 and reflectors 306), passive heat distribution element 307, side inject gas jets 314a, 314b and gas exhaust pipes 309a, 309b.

Vessel 301 is formed by bottom wall 301a, side wall 301b, and domed top wall 301c. Walls 301a, 301b and 301c bound reaction chamber 303. Bottom wall 301a and side wall 301b are made of stainless steel and lined with quartz. In one embodiment, bottom wall 301a is circular and side wall 301b is cylindrical. Dome-shaped top wall 301c is made of quartz so that relatively little of the radiant energy from radiant heat source 310 is absorbed by top wall 301c. Thus, the radiant energy passes through top wall 301c unimpeded to heat directly wafers 311, 312.

The shape of top wall 301c is chosen as a compromise between several factors. As top wall 301c is made increasingly flat, the possibility increases that top wall 301c may collapse when reaction chamber 303 is held at a vacuum pressure, i.e., less than 100 torrs, for instance, during a reduced pressure BICMOS process. On the other hand, as the curvature of top wall 301c is increased, radiant heat source 310 is moved increasingly further away from wafers 311, 312, which, in turn, requires a greater energy output from radiant heat source 310 to maintain a given temperature of wafers 311, 312. Additionally, as the curvature of top wall 301c increases, the distance of top wall 301c from wafers 311, 312 also increases so that the process gases have a longer time to heat up before they are deposited on wafers 311, 312. The curvature of top wall 301c can also affect the flow of the process gases as they descend upon wafers 311, 312.

Figure 3B:
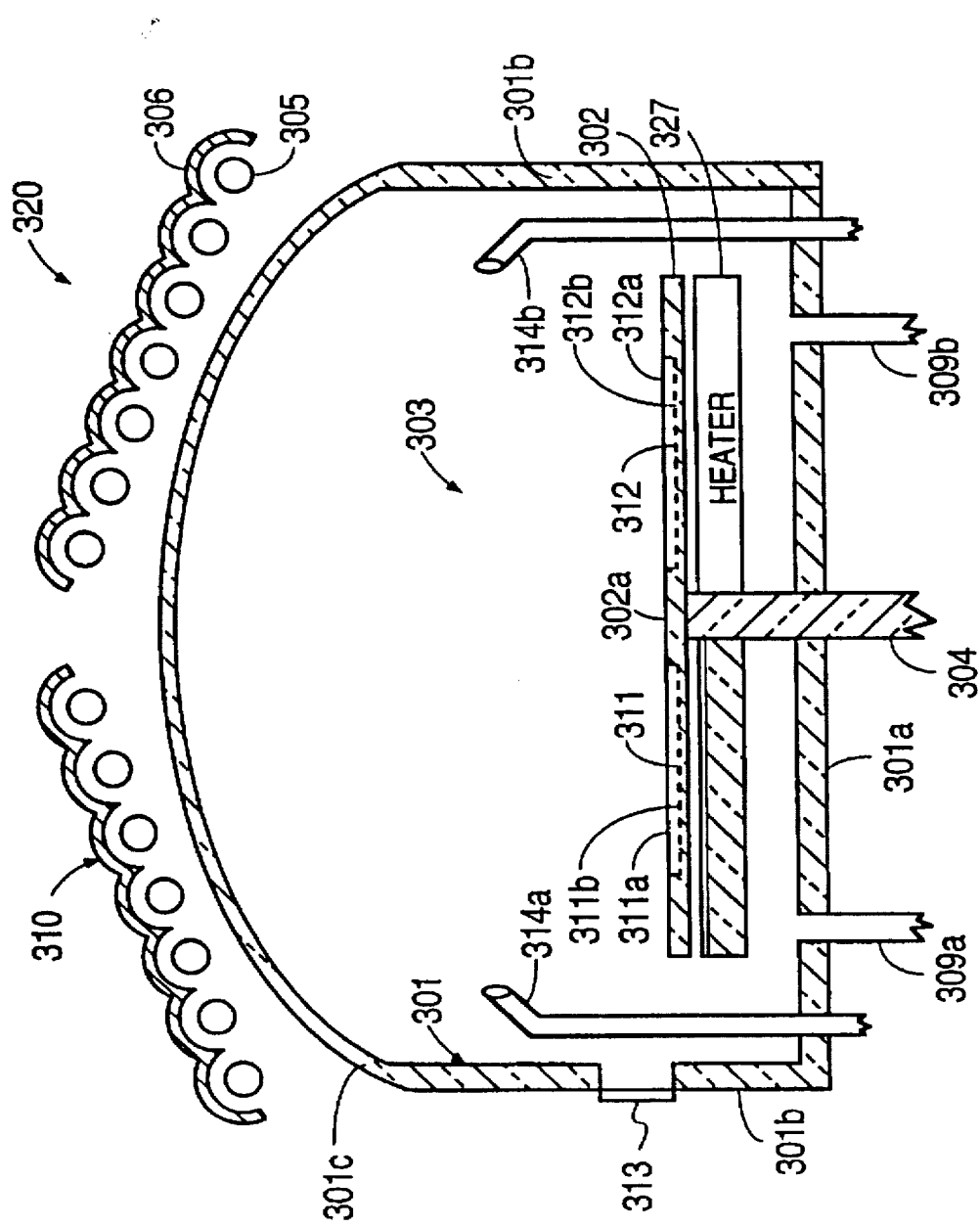
FIG. 3B is a simplified cross-sectional view of a reactor according to the invention in which wafers are heated with a dual heat source and process gases are side-injected into the reaction chamber.

The exact shape of top wall 301c is empirically determined by testing a number of different shapes and choosing one that yields a desired combination of the above-identified characteristics affected by the shape of top wall 301c. In FIGS. 3A, 3B, 3C and 3D, upper wall 301c has a cross-sectional shape that forms an approximately circular arc. FIG. 3E is a simplified cross-sectional view of a vessel 381 including a top wall 381a having an inflected or "bell" shape.

Wafers 311, 312 (FIG. 3A) are mounted on circular susceptor 302 within reaction chamber 303. In one embodiment, each of wafers 311, 312 is placed into a recess, sometimes referred to as a "pocket," in susceptor 302. The depth of the recesses is chosen in one embodiment so that wafer top surfaces 311a, 312a are approximately level with surface 302a of susceptor 302. The diameter of the recesses is chosen so that a susceptor ring (described in more detail below), sometimes called "a wafer surround ring," can fit into each recess around the corresponding wafer 311 or 312.

Figure 3C:
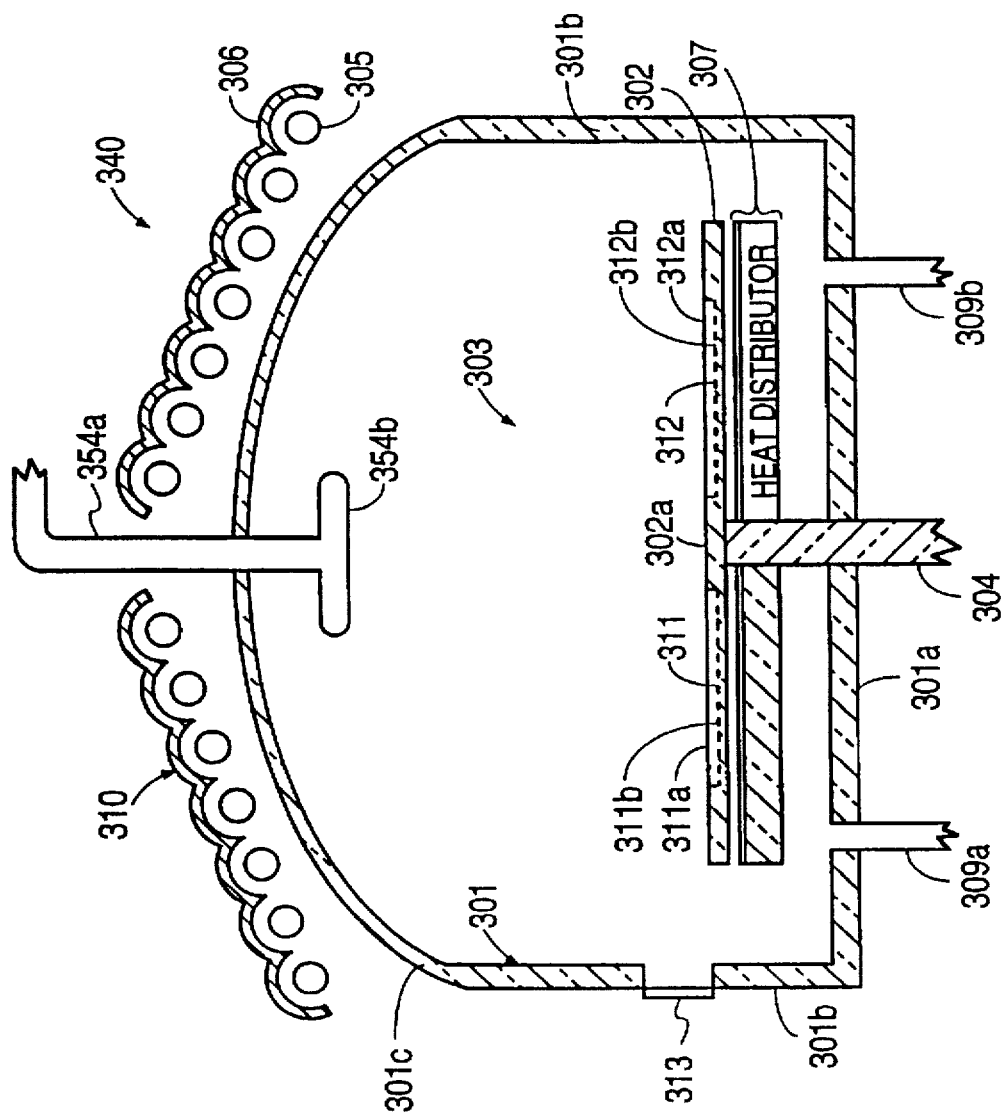
FIG. 3C is a simplified cross-sectional view of a reactor according to the invention in which wafers are heated with a single heat source and process gases are center-injected into the reaction chamber.
Figure 3D:
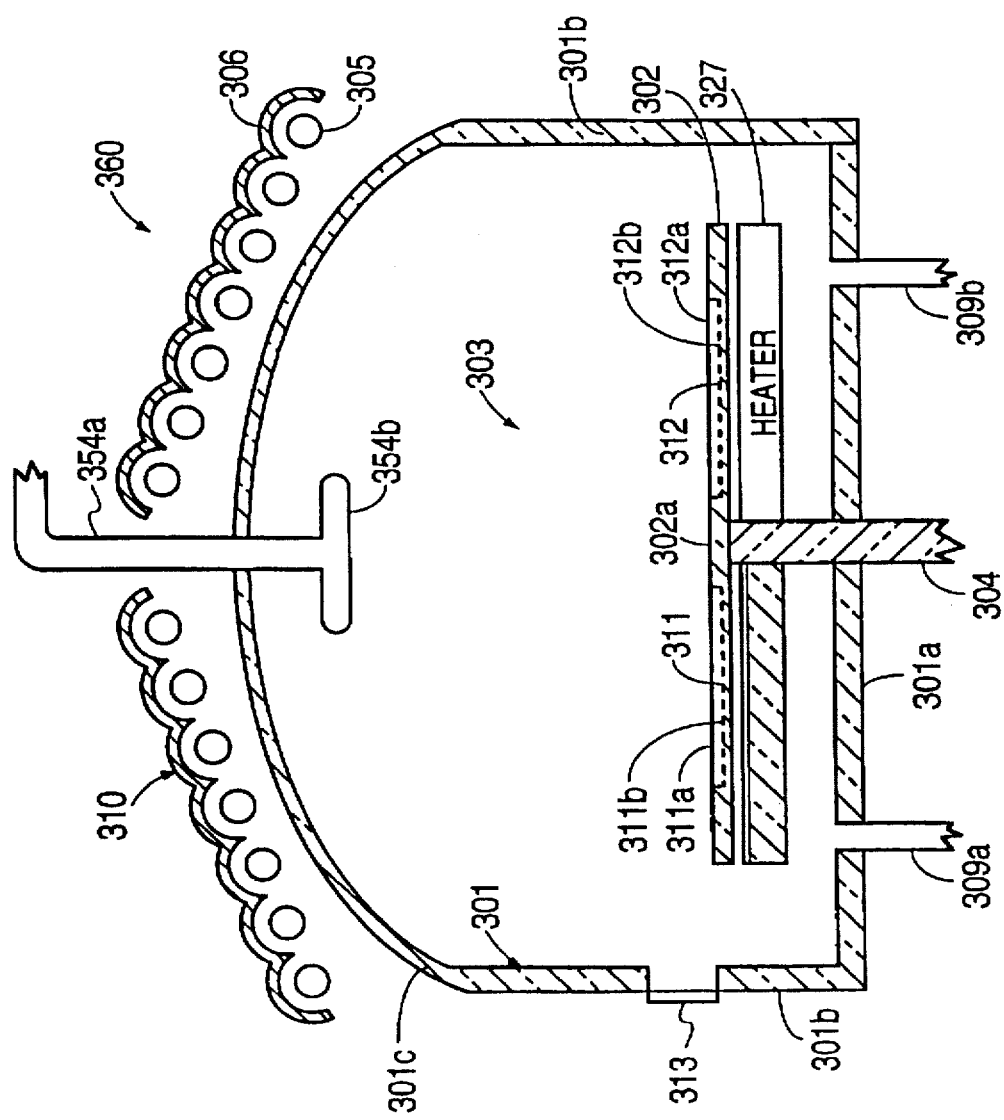
FIG. 3D is a simplified cross-sectional view of a reactor according to the invention in which wafers are heated with a dual heat source and process gases are center-injected into the reaction chamber.
Figure 3E:
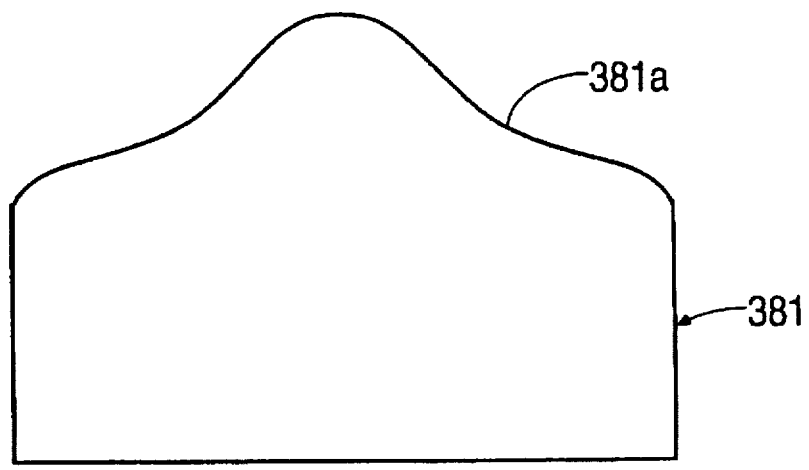
FIG. 3E is a simplified cross-sectional view of a vessel including a top wall having an inflected or "bell" shape.
Figure 3F:
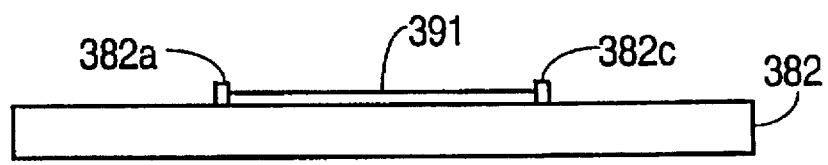
FIGS. 3F and 3G are a side view and top view, respectively, of a susceptor, according to another embodiment of the invention, illustrating another means of mounting a wafer on the susceptor.
Figure 3G:
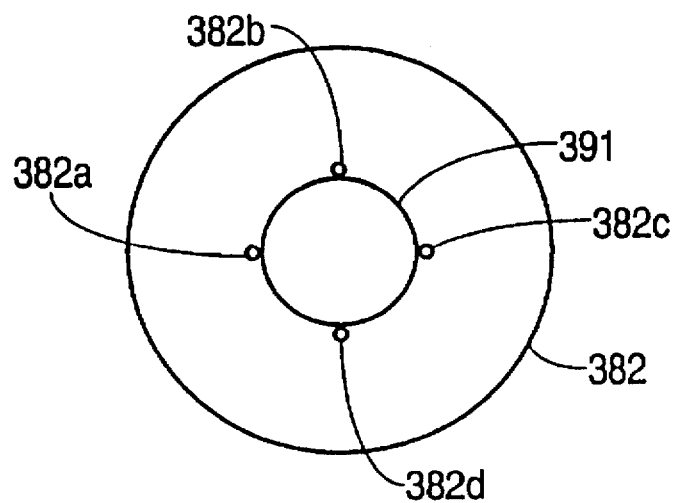

FIGS. 3F and 3G are a side view and top view, respectively, of susceptor 382, according to another embodiment of the invention, illustrating another means of mounting wafer 391 on susceptor 382. Rather than being placed in a recess, as are wafers 311, 312 in FIGS. 3A, 3B, 3C and 3D, wafer 391 is placed on the surface of susceptor 382 and laterally held in place by posts 382a, 382b, 382c, 382d. Posts 382a, 382b, 382c, 382d are made of quartz. Alternatively, if susceptor 382 is made of graphite, as is the case in some embodiments of the invention described below, posts 382a, 382b, 382c, 382d can be made of graphite. Posts 382a, 382b, 382c, 382d may be formed integrally with the rest of susceptor 382, or formed separately and attached to susceptor 382 by, for instance, a compression fit in corresponding holes formed in susceptor 382. Though four posts 382a, 382b, 382c, 382d are shown, it is to be understood that other numbers of posts could be used, e.g., three.

Susceptor support 304 (FIG. 3A) holds susceptor 302 at selected positions in reaction chamber 303. Susceptor support 304 is raised or lowered to vary the position of wafers 311, 312 in reaction chamber 303. In one embodiment, susceptor 302, and passive heat distribution element 307 are positioned at a first location in a first direction (the operating position) during heating of wafers 311, 312 in reaction chamber 303 and positioned at a second location in the first direction different from the first location (the loading position) when wafers 311, 312 are being removed from, or placed into, reaction chamber 303.

Susceptor 302 susceptor, support 304 and passive heat distribution element 307 are shown in the loading position in FIGS. 3A, 3B, 3C and 3D. Wafers 311, 312 are placed into and removed from reaction chamber 303 by one of a robot and a wafer handling system (not shown) through a door 313 formed in side wall 301b. The loading position is chosen to allow the robot or wafer handling system to easily extend into reaction chamber 303 and place wafers 311, 312 on susceptor 302.

As explained in more detail below, when susceptor 302 is in the loading position, pins (not shown) extend through corresponding holes formed through susceptor 302 to raise wafers 311, 312 above surface 302a. Any number of pins can be used to raise each wafer 311, 312, though at least three are desirable to stably support a wafer, e.g, wafer 311. It is also generally desirable to minimize the number of pins used to minimize mechanical complexity. In one embodiment of the invention, three pins, located 120° apart in the radial direction around susceptor 302, are used to support 125 mm (5 inches), 150 mm (6 inches) and 200 mm (8 inches) wafers, and four pins, located 90° apart, are used to support 250 mm (10 inches) and 300 mm (12 inches) wafers.

Because wafers 311, 312 are raised above surface 302a, the robot or wafer handling arm does not contact surface 302a of susceptor 302 when removing wafers 311, 312, so scraping or other damage to surface 302a is avoided. Additionally, since wafers 311, 312 are raised above surface 302a, the robot or wafer handling arm can remove wafers 311, 312 by supporting wafer surfaces 311b and 312b, respectively, thereby avoiding damage to surfaces 311a, 312a on which, in many processes for which reactors 300, 320, 340 and 360 are used, a film has been deposited.

In FIG. 3A, after wafers 311, 312 are placed on susceptor 302, susceptor 302, support 308 and passive heat distribution element 307 are raised to the operating position so that wafers 311, 312 are nearer radiant heat source 310, allowing radiant heat source 310 to more quickly and efficiently heat wafers 311, 312 during operation of reactor 300.

During operation of reactor 300, susceptor 302 is rotated, as described more completely below. The rotation of susceptor 302 varies, in a second direction that is orthogonal to the first direction, the position of wafers 311, 312 within reaction chamber 303 while wafers 311, 312 are being processed. As a result, the process taking place within reaction chamber 303 is performed more uniformly since the varying position of wafers 311, 312 substantially negates the effect of any non-uniformities present in operation of reactor 300.

In the embodiments of the invention shown in FIGS. 3A and 3C, wafers 311, 312 are heated by a single heat source: radiant heat source 310. Radiant heat source 310 includes a plurality of lamps 305 that emit radiant energy having a wavelength in the range of less than 1 μm to about 500 μm, preferably in the range of less than 1 μm to about 10 μm, and most preferably less than 1 μm. A plurality of reflectors 306, one reflector 306 adjacent each lamp 305, reflect radiant energy toward wafers 311, 312.

Radiant heat source 310 is both water-cooled and forced-air cooled. The combination of water-cooling and forced-air cooling keeps lamps 305 and reflectors 306 within the required operating temperature range.

In reactors 300 (FIG. 3A) and 340 (FIG. 3C), passive heat distribution element 307 is mounted beneath susceptor 302 in proximity to susceptor 302. As used herein, "proximity" means as close as possible considering the limitations imposed by the physical space requirement for connecting susceptor 302 to susceptor support 304. Passive heat distribution element 307 minimizes heat losses from susceptor 302, which, in turn, minimizes heat losses from wafers 311, 312. Passive heat distribution element 307 is preferably made of a material that either absorbs and re-radiates heat toward susceptor 302, or that reflects heat toward susceptor 302.

FIG. 3B is a simplified cross-sectional view of RTP reactor 320 for processing one or more semiconductor wafers such as wafers 311, 312 Of FIG. 3A. Reactor 320 is similar to reactor 300 and like elements are numbered with the same numerals in FIGS. 3A and 3B. In reactor 320, a dual heat source is used to heat wafers 311, 312.

The second heat source, resistance heater 327, generates heat when current is passed through resistance elements formed in resistance heater 327. Susceptor 302 is typically made of a material such as quartz that absorbs little heat so that most of the heat from resistance heater 327 is transmitted to wafers 311, 312. Radiant heat source 310 and resistance heater 327 maintain a substantially uniform temperature throughout each of wafers 311, 312.

Since there is more surface area at the edges of wafers 311, 312 than at the center of wafers 311, 312, heat is lost from wafers 311, 312 more readily at the edges than at the center. Consequently, absent some compensation, larger temperature gradients exist at the edges of wafers 311, 312 than at the center of wafers 311, 312. These temperature gradients are undesirable and produce lower yields in a number of semiconductor processes. For instance, in formation of an epitaxial layer, high radial temperature gradients throughout the wafer can induce slip and detrimentally affect thickness and resistivity uniformity. To minimize these radial temperature gradients, in reactors 300, 320, 340 and 360, a thermally insulative susceptor ring (not shown) is placed around each of wafers 311, 312.

At the beginning of a process in reactor 300 (FIG. 3A) or reactor 320 (FIG. 3B), the power to lamps 305, and in reactor 320, the power to resistance heater 327, is increased so that the temperature of wafers 311, 312 is rapidly increased. The temperature of wafers 311, 312 is sensed by a pyrometer or thermocouples (not shown), as described in more detail below. As the temperature of wafers 311, 312 approaches the desired temperature, the power to separate groups of lamps 305 is varied so that a substantially uniform temperature is achieved throughout each of wafers 311, 312.

After wafers 311, 312 are heated to the desired temperature, if necessary for the process for which reactor 300 or 320 is being used, gases are introduced into reaction chamber 303 through side inject gas jets 314a, 314b. The gases flow past wafers 311, 312, susceptor 302 and, in reactor 320, resistance heater 327, and are exhausted from reaction chamber 303 through exhaust pipes 309a, 309b formed in bottom wall 301a.

FIG. 3C is a simplified cross-sectional view of RTP reactor 340 for processing one or more semiconductor wafers such as wafers 311, 312 of FIGS. 3A and 3B. Like reactor 300 (FIG. 3A), only heat source 310 is used to heat wafers 311, 312 in reactor 340. However, in reactor 340, rather than introducing gases into reaction chamber 303 through side inject gas jets 314a, 314b, as in reactor 300, gases flow through gas inlet pipe 354a and are introduced into reaction chamber 303 through gas injection head 354b. Like reactors 300 and 320 (FIG. 3B), in reactor 340, gases are exhausted from reaction chamber 303 through exhaust pipes 309a, 309b formed in bottom wall 301a.

FIG. 3D is a simplified cross-sectional view of RTP reactor 360 for processing one or more semiconductor wafers such as wafers 311, 312 of FIGS. 3A, 3B and 3C. In reactor 360, wafers 311, 312 are heated with a dual heat source including radiant heat source 310 and resistance heater 327. Gases are introduced into reaction chamber 303 through gas inlet pipe 354a and gas injection head 354b and exhausted through exhaust pipes 309a, 309b.

In a typical semiconductor process involving the use of gases to deposit a layer of material on a semiconductor wafer, it is necessary to perform several gas purge operations. When door 313 is opened to place wafers 311, 312 into or take wafers 311, 312 out of reaction chamber 303, the air surrounding reactor 300, 320, 340 or 360 enters reaction chamber 303. In particular, the oxygen present in the air must be removed from reaction chamber 303 before processing wafers 311, 312. Nitrogen is introduced into reaction chamber 303 through side inject gas jets 314a, 314b or gas injection head 354b, depending on the reactor, to purge reaction chamber 303 of oxygen. Hydrogen is then introduced into reaction chamber 303 to purge the nitrogen.

After introduction of the hydrogen, wafers 311, 312 are heated and the process gases are introduced into reaction chamber 303, as described above. After the process is complete, hydrogen is used to purge any remaining process gases from reaction chamber 303. Nitrogen is then used to purge the hydrogen. The hydrogen and nitrogen purge gases help cool wafers 311, 312. After the nitrogen purge, when wafers 311, 312 are cool, door 313 is opened and wafers 311, 312 removed.

For processes involving deposition of silicon at process temperatures between approximately 900°–1200° C., wafers 311, 312 are not cooled to ambient temperature, but rather are cooled to a temperature in the range of 300°–600° C., depending on the temperature to which wafers 311, 312 are heated during the process. Typically, cool down time is 2–5 minutes. In one embodiment, wafers 311, 312 are cooled to approximately 450° C. and cool down time is approximately 2.5–3.5 minutes. For processes conducted at lower temperatures (i.e., below about 900° C.), wafers 311, 312 are cooled to approximately 50% of the process temperature before being removed from reaction chamber 303.

Since wafers 311, 312 are not cooled all the way to ambient temperature, time is saved during cool-down, thus increasing wafer throughput. Further, reaction chamber 303 may be heated during one or more of the above-described pre-processing purge operations to decrease the length of time required to process successive batches of wafers.

Wafers 311, 312 must be cooled at least to a temperature that ensures hardening of wafers 311, 312 before removal from reaction chamber 303. Further, reaction chamber 303 must be cooled to a temperature that minimizes the possibility of an explosion that may occur if some hydrogen remains within reaction chamber 303 when door 313 is opened to remove wafers 311, 312.

When reactors 300, 320, 340 or 360 are used for semiconductor processes in which gases are used to deposit a layer of material on a wafer, e.g., an epitaxial layer, some deposition may also occur on parts of reactors 300, 320, 340 or 360, e.g., walls 301a, 301b, 301c, over time. As explained in more detail below, bottom wall 301a and side wall 301b are water-cooled. Top wall 301c is cooled by the same air cooling used to cool lamps 305 and reflectors 306. Cooling of walls 301a, 301b, 301c helps minimize the undesirable growth of deposits on walls 301a, 301b, 301c during deposition processes.

In conventional reactors, a "high etch" can be used to remove deposited silicon from some parts of the reactor, for instance, those parts made of graphite, by injecting a gas mixture that is at least 90% HCl into reaction chamber 303 for 3–20 minutes when reaction chamber 303 is at a temperature of 1150°–1200° C. However, the high etch does not remove silicon deposits from quartz. Therefore, to clean quartz components in conventional reactors, the quartz components must be removed from the reactor. According to the principles of this invention, the deposited silicon can also be removed from quartz components during the high etch by elevating the temperature of walls 301a, 301b to a temperature above the normal operating temperature. This can be done by allowing the temperature of the fluid used to cool walls 301a, 301b during the high etch to rise so that walls 301a, 301b are cooled less effectively.

In reactors 300, 320, 340 and 360, only wafers 311, 312, susceptor 302, part of susceptor support 304, resistance heater 327 (in reactors 320 and 360) or passive heat distribution element 307 (in reactors 300 and 340), side inject gas jets 314a, 314b (in reactors 300 and 340) or gas injection head 354b and part of gas inlet pine 354a (in reactors 320 and 360) are disposed within reaction chamber 303. Prior art reactors typically include a greater number of mechanical components inside the reaction chamber than the number found in reactors 300, 320, 340 and 360. Contamination from these mechanical components (including material deposited during previous depositions) is a large source of particulate contamination in prior art reactors. Since reactors 300, 320, 340 and 360 have fewer mechanical components than in previous reactors, particulate contamination is less of a problem in reactors 300, 320, 340 and 360, both because there are fewer mechanical components which may provide their own contaminants and because there are fewer mechanical components on which undesirable deposition may occur during repeated use of reactor 300, 320, 340 and 360. Thus, the presence of a relatively small number of mechanical components inside reaction chamber 303 of reactors 300, 320, 340 and 360 is a substantial improvement over previous reactors.

Additionally, since a substantially uniform temperature is maintained over a larger region of reaction chamber 303 than in previous RTP reactors by the novel combination of heat source(s) and susceptor, it is possible to process either a plurality of wafers or a single large wafer (e.g., 200 mm, 300 mm), rather than a single small wafer (e.g., 100 mm, 125 mm, 150 mm) as done in previous RTP reactors. The ability to process a plurality of wafers significantly increases wafer throughput even further, and the ability to process large wafers allows RTP reactors to keep pace with the industry trend to larger wafers.

Reactors 300, 320, 340 and 360 also provide good reproducibility of temperature from batch to batch over a large number of batches. As a result, it is not necessary to recalibrate reactors 300, 320, 340 and 360 often, relative to previous RTP reactors, to maintain the desired temperature uniformity. Since there is less downtime for calibration, wafer throughput is increased as compared to previous RTP reactors because a greater percentage of time can be spent processing wafers.

Further, as compared to conventional reactors, multiple wafer batches can be processed that have improved thickness and resistivity uniformity. Conventional reactors typically yield processed wafers having thickness and resistivity variations of 3–10%. In the RTP reactor according to the invention, thickness variations of 1–2% and resistivity variations of 1–5% are achievable.

Figure 4A:
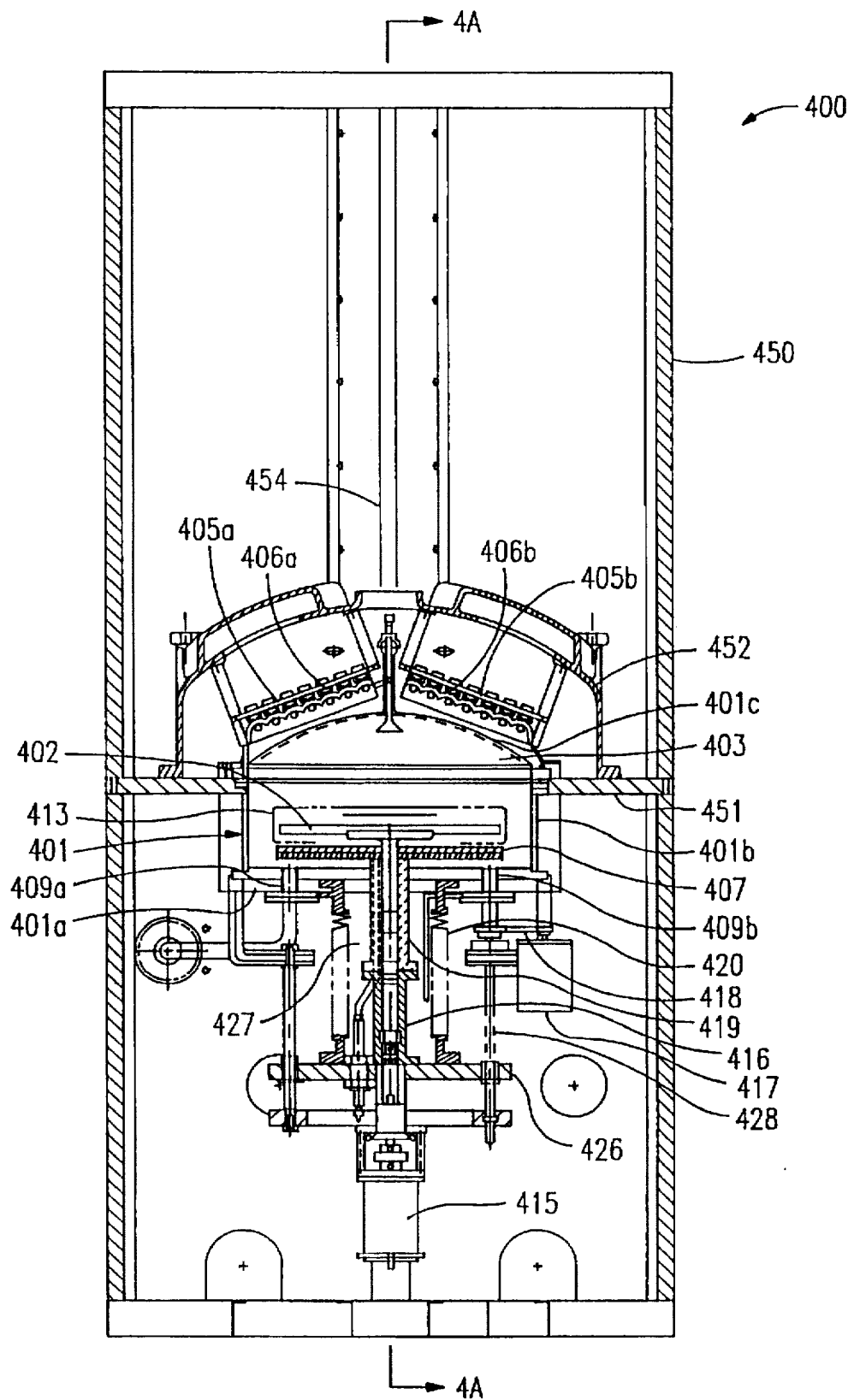
FIG. 4A is a cross-sectional view of a reactor according to another embodiment of the invention taken along section 4B—4B of FIG. 4B.
Figure 4B:
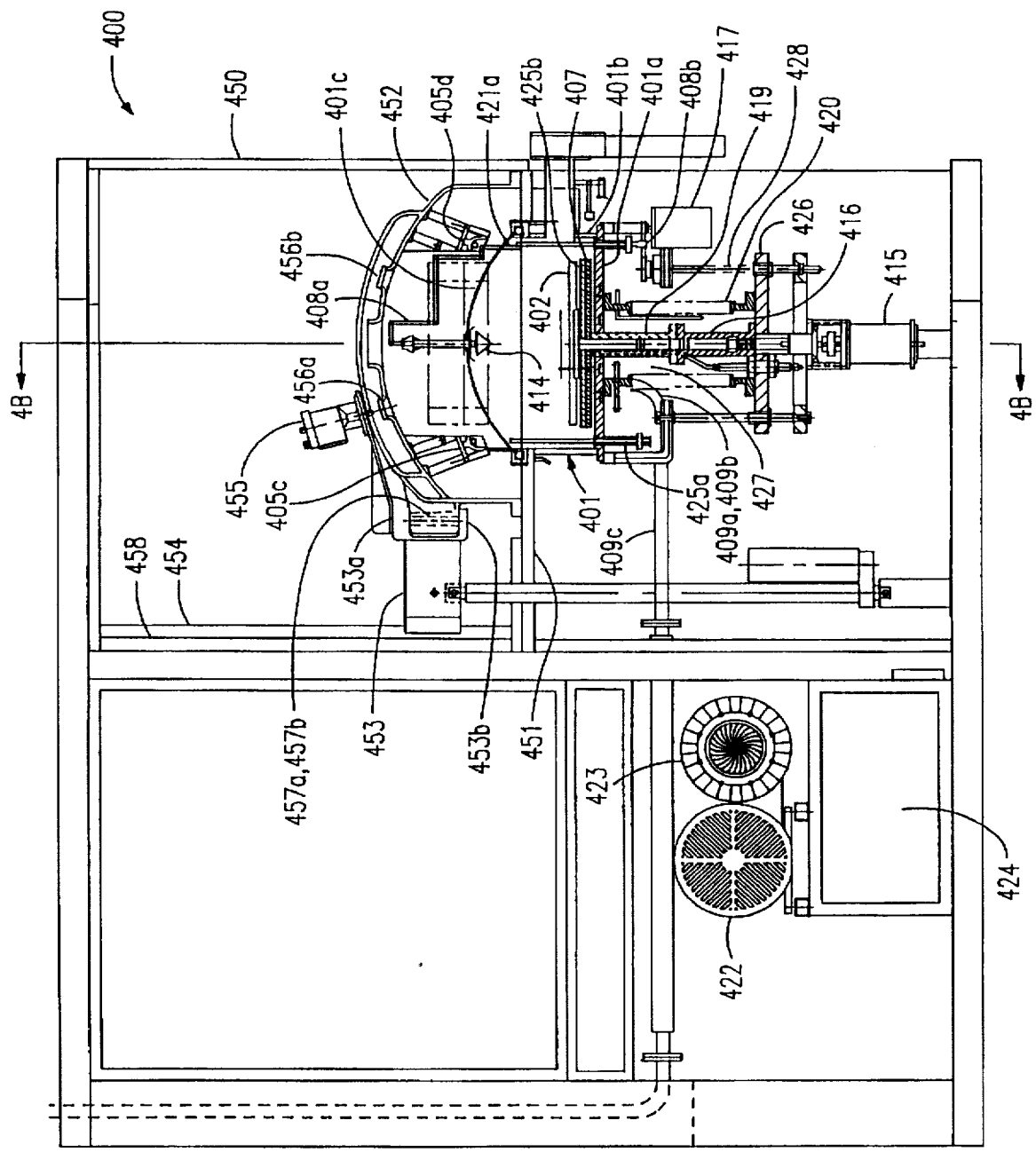
FIG. 4B is a cross-sectional view of the reactor of FIG. 4A taken along section 4A—4A of FIG. 4A.
Figure 4C:
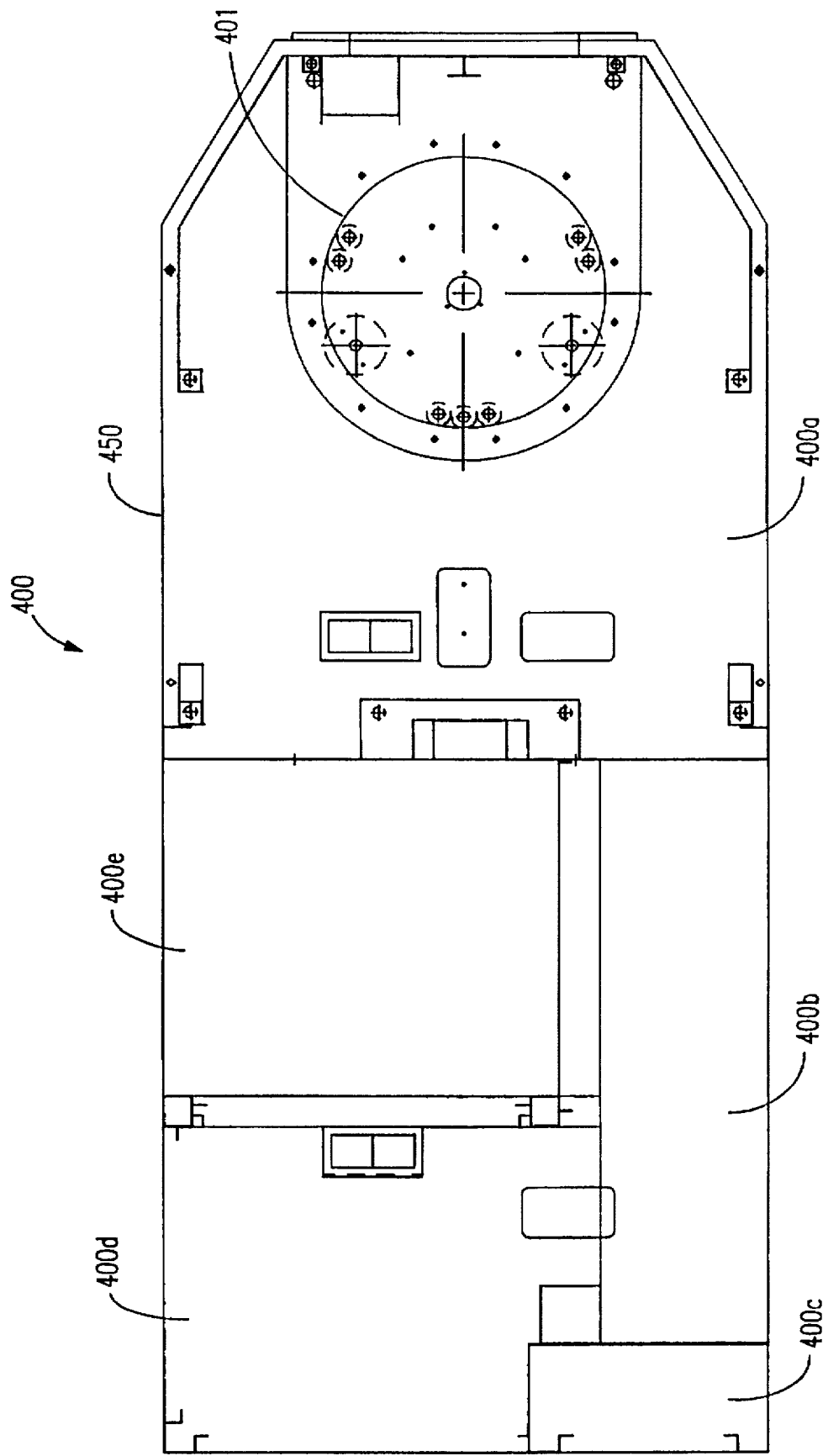
FIG. 4C is a simplified top view of the reactor of FIG. 4A.

FIGS. 4A and 4B are more detailed cross-sectional views of reactor 400 of this invention. FIG. 4C is a simplified top view of reactor 400. The cross-sectional view shown in FIG. 4A is taken along section 4B—4B of FIG. 4B. The cross-sectional view shown in FIG. 4B is taken along section 4A—4A of FIG. 4A.

In the following description of reactor 400 (particularly with respect to FIGS. 4A, 4B, 4C, 5A, 5B, 5C, 5D, 5E and 5F), some elements (hereinafter, "missing elements") of reactor 400 do not appear in certain drawings though, in reality, the missing elements exist and should appear. The missing elements have been eliminated from the drawings for clarity. Missing elements not shown in one drawing may appear in another drawing and one skilled in the art will be able to appreciate from the drawings, taken as a whole, how the missing elements would appear and interrelate with illustrated elements in the drawings in which the missing elements do not appear.

Frame 450 encloses selected parts of reactor 400, as discussed in more detail below, and is made of, for instance, cold rolled 1018 steel. As seen in FIG. 4C, reactor 400 is divided into several sections 400a, 400b, 400c, 400d, 400e. Section 400a houses vessel 401, the heat sources, gas injection system, and the susceptor support and movement mechanisms. Section 400b houses a gas panel, if necessary for the process for which reactor 400 is used, that is equivalent in capability to gas panels used with prior art barrel CVD reactors. The gas panel is configured, of course, to support and provide all of the gases necessary for the processes to be performed in reactor 400. Section 400c houses parts of the gas exhaust system. Section 400d houses the power supply and silicon controlled rectifiers used to drive the heat sources. Section 400e houses the remaining electronics: additional power supplies, a computer for controlling process variables (e.g., gas flows, energy from heat sources), electrical relays, etc.

As seen in FIGS. 4A and 4B, section 400a is divided into two parts by table 451. Shell 452 is mounted such that it contacts table 451, enclosing an upper portion of vessel 401 and lamp banks 405a, 405b (FIG. 4A) and 405c, 405d (FIG. 4B). As seen in FIG. 4B, shell 452 is mounted to yoke 453 which is made of, for instance, 356 aluminum alloy. Yoke 453 is movably mounted to linear rail 454. Linear rail 454 is available from Schneeberger Inc. of San Francisco, Calif. as part no. 1 MRA 25 658-W1-G3-V1. Yoke 453 slides up and down linear rail 454 to raise and lower shell 452 with respect to table 451. Linear rail 454 is attached to column 458 which is made of, for example, 0.125 inch (3.18 mm) thick cold rolled steel. Column 458 is mounted on table 451.

During operation of reactor 400, shell 452 is lowered into the position shown in FIGS. 4A and 4B, i.e., so that shell 452 contacts table 451. When it is desired to perform maintenance on reactor 400, shell 452 is raised away from table 451 to allow access to components of reactor 400 housed between shell 452 and table 451. Further, as explained in more detail below, shell 452 may be pivoted with respect to yoke 453 about one of two pins 457a, 457b (FIG. 4B) so that shell 452 is not directly above table 451, thus making access to components of reactor 400 even easier.

Shell 452 performs various functions in reactor 400. Lamp banks 405a, 405b, 405c, 405d are supported by shell 452. Further, shell 452 is formed, as described below, with passages for routing air to provide cooling of lamp banks 405a, 405b, 405c, 405d and the upper portion of vessel 401. When center injection of process gases is utilized (see, e.g., FIGS. 3C and 3D), shell 452 also houses gas inlet tube 408a and other hardware used in the gas distribution system, as well as cooling water tubing through which cooling water flows to cool lamp banks 405a, 405b, 405c, 405d. Finally, shell 452 protects vessel 401 from damage.

Shell 452 is made of aluminum and coated with high temperature teflon paint. The teflon paint helps shell 452 withstand the high temperatures to which shell 452 is subjected during processing of wafers in reactor 400.

Vessel 401 has three walls: bottom wall 401a, side wall 401b, and upper wall 401c. The region inside vessel 401 constitutes reaction chamber 403. Top wall 401c has an approximately circular arc and is 0.197 inches (5 mm) thick. The topmost point of the inner surface of top wall 401c is approximately 4.619 inches (11.73 cm) from the surface of table 451 that contacts shell 452. Wafers (not shown) are put into and taken out of reaction chamber 403 through door 413 (FIG. 4A) formed in side wall 401b. The wafers are placed into recesses formed in susceptor 402, as described more completely below. The distance between susceptor 402 and side wall 401b is about 1.5 inches (3.8 cm).

In FIGS. 2A–2C above, showing simplified cross-sectional views of various reactors 200, 220 and 240 according to the invention, susceptor position control 202 rotated, raised, and lowered susceptor 201. In FIGS. 4A and 4B, this susceptor position control includes, in reactor 400, motors 415 and 417. Motor 415 drives shaft 416 so that susceptor 402 is rotated. Motor 417 drives belt 418 which, in turn, rotates lead screw 428 so that plate 426 is raised and lowered, moving susceptor 402 up and down. The vertical movement of susceptor 402 allows susceptor 402 to be positioned at appropriate heights for loading and unloading of a wafer or wafers, and processing of a wafer or wafers. Further, as described in more detail below, when susceptor 402 is lowered to the wafer loading position, pins extend through holes in susceptor 402 to lift the wafer or wafers above susceptor 402 to enable easy unloading and loading of the wafer or wafers.

Resistance heater 407 or, alternatively, a passive heat distribution element (described in more detail below) is mounted on graphite annular shaft 419. Shaft 416 is mounted coaxially within annular shaft 419. Bellows assembly 420 (described in more detail below with respect to FIGS. 4E and 4F) is mounted between plate 426 and bottom wall 401a to seal region 427 surrounding shaft 416, annular shaft 419 and associated mechanisms so that gases that might leak from reaction chamber 403 through gaps between shaft 416 and annular shaft 419, and between annular shaft 419 and bottom wall 401a are contained. These gases are purged as explained in more detail below.

In embodiments of the invention using a dual heat source, e.g., reactors 220 and 240 of FIGS. 2B and 2C, respectively, lamp banks 405a, 405b, 405c, 405d and resistance heater 407 are used to heat a wafer or wafers to a substantially uniform temperature. In embodiments of the invention using a single heat source, e.g., reactor 200 of FIG. 2A, only lamp banks 405a, 405b, 405c, 405d are used for heating; in these embodiments, a passive heat distribution element (described below with respect to FIG. 8) can be used to help achieve a substantially uniform temperature throughout the wafer or wafers.

As described in more detail below, in dual heat source embodiments of the invention, groups of lamps and resistance heater 407 are separately electrically controlled to provide variable amounts of heat in response to measurements of wafer temperature. In one embodiment, wafer temperature is not directly sensed, i.e., no temperature sensor contacts the wafers. An optical pyrometer available from Ircon, Inc. of Niles, Ill., capable of measuring temperature in a range from 600° C. to 1250° C. is mounted in head 455 (FIG. 4B) outside shell 452. The pyrometer heat sensing element receives radiated heat from within shell 452 through port 456a formed in shell 452. Port 456a is covered by a window that is typically made of thin quartz (BaF$_2$ or CaF$_2$). A second port 456b is formed in shell 452 so that a hand-held pyrometer can be used if desired. Port 456b can also be used to visually monitor what is happening in reaction chamber 403 during operation of reactor 400. The pyrometer is calibrated during test runs of reactor 400 by correlating pyrometer measurements to temperature measurements of test wafers taken by a thermocouple that contacts the test wafers.

In addition to, or instead of, temperature measurement with a pyrometer, wafer temperature can be measured with a thermocouple wire inserted through a port, e.g., port 425a (FIG. 4B), formed in vessel 401, as explained in more detail below. As with the pyrometer, the thermocouple is calibrated during test runs of reactor 400 by correlating thermocouple measurements to temperature measurements of test wafers taken by another thermocouple that contacts the test wafers.

Walls 401a, 401b, 401c (FIGS. 4A and 4B) are maintained at a cool temperature, e.g., 600° C., relative to the operating temperature of reaction chamber 403. If walls 401a, 401b, 401c are not maintained at this cool temperature, a film may be deposited on walls 401a, 401b, 401c during any deposition process in reactor 400. Growth of a film on walls 401a, 401b, 401c is detrimental for several reasons. During operation of reactor 400, the film on walls 401a, 401b, 401c absorbs heat energy which affects the heat distribution in reaction chamber 403 which can result in unacceptable temperature gradients in the wafer. Additionally, the film on walls 401a, 401b, 401c may produce particulates during operation of reactor 400 that contaminate the wafer.

Bottom wall 401a and side wall 401b are cooled by a water flow passing through walls 401a and 401b, as described in more detail below. Lamp banks 405a, 405b, 405c, 405d are forced-air and water-cooled. Upper wall 401c is forced-air-cooled. The forced-air is circulated by motor 422 that drives two centrifugal blowers 423 (FIG. 4B). Only one blower is shown in FIG. 4B. The other blower is immediately behind the blower shown. Centrifugal blowers 423 are rated to pass 600 CFM of air at an outlet pressure of 18 inches H$_2$O. During operation of reactor 400, the flow rate through the cooling system is 600 CFM. Motor 422 and blowers 423 that can be used with the invention are available from Paxton Products, Inc. of Santa Monica, Calif., part no. RM-87C/184TC.

Air that has absorbed heat from reaction chamber 403 or lamp banks 405a, 405b, 405c, 405d is cooled to approximately 40°–100° C. by passing through a conventional heat exchanger 424 available as Part No. 725 from EG&G Wakefield Engineering in Wake, Mass. Heat exchanger 424 is designed such that heat exchanger 424 cools the air by approximately 40° C. The cooling water flow rate of heat exchanger 424 typically ranges from 6–10 gallons per minute. The heated exhaust air is passed first through blowers 423, and then through the heat exchanger 424. This order is preferred since it provides better cooling than when the heated exhaust air was passed through heat exchanger 424, and then through blowers 423.

Process gases are supplied to reaction chamber 403 through gas inlet tube 408a (FIG. 4B) and are injected into reaction chamber 403 through gas injection head 414, which is described in more detail below. Alternatively, the gases flow through gas inlet tube 408b and are injected into reaction chamber 403 through a plurality of gas injection jets, e.g., gas injection jet 421a, inserted through ports, e.g., port 425b, formed in bottom wall 401a, also described in more detail below. The gases flow past the wafers on susceptor 402 and are exhausted from reaction chamber 403 through exhaust lines 409a, 409b to common exhaust line 409c (FIGS. 4A and 4B). Exhaust lines 409a, 409, 409c are maintained at a pressure of approximately 1–5 inches of H$_2$O below the pressure of reaction chamber 403 so that the gases are exhausted from reaction chamber 403. The gases pass through exhaust line 409c to section 400c of reactor 400 and are ultimately exhausted out of reactor 400 in a conventional manner.

After being exhausted from reactor 400, the used reactant gases are cleaned by a scrubber (not shown) such as the scrubber described in U.S. Pat. No. 4,986,838, entitled "Inlet System for Gas Scrubber," issued to Johnsgard on Jan. 22, 1991, the pertinent disclosure of which is herein incorporated by reference.

Figure 5A:
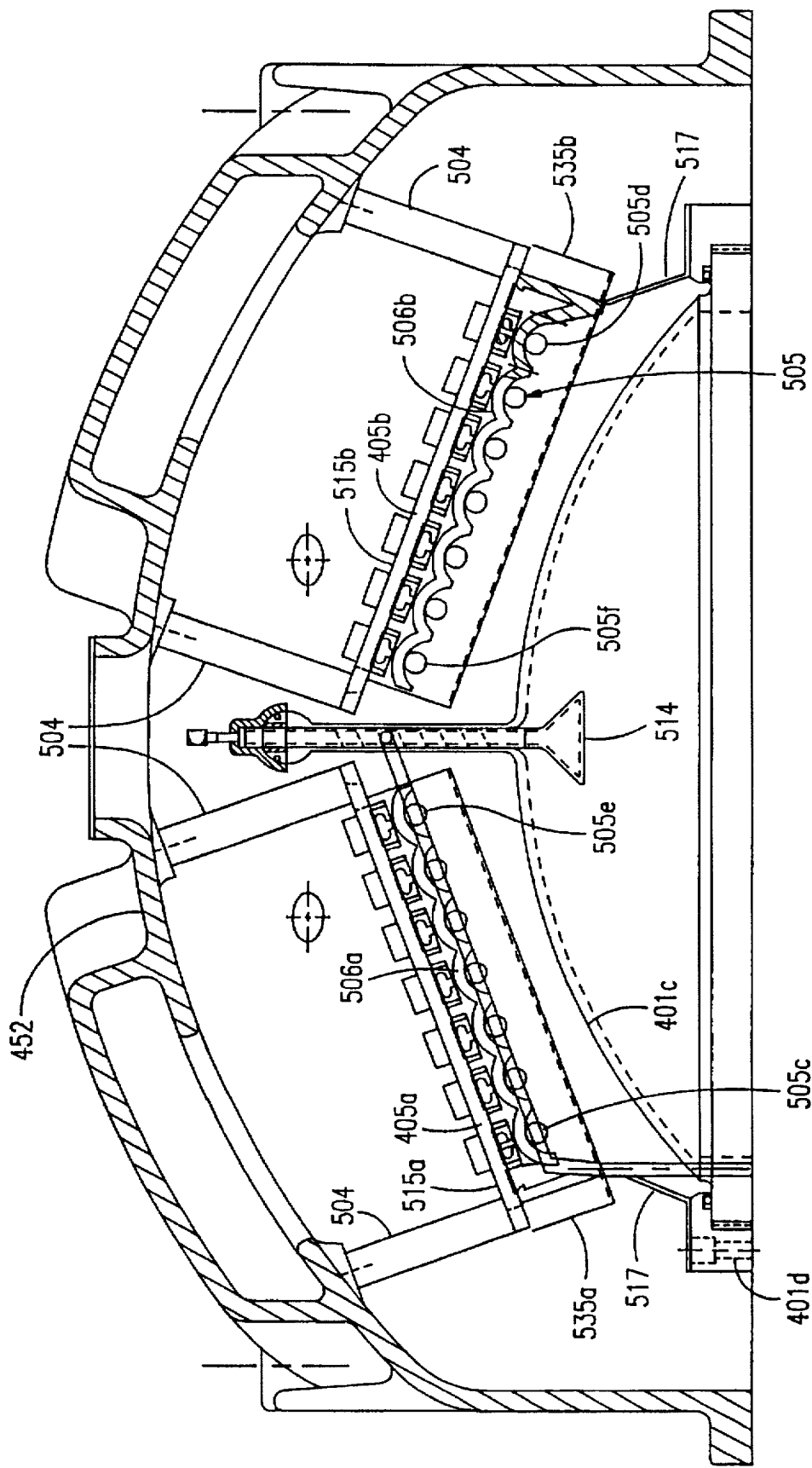
FIGS. 5A and 5B are detailed views of a portion of FIGS. 4A and 4B, respectively.
Figure 5B:
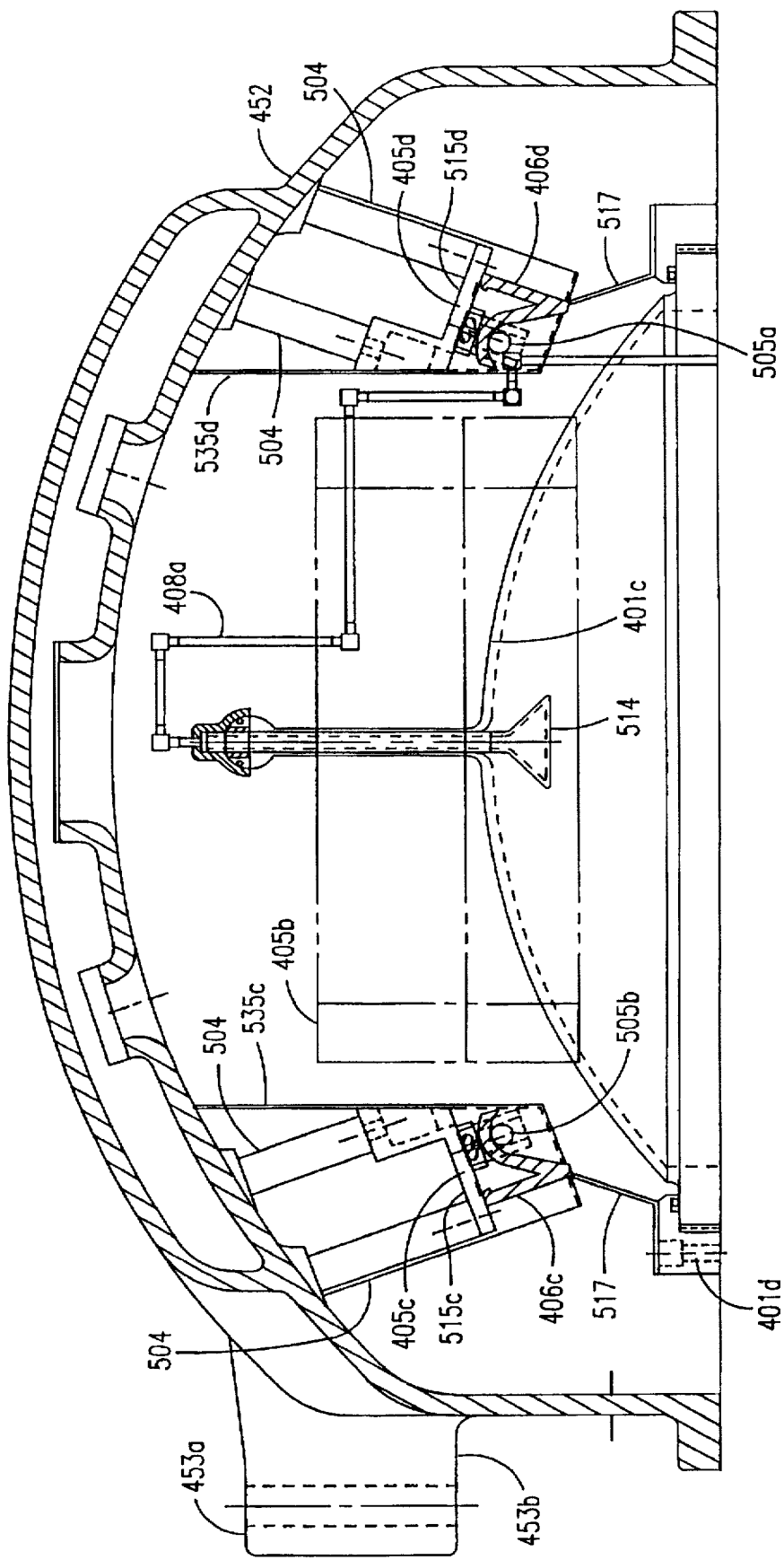
Figure 5C:
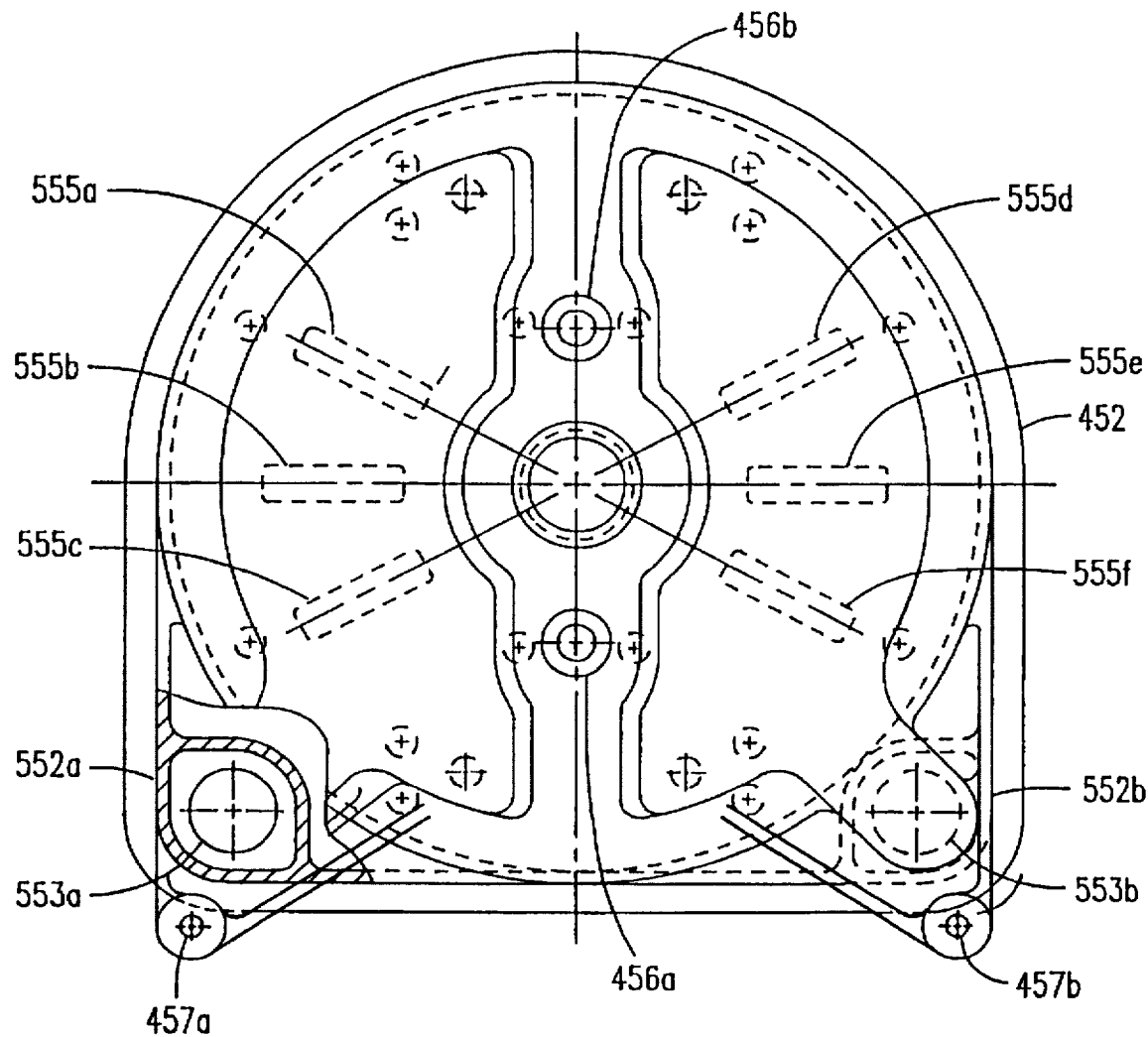
FIG. 5C is a bottom view of the shell enclosing the bell jar of the reactor of FIGS. 4A to 4C, showing the interior portions of shell.
Figure 5D:
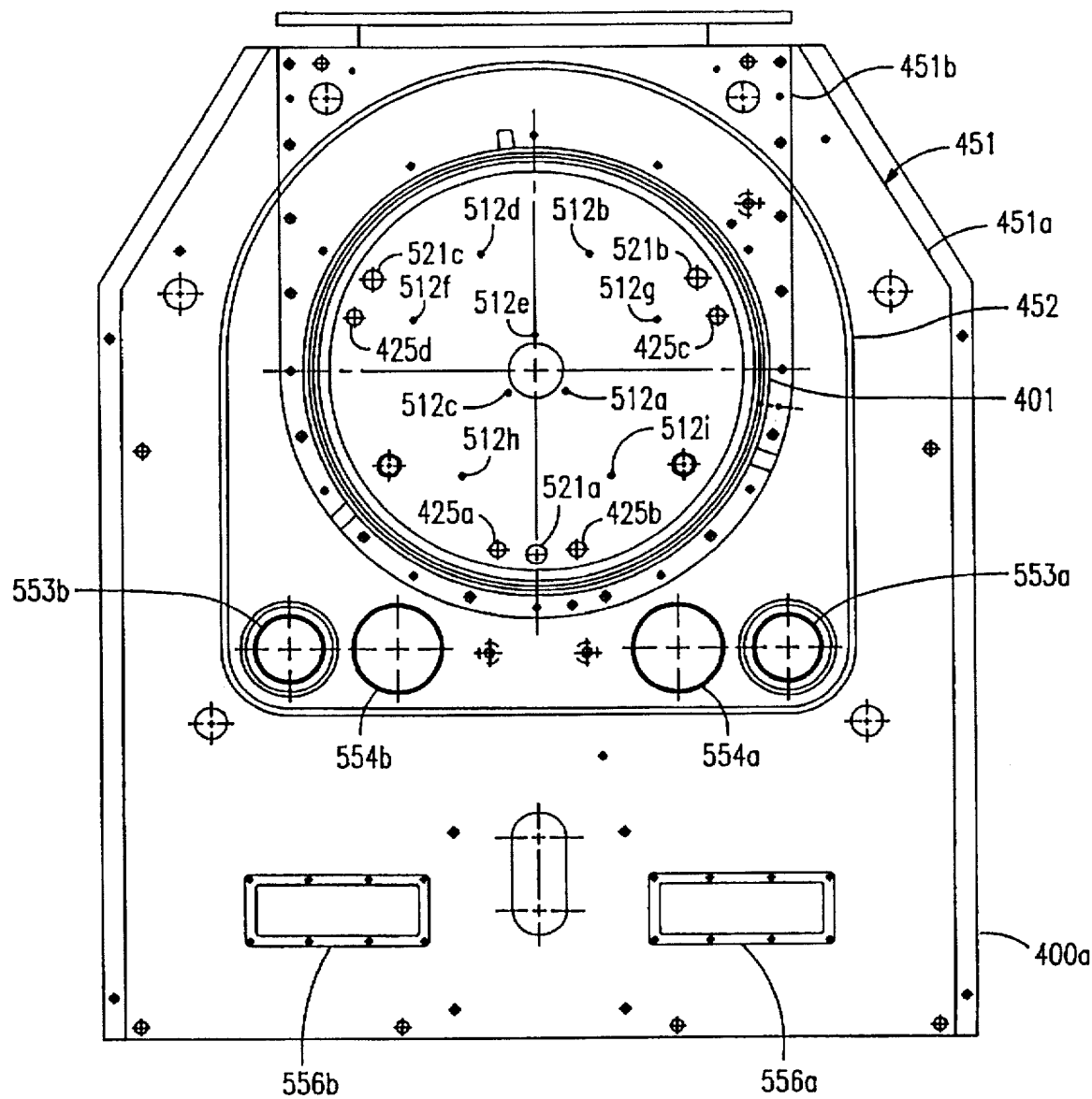
FIG. 5D is a top view of a portion of the reactor of FIGS. 4A to 4C, showing the reaction chamber and surrounding table.
Figure 5E:
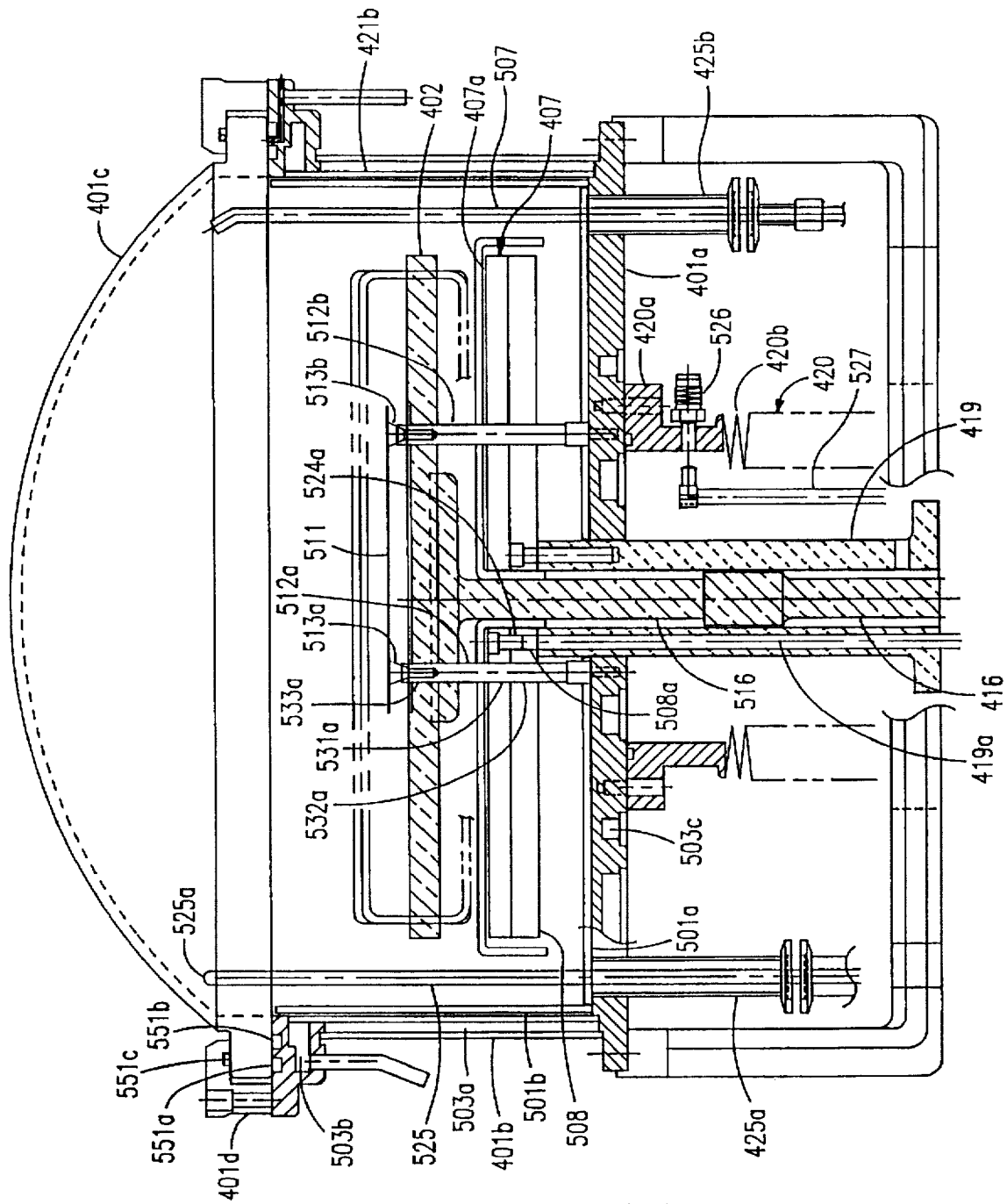
FIGS. 5E and 5F are detailed views of a portion of FIG. 4B showing the susceptor in a retracted and raised state, respectively.
Figure 5F:
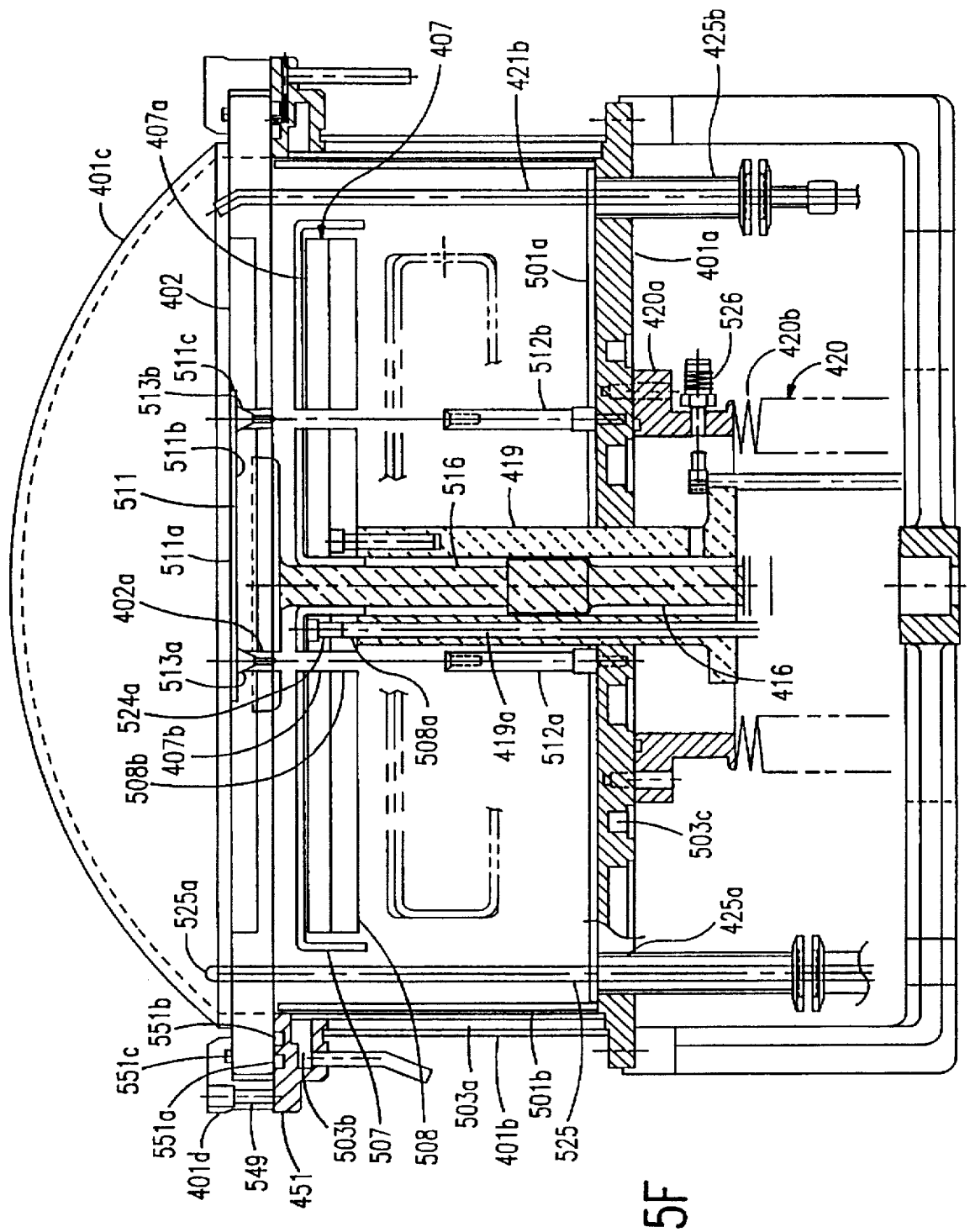

FIGS. 5A and 5B are views of a portion of FIGS. 4A and 4B, respectively, showing in detail shell 452 and components of reactor 400 between shell 452 and table 451. FIG. 5C is a bottom view of shell 452 showing the interior portions of shell 452. FIG. 5D is a top view of reaction chamber 403 and table 451 showing cooling air inlets 553a, 553b and cooling air outlets 554a, 554b. FIGS. 5E and 5F are views of a portion of FIG. 4B showing in detail a section of reactor 400 beneath table 451. FIG. 5E shows susceptor 402 in a retracted position for loading wafer 511 onto susceptor 402 and FIG. 5F shows susceptor 402 in a raised position for processing wafer 511.

As shown in FIGS. 5A and 5B, lamp banks 405a, 405b, 405c, 405d are above upper wall 401c. Each lamp bank 405a, 405b, 405c, 405d includes one or more lamps 505 and a like number of reflectors, one for each lamp 505, formed integrally as reflector assemblies 406a, 406b, 406c, 406d. (Herein, reference to a typical lamp or lamps is as lamp 505 or lamps 505. One or more particular lamps are referred to as, for example, lamp 505a.) Lamp banks 405a and 405b (FIG. 5A) each have seven lamps 505. Lamp banks 405c and 405d (FIG. 5B) each have one lamp 505. As explained in more detail below, slots are formed in reflector assemblies 406a, 406b, 406c, 406d, as shown, in part, in FIGS. 5A and 5B above lamps 505a, 505b and 505d.

Lamp bank casings 535a, 535b, 535c, 535d enclose most of lamp bank 405a, 405b, 405c, 405d, respectively. Lamp bank casings 535a, 535b, 535c, 535d are left open at the bottom, i.e., adjacent lamps 505, to allow radiant energy from lamps 505 to pass to reaction chamber 403 and cooling air to pass to vessel 401. Lamp bank casings 535a, 535b, 535c, 535d are made of, for instance, gold-plated stainless steel.

Each lamp bank 405a, 405b, 405c, 405d is attached to shell 452 with four studs 504 that are threaded at each end. One threaded end of each stud 504 screws into a mating threaded hole formed in shell 452. The other end of each stud 504 screws into the corresponding lamp bank, e.g., lamp bank 405a. In one embodiment, each lamp bank 405a, 405b, 405c, 405d is mounted such that corresponding mounting surfaces 515a, 515b, 515c, 515d form an angle of approximately 20° with susceptor 402. This angle can be varied slightly for a particular lamp bank, e.g., lamp bank 405a, by appropriately adjusting the position of corners of lamp bank 405a using a means explained in more detail below. This change in angular orientation is possible because of the spacing tolerance between the diameter of the threaded section of stud 504 and the threaded hole in lamp bank 405a.

It is to be understood that lamp banks 405a, 405b, 405c and 405d could be mounted at angular orientations other than 20°. In one embodiment of the invention, for the shape of upper wall 401c of reactor 400 shown in FIGS. 4A, 4B, 4C, 5A, 5B, 5E and 5F, each lamp bank 405a, 405b, 405c, 405d is mounted such that corresponding mounting surfaces 515a, 515b, 515c, 515d form an angle of between 10°–40° with susceptor 402. Other angular ranges are appropriate for reactors according to the invention having a vessel with a differently shaped upper wall.

Figure 6:
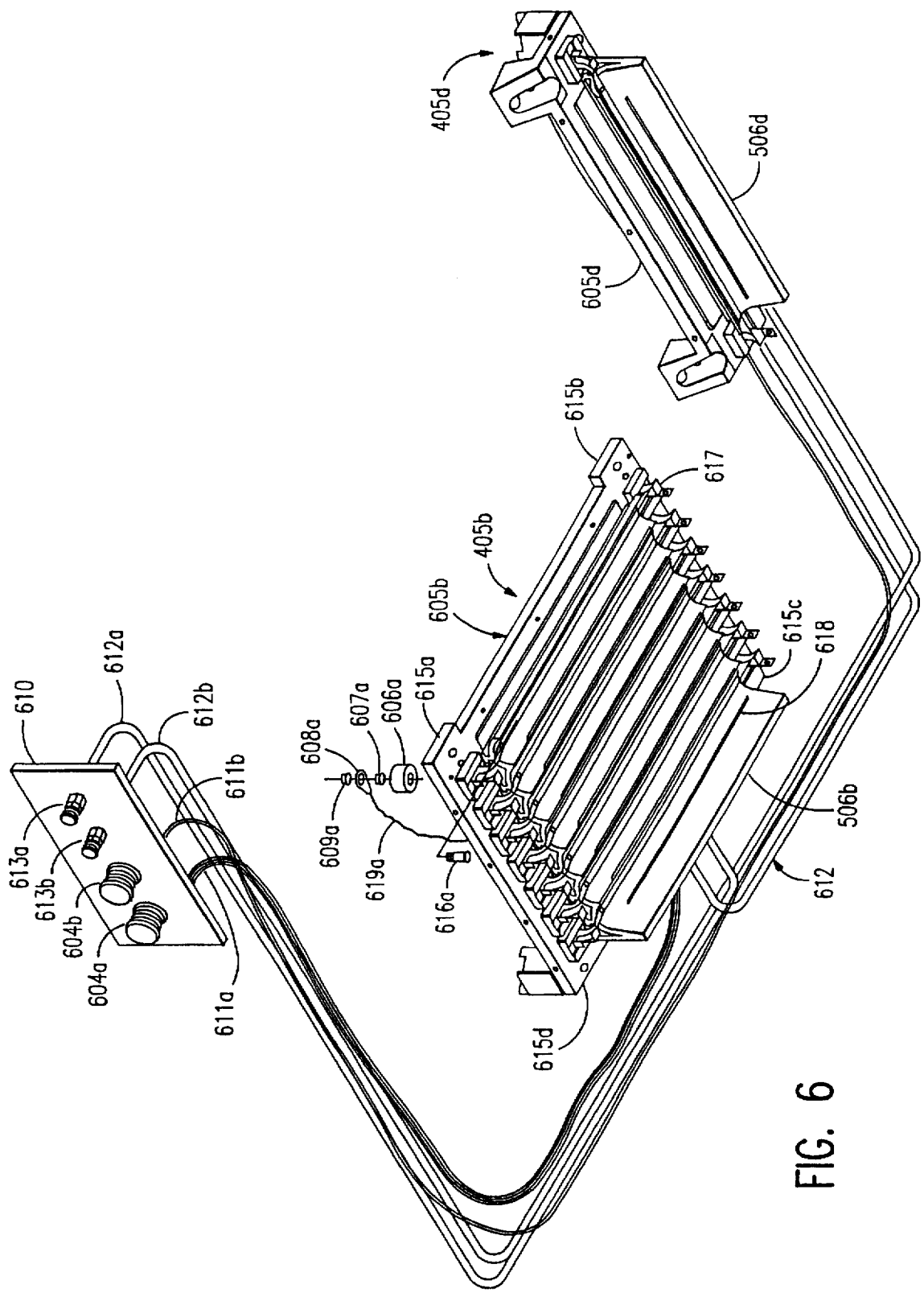
FIG. 6 is a perspective view of two lamp banks of the reactor of FIGS. 4A, 4B and 4C.

FIG. 6 is a perspective view of lamp banks 405b and 405d. Each lamp bank, e.g., lamp bank 405b, includes a lamp frame, e.g., lamp frames 605b, 605d, a reflector assembly, e.g., reflector assemblies 406b, 406d, one or more lamps 505 (not shown in FIG. 6), and one or more sets of lamp clips 617. Each reflector assembly, e.g., reflector assembly 406b, is attached to a lamp bank, e.g., lamp bank 405b by nuts and bolts. Slots 618 are formed in each reflector of reflector assembly 406b to allow cooling air to pass through reflector assembly 406b and then past lamps 505, as described in more detail below. Opposite ends of each lamp 505 are attached to one of lamp clips 617, which are, in turn, attached to lamp frame 605b with nuts and bolts.

Studs 504 are screwed into each of the four corners, e.g., corners 615a, 615b, 615c, 615d, of a lamp frame, e.g, lamp frame 605b. A spacer, jam nut and nut (none of which are shown in FIG. 6) are threaded onto the threaded end of each stud 504 that is screwed into lamp frame 605b. The spacers can have different lengths so that the position of a lamp bank, e.g., lamp bank 405b, can be varied with respect to the shell 452 (FIGS. 5A and 5B). In one embodiment of reactor 400, the centerline of the closest lamps 505a, 505b, 505c, 505d is approximately 4.31 inches (10.95 cm) from the surface of table 451 on which shell 452 is mounted, and the centerline of the farthest lamps 505e, 505f is approximately 6.31 inches (16.0 cm) from the same surface of table 451. However, for a 20° angular orientation of lamp banks 405a, 405b, 405c, 405d, these distances can be varied up or down approximately 2 inches (5.08 cm).

Power is routed from section 400d (FIG. 4C) of reactor 400 to lamps 505 with high temperature wire. The high temperature wire is routed through openings 556a, 556b formed in table 451 (FIG. 5D). The wire for two lamp banks, e.g., lamp banks 405b, 405d, passes through one of openings 556a, 556b and the wire for the other two lamp banks, e.g., lamp banks 405a, 405c, passes through the other of openings 556a, 556b.

As shown in FIG. 6, the high temperature wire enters shell 452 through military connectors, e.g., military connectors 604a, 604b, mounted in routing boards 610. (Only one routing board 610 is shown in FIG. 6; however, it is to be understood that there is a similar routing board 610 associated with lamp banks 405a and 405c.) The high temperature wire is bound together in wire bundles, e.g., wire bundles 611a, 611b, within shell 452. Wire bundle 611a includes the high temperature wires for lamps 505 in lamp bank 405b, and wire bundle 611b includes the high temperature wires for lamps 505 in lamp bank 405d.

A spacer, jam nut, wire lug and nut, e.g., spacer 606a, jam nut 607a, wire lug 608a, nut 609a, are threaded onto each of a plurality of screws, e.g., screw 616a, that are screwed into lamp frame 605b. There is one screw for each lamp 505. Screw 616a makes electrical connection from the corresponding lamp 505 through electrically insulative spacer 606a (which, in one embodiment, is made of ceramic) to wire lug 608a. An electrically conductive wire 619a, one of the high temperature wires in wire bundle 611a, electrically connects wire lug 608a (and, thus, a lamp 505) to military connector 604a and, eventually, to an external power source.

As previously noted, lamp banks 405a, 405b, 405c, 405d are water-cooled. Cooling water supplied from an external water supply passes through copper tubing, e.g., tubing 612, attached to the back of each lamp bank 405a, 405b, 405c, 405d. Tubing 612 is attached to routing board 610 with quick disconnects 613a, 613b. Cooling water is inlet through tubing section 612a. The cooling water is routed through tubing 612 to the back of lamp bank 405b where, though not visible in FIG. 6, tubing 612 is routed in a snake-like fashion across most of the back surface of lamp bank 405b to achieve a large amount of water-cooling of lamp bank 405b. The cooling water then flows to tubing 612 on the back of lamp bank 405d, then returns through tubing 612 to tubing section 612b to be returned to the water drain of the external water supply. The cooling water flow rate is, in one embodiment, approximately 1.5 gallons per minute.

Lamps 505 supply radiant energy to wafer 511 (FIGS. 5E and 5F) in reaction chamber 403 to heat wafer 511. Lamps 505 are, for instance, quartz halogen lamps. A voltage is applied to each of lamps 505, resulting in the heating of a tungsten filament to produce radiant energy in a short wavelength range, i.e., in the range of less than 1 μm to about 500 μm. Quartz halogen lamps suitable for use with the invention are sold by Ushio American, Inc. of Torrance, Calif. 90502 as model no. QIR 480–6000E. The specifications for these lamps are shown in Table 1.

TABLE 1

| Specification for Radiant Energy Lamps 505 | | | | | |
|---|---|---|---|---|---|
| Design Volts (v) | Design Watts (W) | Color Temp. (°K.) | Maximum Overall Length (mm) | Maximum Light Length (mm) | Bulb Diameter (mm) |
| 480 | 6,000 | 3,150 | 300 | 248 | 11 |

Each lamp 505 is mounted in a parabolic, gold-plated, highly polished reflector. Each reflector is formed with a parabolic cross-sectional shape along the length of respective lamp 505. The reflectors are provided to maximize the amount of heat transmitted to reaction chamber 403, and thus to wafer 511. Radiant energy that is emitted from lamps 505 in a direction away from reaction chamber 403 is redirected by the reflectors toward reaction chamber 403. Additionally, any energy that is reflected back from reaction chamber 403 is reflected by the reflectors toward reaction chamber 403 again. Generally, the reflectors can have any shape and orientation that does not result in limiting the life of the bulbs in lamps 505, or that does not result in an uneven temperature distribution in wafer 511.

As noted above, in reactor 400, all of the reflectors for each lamp bank 405a, 405b, 405c, 405d are formed integrally as reflector assemblies 406a, 406b, 406, 406d. Reflector assemblies 406a, 406b, 406c, 406d are commercially available from Epitaxial Services located in Sunnyvale, Calif. Another reflector assembly suitable for use with this invention is available from Vector Technology Group, Inc. of Santa Clara, Calif. under the name of Spiral-Array Reflector Extended (part number 5815).

In addition to reflector assemblies 406a, 406b, 406c, 406d, reflectors 517 (FIGS. 5A and 5B) are mounted to clamp ring 401d with bolts. Reflectors 517 are made of sheet metal, e.g., stainless steel, and are plated with a reflective material such as gold, nickel or silver. Typically, the entire surface of reflectors 517 are plated, though it is only necessary that the surface of reflectors 517 facing into reaction chamber 403 be plated. Reflectors 517 are attached around the entire periphery of reaction chamber 403 and are positioned so as to reflect energy toward susceptor 402.

Upper wall 401c is made of quartz so that relatively little of the radiant energy from lamps 505 is absorbed by upper wall 401c, allowing most of the radiant energy to be transmitted through reaction chamber 403 directly to wafer 511. As best seen in FIGS. 5E and 5F, upper wall 401c is clamped in place by threaded member 549 which extends through clamp ring 401d into a threaded hole formed in table 451. Clamp ring 401d is made of stainless steel. Two O-rings 551a, 551b are placed in grooves in table 451 so that when threaded member 459 is tightened down, O-rings 551a, 551b are compressed to form a seal between table 451 and upper wall 401c. A further seal between clamp ring 401d and upper wall 401c is formed by O-ring 551c.

In addition to the water-cooling described above, lamps 505 and reflector assemblies 406a, 406b, 406c, 406d are cooled by a flow of forced-air. Referring to FIG. 5C, cool air enters a cavity formed in the top of shell 452 through air inlets 553a, 553b. Air inlets 553a, 553b have a diameter of 3 inches (7.6 cm). The cool air passes through six vents 555a, 555b, 555c, 555d, 555e, 555f to the region between shell 452 and vessel 401. As the air passes through the region between shell 452 and vessel 401, the air passes over and cools reflector assemblies 406a, 406b, 406c, 406d and lamps 505. The air then passes over upper wall 401c of vessel 401, cooling upper wall 401c.

Referring to FIG. 5D, the heated air exits the region between shell 452 and vessel 401 through air outlets 554a, 554b formed in table 451. Air outlets 554a, 554b have a diameter of 4 inches (10.2 cm). The heated air is then returned to the heat exchanger, as described above with respect to FIG. 4B, where the air is cooled. The cooled air is then recirculated back to the region between shell 452 and vessel 401 to cool lamps 505, reflector assemblies 406a, 406b, 406c, 406d, and upper wall 401c again.

In embodiments of the invention using an RF heat source underneath susceptor 402, as described in more detail below, the coil of the RF heat source is cooled by a flow of water through the coil that is supplied from below vessel 401.

As shown in FIG. 5D, table 451 has two sections. Table section 451a is made of aluminum and table section 451b is made of 316 stainless steel. Stainless steel is used for table section 451b because of its good resistance to corrosion and ability to withstand the high temperatures to which table section 451b is subjected.

As noted above, shell 452 is mounted to yoke 453 (FIG. 4B) such that shell 452 can be pivoted away from table 451 to either side of reactor 400. As illustrated in detail in FIG. 5C, pins 457a and 457b are inserted through holes formed in mounting sections 552a, 552b (sometimes referred to as "bosses") of shell 452 and matching holes formed in yoke 453 (not shown in FIG. 5C) to hold shell 452 laterally in place with respect to yoke 453. Shell 452 is held vertically in place by ends 453a, 453b of yoke 453 (see FIG. 4B) that contact either end of mounting sections 552a, 552b of shell 452. Shell 452 is pivoted away from table 451 by removing one of pins 457a, 457b and rotating shell 452 about the other of pins 457a, 457b. Since two pins 457a and 457b are provided, shell 452 may be opened in either of two directions so that access to vessel 401 and components of reactor 400 within shell 452 can be easily accomplished under a wide variety of conditions of use of reactor 400.

Side wall 401b and bottom wall 401a are shown in FIGS. 5E and 5F. Side wall 401b and bottom wall 401a are both made of stainless steel and are welded together. Quartz liners 501a and 501b are disposed in reaction chamber 403 adjacent bottom wall 401a and side wall 401b, respectively. Liners 501a and 501b protect bottom wall 401a and side wall 401b, respectively, from deposition of gases during processing of wafer 511 in reactor 400. Liners 501a, 501b are made of clear quartz having a bead-blasted surface facing into reaction chamber 403. The bead-blasted surface causes films deposited on liners 501a, 501b to stick to liners 501a, 501b rather than to flake off as would otherwise be the case. Consequently, contamination that results from the flaking is avoided and, after prolonged use of reactor 400, liners 501a and 501b can be removed from reaction chamber 403 and cleaned by, for instance, an acid etch.

As seen in FIG. 5D, ports 425a, 425b, 425c, 425d are formed through bottom wall 401a. Ports 425a, 425b, 425c, 425d each have a diameter of 0.75 inches (1.9 cm). Ports 425a, 425b, 425c, 425d may be used for inserting a thermocouple into reaction chamber 403 to take temperature measurements. Ports 425a, 425b, 425c, 425d may also be used for introduction of additional purge gases into reaction chamber 403 during post-processing purging so as to cool wafer 511 faster. Ports 425a, 425b, 425c, 425d may also be used to introduce jets of air against wafer 511 before or during pre-processing or post-processing purging to help prevent particulates from accumulating on wafer 511.

In one embodiment of the invention, thermocouple 525 (FIGS. 5E and 5F) is inserted through one of ports 425a, 425b, 425c, 425d (illustratively, port 425a). Thermocouple 525 includes thermocouple wire sheathed in quartz with the tip of the thermocouple wire left exposed. The thermocouple wire may be, for instance, type K thermocouple wire. The thermocouple wire is sheathed in quartz to impart stiffness so that the position of the thermocouple wire may more easily be controlled within reaction chamber 403, and to slow the degradation of the thermocouple wire that results from exposure to hydrogen present in reaction chamber 403. The tip of the thermocouple wire may be capped with graphite to further protect the thermocouple wire from the hydrogen atmosphere in reaction chamber 403. The graphite is sufficiently thermally conductive so that the temperature measurement capability of the thermocouple wire is not substantially inhibited.

Thermocouple 525 may be positioned at any desired height in reaction chamber 403 by moving thermocouple 525 up or down through port 525a. In one embodiment, thermocouple 525 is positioned approximately 1 inch (2.54 cm) above the upper surface of susceptor 402. Additionally, thermocouple 525 may be rotated to any desired position. In one embodiment of the invention, end 525a of thermocouple 525 is angled and thermocouple 525 rotated so that end 525a is closer to susceptor 402 than would be the case where thermocouple 525 is straight.

Figure 7A:
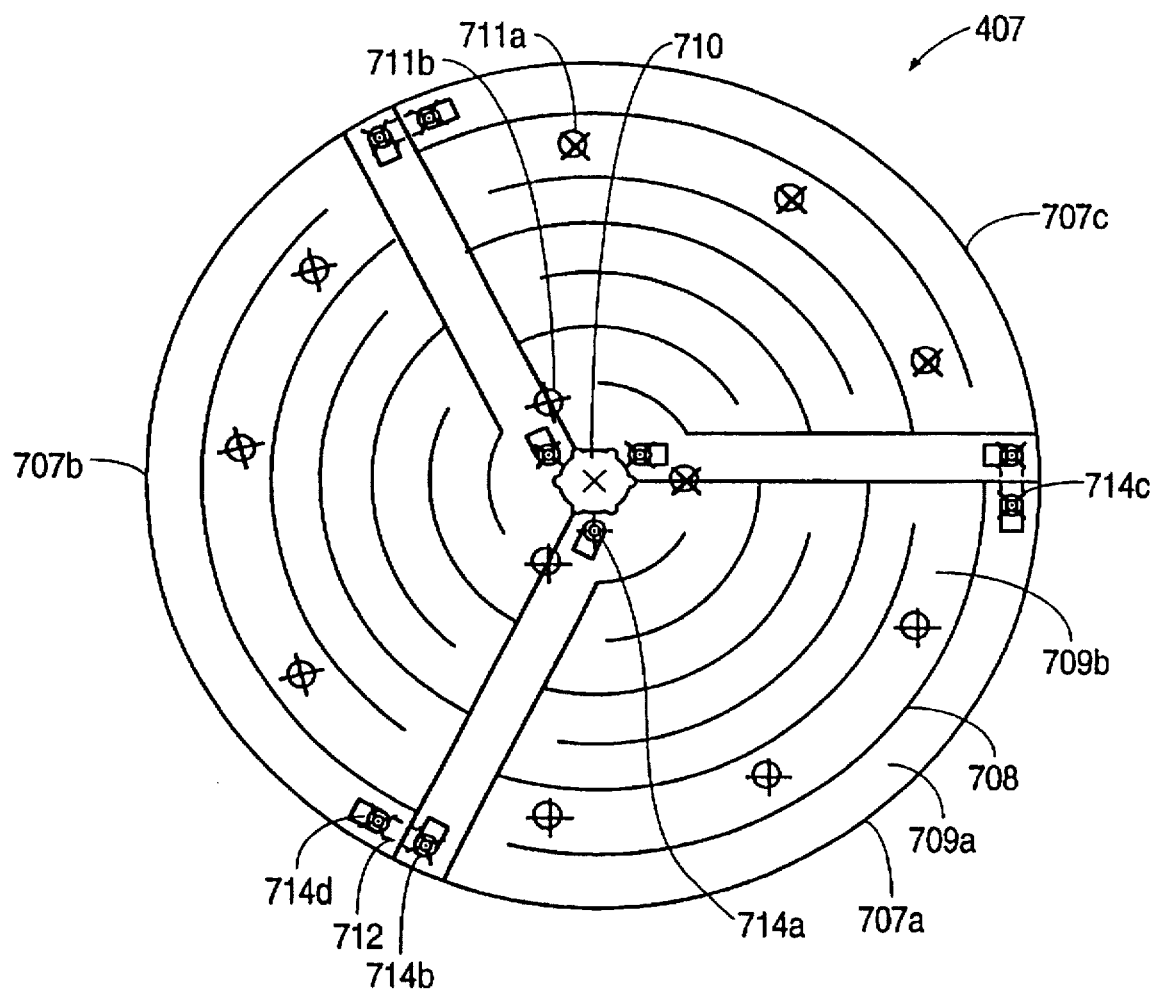
FIG. 7A is a cross-sectional view of a resistance heater for using with a reactor according to the invention.
Figure 7D:
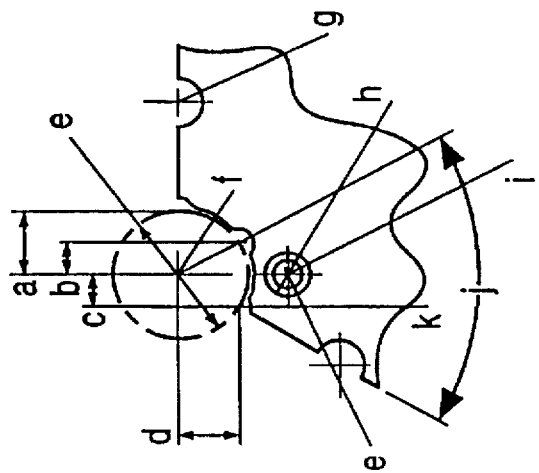
FIG. 7D is a detailed view of a portion of the section shown in FIG. 7B.
Figure 7C:
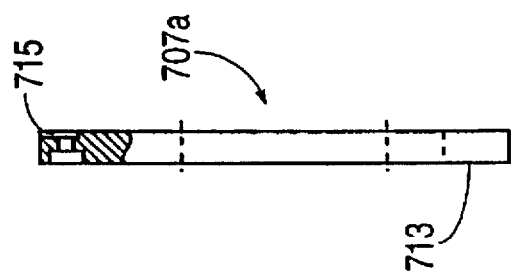
FIG. 7C is a side cutaway view of the section shown in FIG. 7B.
Figure 7B:
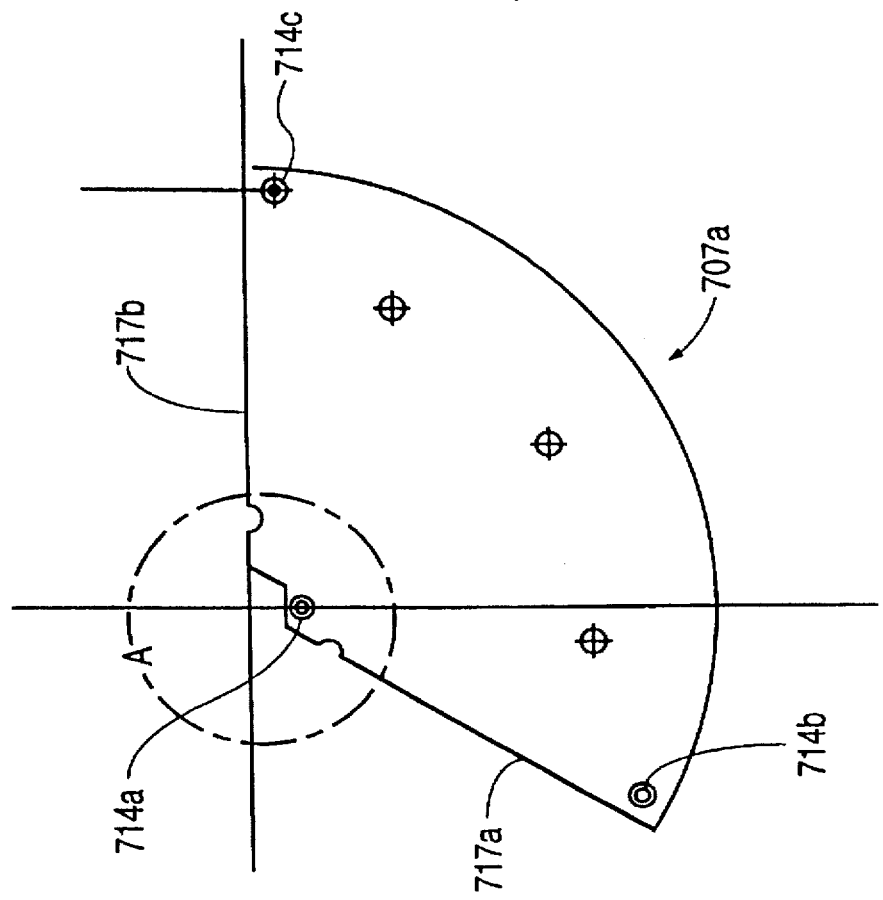
FIG. 7B is a plan view of a section of the resistance heater of FIG. 7A.

FIG. 7A is a cross-sectional view of resistance heater 407, which is made of three identical sections 707a, 707b, 707c, showing the pattern of the resistance element. FIGS. 7B and 7C are a plan view and side cutaway view, respectively, of section 707a of resistance heater 407. FIG. 7D is a detailed view of the portion of section 707a delineated by section line A in FIG. 7B. Resistance heater 407 is made to order by Union Carbide Advance Ceramics Corp. in Cleveland, Ohio, and can be obtained by presenting the drawings shown in FIGS. 7A, 7B, 7C and 7D, and specifying Part No. E10005.

The dimensions in FIG. 7D are defined in Table 2.

TABLE 2

| Ref. No. | Dimension (inches unless otherwise indicated) |
|---|---|
| a | 0.500 |
| b | 0.250 |
| c | 0.250 |
| d | 0.433 |
| e | 1.00 DIA |
| f | 0.563 R |
| g | 0.188 R |
| h | 0.359 DIA 0.200 DEEP |
| i | 0.234 DIA FARSIDE 0.13 DEEP ONLY THIS HOLE |
| j | 60.0° |
| k | 0.125 R |
| l | 0.196 DIA THRU |

Each section, e.g., section 707a, of resistance heater 407 is made of three layers: two outer layers of ceramic and an inner layer of graphite. FIG. 7A is a cross-sectional view of resistance heater 407 showing the graphite layer. The graphite layer is patterned such that electrically insulative regions, e.g., region 708, separate portions of the graphite layer, e.g., portions 709a, 709b, so that the graphite forms a maze-like path. Resistance heater 407 generates heat when current is passed through this maze-like path. The electrically insulative regions, e.g., region 708, may be formed of, for instance, ceramic. Alternatively, the electrically insulative regions, e.g., region 708, may be grooves formed in the graphite layer. In this latter case, air in the grooves provides the necessary electrical insulation.

The diameter of resistance heater 407 is 14.0 inches (35.6 cm) and the thickness is 0.5 inches (1.27 cm). Resistance heater operates on 3-phase power. At a voltage of 240 volts, 46 amps of current can be generated; at 480 volts, 92 amps of current can be generated.

Hole 710 is centrally formed in resistance heater 407 to allow shaft 516 (FIGS. 5E and 5F) to pass through resistance heater 407 and support susceptor 402, as explained more fully below. A plurality of holes, e.g., holes 711a, 711b, are formed through resistance heater 407 to allow passage of mounting rods, e.g., mounting rods 512a, 512b (FIGS. 5E and 5F), that are used in loading and unloading wafer 511, as described more in more detail below. Though twelve holes, e.g., holes 711a, 711b, are shown in resistance heater 407, it is to be understood that any number of holes may be formed to conform to a particular wafer load/unload scheme. The holes, e.g., holes 711a, 711b, have a diameter of 0.375 inches (0.953 cm), i.e., slightly larger than the diameter of mounting rods, e.g., mounting rods 512a, 512b. The holes, e.g., holes 711a, 711b, are located to correspond to the locations of the corresponding mounting rods, e.g., mounting rods 512a, 512b.

As seen in FIG. 7B and explained in more detail below, three molybdenum screws 714a, 714b, 714c are disposed in section 707a of resistance heater 407. Screw 714a provides electrical connection between an external electrical supply and the graphite resistance element within section 707a of resistance heater 407. Screws 714b and 714c are used to make electrical connection between section 707a and sections 707b and 707c, respectively. Returning to FIG. 7A, screw 714b of section 707a and screw 714d of section 707b each make contact with sleeve 712 disposed in the bottom ceramic layer of resistance heater 407, which is made of molybdenum or graphite, to form an electrical connection between the graphite resistance elements in sections 707a and 707b. Similar connections are made to connect sections 707a and 707c, and sections 707b and 707c.

In FIG. 7B, the center of molybdenum screws 714b, 714c are each 6.614 inches (16.80 cm) from the center of resistance heater 407 and 0.375 inches (0.953 cm) from corresponding sides 717a and 717b, respectively, of section 707a. The center of molybdenum screw 714a is 0.813 inches (2.07 cm) from the center of resistance heater 407 and 0.407 inches (1.03 cm) from side 717a of section 707a. The diameter of the head of each molybdenum screw, e.g., screws 714a, 714b, 714c, is 0.359 inches (0.912 cm) and, referring to FIG. 7C, the thickness is 0.2 inches (0.508 cm). An 0.125 inch (0.318 cm) thick slot 715 is formed adjacent the bottom of screw 714a through which electrical wire contacts screw 714a as described below. In reactor 400, surface 713 (FIG. 7C) is adjacent susceptor 402.

As seen in FIGS. 5E and 5F, resistance heater 407 is mounted on quartz layer 508 and covered with quartz cover 507. The surface of quartz cover 507 facing susceptor 402 is located approximately 0.875 inches (2.22 cm) beneath the susceptor. Layer 508 protects resistance heater 407 from deposition of gases during processing of wafer 511. Cover 507 also protects resistance heater 407 from deposition of gases. As with quartz liner 501 discussed above, after prolonged use of reactor 400, quartz layer 508 and cover 507 can be removed from reaction chamber 403 and cleaned. Quartz layer 508 and cover 507 can be cleaned more easily than resistance heater 407.

Additionally, since layer 508 and cover 507 are made of quartz, layer 508 and cover 507 absorb relatively little of the heat transmitted from resistance heater 407. Thus, cover 507 allows most of the heat from resistance heater 407 to be transmitted to wafer 511, and layer 508 does not act as a heat sink that draws heat away from wafer 511.

Since resistance heater 407 is within reaction chamber 403, a high voltage electrical supply must be routed into reaction chamber 403. However, during operation of reactor 400, the temperature within reaction chamber 403 can reach approximately 1200° C. This elevated temperature exceeds the insulation temperature specification for commercially available electrical wires. For example, in one embodiment of the invention, Firezone 101 electrical wire, commercially available from Bay Associates of Redwood City, Calif. and rated for 399° C. and 600 volts, is used to supply current to resistance heater 407. Further, for many processes, hydrogen is present within reaction chamber 403. If the insulation on the wire fails, there is danger that electrical arcing in reaction chamber 403 may result in an explosion.

According to an embodiment of the invention, the electrical supply problems above are overcome by providing channels, e.g., channel 419a (FIGS. 5E and 5F) in annular shaft 419 that extend from the bottom of resistance heater 407 out of reaction chamber 403. Channels, e.g., channel 508a, are formed through quartz layer 508. Channel 508a connects to channel 419a. Molybdenum screws, e.g., screw 524a, hold resistance heater 407 to quartz layer 508. Screw 524a contacts the graphite resistance elements of resistance heater 407 and extends into channel 508a. Molybdenum was chosen as the material for screw 524a because of its high electrical conductivity and good resistance to corrosion and heat (screw 524a can withstand temperatures up to 1370°

C.). Electrically conductive wire, rated for a 400° C. environment, is routed from outside reaction chamber 403 through channels 419a and 508a to screw 524a. In this manner, electric current is routed from outside reaction chamber 403 through the resistance elements of resistance heater 407 without exposing the electrical wire to a prohibitively high temperature environment or a hydrogen atmosphere. Since resistance heater 407 is supplied with three phase power, three sets of channels and screws, as described above, are used to route the electrical supply into reaction chamber 403.

As described above, in some embodiments of the invention, only a single radiant heat source above the reaction chamber is used. In those embodiments, it is desirable to put a layer of material below the susceptor that re-radiates or reflects heat toward the wafer. Such a passive heat distribution element helps maintain substantially uniform temperature throughout the wafers being processed.

Figure 8:
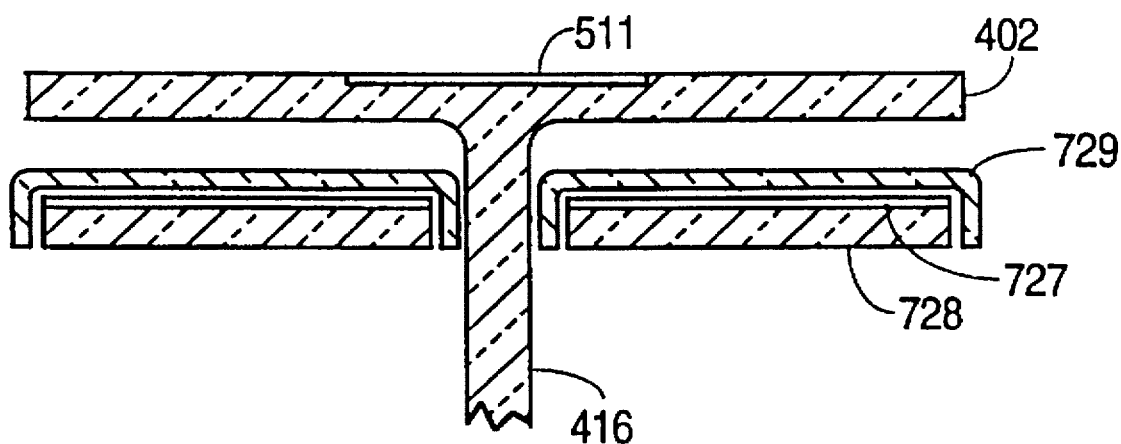
FIG. 8 is a cross-sectional view illustrating a passive heat distribution element for use with embodiments of the reactor of FIGS. 4A, 4B and 4C in which a single heat source is used.

FIG. 8 is a cross-sectional view of shaft 416 supporting susceptor 402 on which wafer 511 is mounted. In one embodiment of reactor 400, cloth 807 is sandwiched between cloth support 808 and cloth cover 809. Cloth 807 can be made of, for instance, graphite, metal or silicon carbide. In one embodiment of the invention, cloth 807 is silicon carbide. Cloth 807 has the same diameter as susceptor 402, i.e., 14 inches (35.6 cm).

In one embodiment of the invention, cloth support 808 and cloth cover 809 are quartz layer 508 and quartz cover 507, respectively, as described above with respect to FIGS. 5E and 5F. Quartz layer 508 is 0.625 inches (1.59 cm) thick and quartz cover is 0.125 inches (0.318 cm) thick. Quartz cover 507 extends just beyond the lower surface of quartz layer 508 to better prevent particulates from contaminating cloth 807. However, quartz cover 507 should not extend so far that quartz cover 507 hits bottom wall 401a when quartz cover 507, cloth 807 and quartz layer 508 are lowered with susceptor 402 when wafer 511 is to be loaded or unloaded (FIG. 5E).

As noted above, bottom wall 401a and side wall 401b of vessel 401 are cooled by a water flow passing through walls 401a and 401b. As seen in FIGS. 5E and 5F, channels 503c are formed in bottom wall 401a and side wall 401b is formed with cavity 503a. Both channels 503a and cavity 503c contain baffles to direct the water flow so that bottom wall 401a and side wall 401b are cooled uniformly. Additionally, water flows in cavity 503b formed in table 451 to cool O-rings 551a, 551b. Water is supplied at a pressure of approximately 80 psi from an external water source to cavities 503a, 503b and channel 503c from beneath vessel 501 through conventional piping, and the water flow rate is controlled by a conventional valve. In one embodiment of the invention, the water flow rate through each of channel 503c and cavities 503a, 503b is approximately 1.3 gallons per minute.

When wafer 511 has been heated to a predetermined temperature, a gas mixture is introduced into reaction chamber 403 through one of two conventional methods: center injection of the gases at the center of dome-shaped upper wall 401c or side injection of the gases through side ports. A gas line connects the gas panel to a conventional T-valve located underneath table 451. The valve is used to switch between using the center injection method and the side injection method.

In the center injection method, gases pass through gas inlet tube 408a (FIG. 5B), and are injected into reaction chamber 403 through orifices formed in gas injection head 514 (FIGS. 5A and 5B) at a rate of 3–150 slm, depending on the gases being used. Gas injection head 514 is different from gas injection head 414 shown in FIG. 4B. Both gas injection heads 414 and 514 are described in more detail below, as well as an additional embodiment of a gas injection head for use with the invention. In general, a gas injection head for use with the invention can have any of a number of shapes, e.g., shower head, conical, or ball.

Viewed from above vessel 401, gas injection head 514 is centrally located in vessel 401. Gas injection head 514 is held in place by a novel mounting method, as described in more detail below. Gas injection head 514 can be made from quartz or graphite. Graphite is used if it is desired to preheat the gases as they enter reaction chamber 403. Gas inlet tube 408a is made of stainless steel and has a diameter of 0.25 inches (0.64 cm). The gases pass down through reaction chamber 403, past susceptor 402 and resistance heater 407, and are exhausted from reaction chamber 403 through exhaust ports 409a and 409b (FIGS. 4A and 4B) located in bottom wall 401a.

Figure 9A:
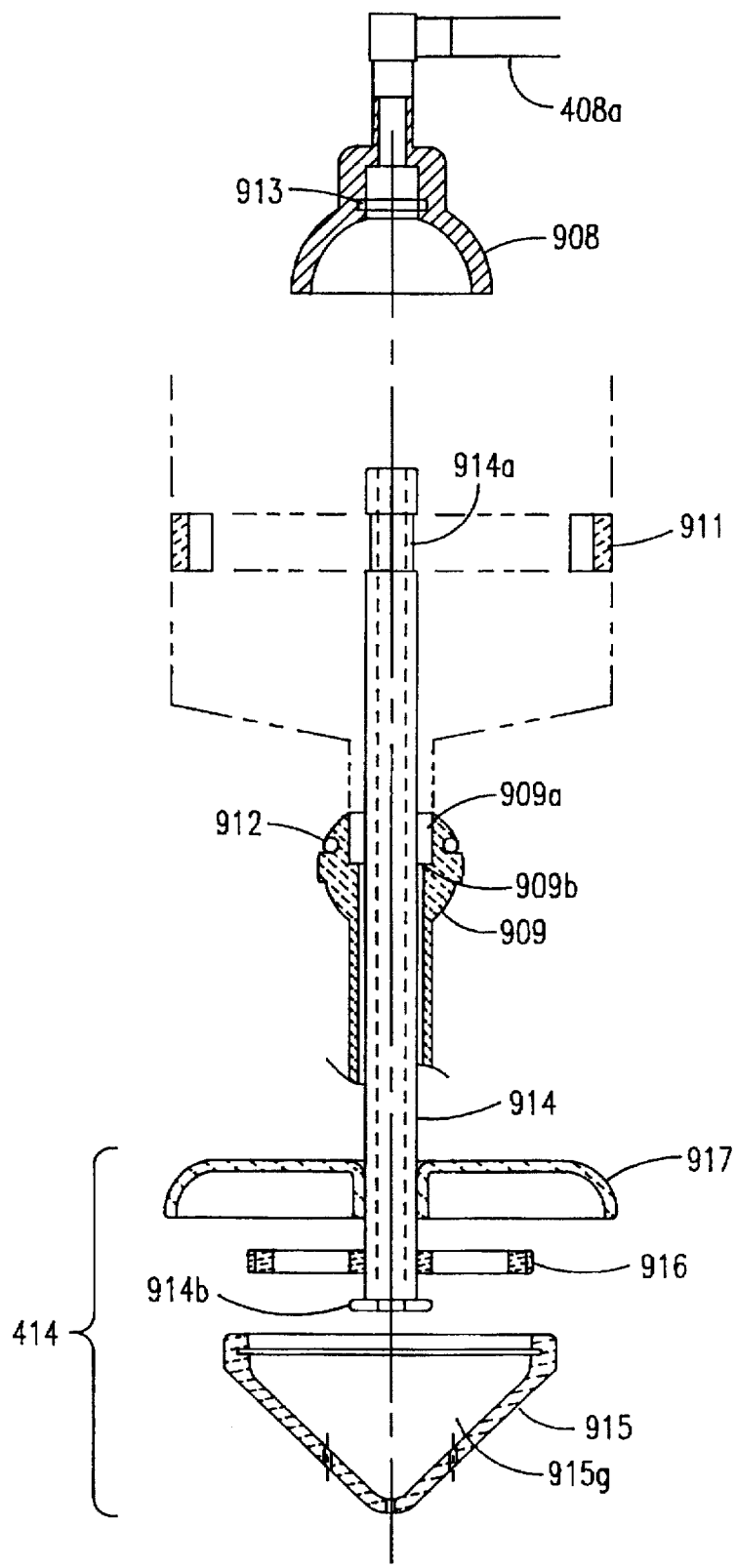
FIG. 9A is an exploded view of a gas injection head and structure for supporting the gas injection head according to one embodiment of the invention.
Figure 9E:
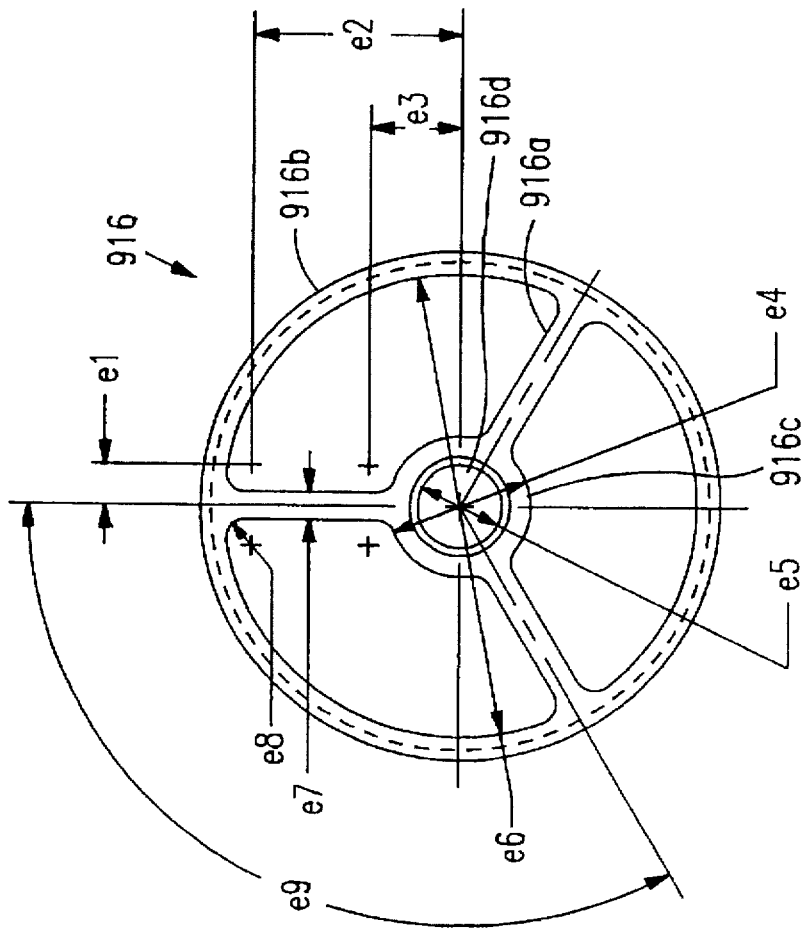
FIGS. 9D and 9E are a cross-sectional view and plan view, respectively, of an injector hanger for use with the gas injection head of FIG. 9A.
Figure 9D:
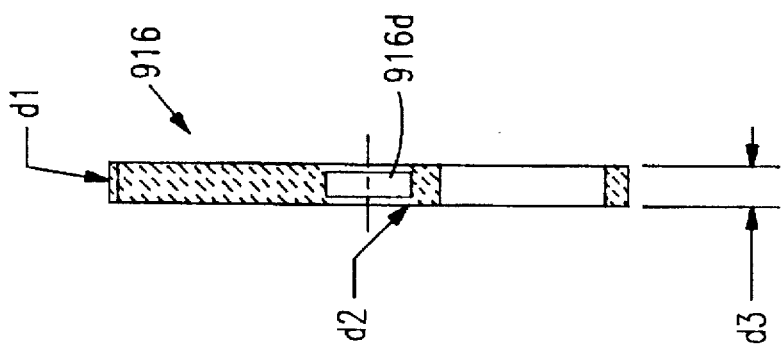

FIGS. 9A–9G illustrate the construction of gas injection head 414. FIG. 9A is an exploded view of gas injection head 414 illustrating the assembly of gas injection head 414 and structure for hanging gas injection head 414 from gas inlet tube 408a. FIGS. 9B and 9C are a cross-sectional view and plan view, respectively, of injector cone 915. FIGS. 9D and 9E are a cross-sectional view and plan view, respectively, of injector hanger 915. FIGS. 9F and 9G are a cross-sectional view and plan view, respectively, of injector umbrella 916.

In FIG. 9A, gas inlet tube 408a is attached to stainless steel dome 908. Dome 908 fits over quartz ball 909, covering cavity 909a formed in ball 909. An O-ring 912 provides a seal between dome 908 and ball 909. Indentation 914a is formed in gas injection head extension tube 914. Clamp 911 is a two-piece ring mounted around indentation 914a and inserted into cavity 909a such that clamp 911 rests on shelf 909b of ball 909. Clamp 911 is made of quartz. Clamp 911 is prevented from coming apart by the walls of cavity 909a. Because clamp 911 grips gas injection head 414 and rests on shelf 909b, gas injection head 414 is held in place at the desired height in reaction chamber 403. O-ring 913 forms a seal between gas injection head 414 and dome 908.

Injector cone 915 (FIGS. 9B and 9C) is made of graphite and coated with silicon carbide. In an alternative embodiment, injector cone 915 is made of quartz. A single orifice 915b (FIG. 9B) is formed in peak 915a of injector cone 915. Four additional orifices 915c are formed on surface 915e. Recess 915f is formed in injector cone 915 opposite peak 915a and is threaded. Lip 915d is formed at an inner end of recess 915f.

The dimensions in FIG. 9B are defined in Table 3.

TABLE 3

| Ref. No. | Dimension (inches unless otherwise indicated) |
| --- | --- |
| b1 | 0.250 |
| b2 | 0.06 R |
| b3 | 0.250 R |
| b4 | 2.29 |
| b5 | 2.13 |
| b6 | 0.25 R |
| b7 | 0.10 |
| b8 | 1.355 |
| b9 | 0.187 |
| b10 | 0.04 THREAD RELIEF |
| b11 | 90° |

The dimensions in FIG. 9C are defined in Table 4.

TABLE 4

| Ref. No. | Dimension (inches unless otherwise indicated) |
|---|---|
| c1 | 2.250 16 THREAD |
| c2 | 0.250 |
| c3 | 0.740 B.C. |
| c4 | 0.035 |

Injector hanger 916 (FIG. 9D and 9E) is made of graphite coated with silicon carbide, is circumferentially threaded and has an outer diameter to match the diameter of recess 915f (FIG. 9B). Alternatively, injector hanger 916 is made of quartz. Injector hanger 916 is formed with three spokes 916a (FIG. 9E) that extend inward from an outer ring 916b to an inner ring 916c. Hole 916d is formed through inner ring 916c through which a gas injection head extension tube 914 extends to carries gases from gas inlet tube 408a (FIG. 9A). Injector hanger 916 is screwed into recess 915f of injector cone 915.

Injector umbrella 917 (FIGS. 9F and 9G) is made of fire-polished quartz. Surface 917a (FIG. 9F) of injector umbrella 917 contacts surface inner ring 916c (FIG. 9E) of injector hanger 916. Gas injection head extension tube 914 (FIG. 9A) extends through hole 917b formed in injector umbrella 917.

The dimensions in FIG. 9D, 9F, and 9G are defined in Table 5.

TABLE 5

| Ref. No. | Dimension (inches unless otherwise indicated) |
|---|---|
| d1 | 2.250 16 THREAD |
| d2 | 0.03 C |
| e1 | 0.188 REF |
| e2 | 0.878 REF |
| e3 | 0.409 REF |
| e4 | 0.650 |
| e5 | 0.400 + .010 −.000 |
| e6 | 1.355 |
| e7 | 0.125 |
| e8 | 0.13 R TYP |
| e9 | 120.0° |
| f1 | 0.38 R |
| f2 | 0.08 THK |
| f3 | 0.45 |
| g1 | 3.41 DIA |
| g2 | 0.400 DIA + 0.060 −0.000 |

As seen in FIG. 9A, when gas injection head 414 is used in reactor 400, gases pass through gas injection head extension tube 914 into cavity 915g of injector cone 915. Some of the gases are discharged into reaction chamber 403 through orifices 915b and 915c (FIGS. 9B and 9C). The remainder of the gas is discharged between spokes 916a of injector hanger 916 (FIGS. 9A and 9E). Injector umbrella 917 (FIG. 9A) redirects this gas flow toward wafer 511 in reaction chamber 403.

Referring to FIG. 9A, gas injection head 414 is assembled in the following manner. Gas injection head extension tube 914 is inserted through hole 916d (FIGS. 9D and 9E) in injector hanger 916 so that injector hanger 916 rests on lip 914b. Injector umbrella 917 is mounted around gas injection head extension tube 914 adjacent injector hanger 916. Injector cone 915 is screwed onto injector hanger 916. Gas injection head extension tube 914 is then attached to gas inlet tube 408a as described above.

Figure 10A:
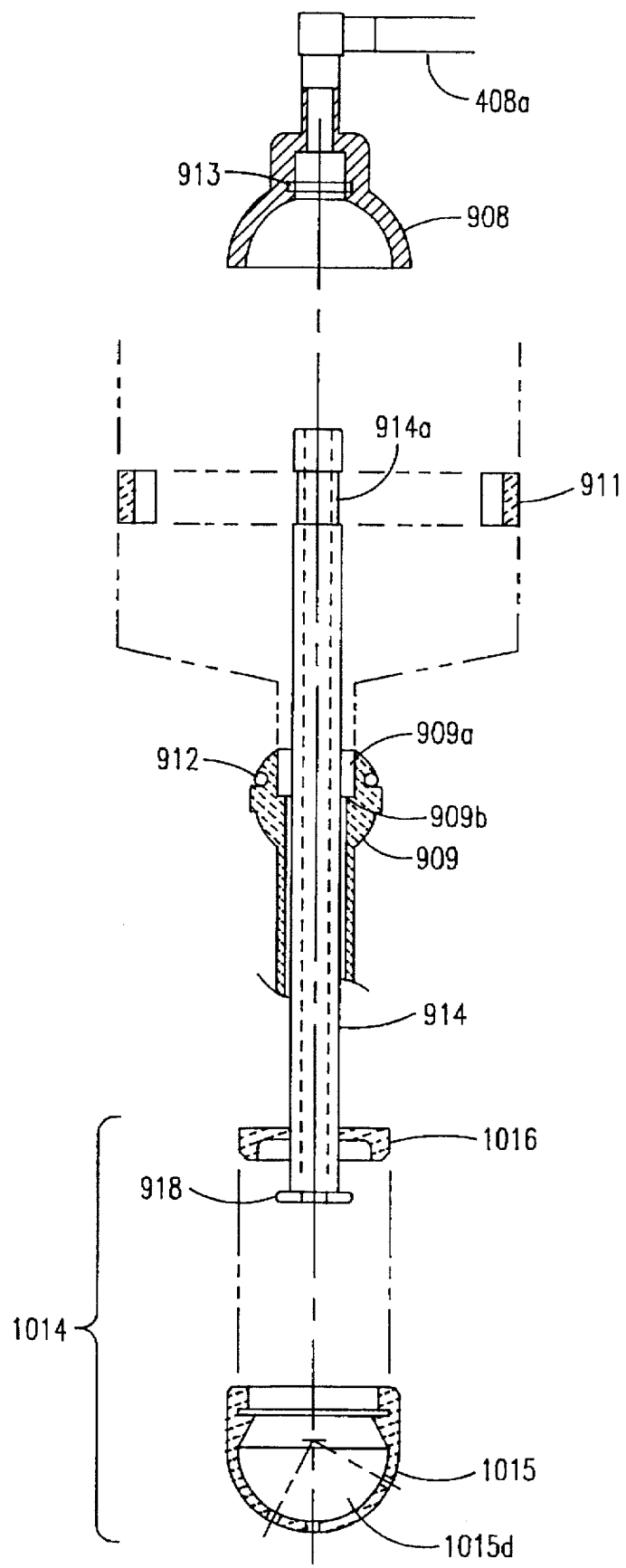
FIG. 10A is an exploded view of a gas injection head and structure for supporting the gas injection head according to another embodiment of the invention.

FIGS. 10A–10E illustrate the construction of gas injection head 1014. FIG. 10A is an exploded view of gas injection head 1014 illustrating the assembly of gas injection head 1014 and structure for hanging gas injection head 1014 from gas inlet tube 408a. Gas injection head 1014 includes injector ball 1015, shown in FIGS. 10B and 10C, and injector ball top 1016, shown in FIGS. 10D and 10E.

The dimensions in FIG. 10B, 10C, 10D, and 10E are defined in Table 6.

TABLE 6

| Ref. No. | Dimension (inches unless otherwise indicated) |
|---|---|
| B1 | 1.000 |
| B2 | 0.66 R |
| B3 | 0.375 REF |
| B4 | 0.50 |
| B5 | 0.75 R |
| B6 | 60.0° |
| B7 | 30.0° |
| B8 | 30.0° |
| B9 | 0.06 |
| B10 | 0.250 |
| B11 | 1.125 |
| B12 | 0.06 R |
| C1 | 0.060 |
| C2 | 1.500 |
| C3 | 0.100 |
| D1 | 1.250 12 UNF-2B |
| D2 | 0.09 |
| D3 | 1.00 |
| D4 | 0.02 C |
| D5 | 0.06 R |
| D6 | 0.04 C |
| D7 | 0.250 |
| E1 | 0.400 |

Injector ball 1015 and injector ball top 1016 are both made of graphite coated with silicon carbide. Alternatively, injector ball 1015 and injector ball top 1016 could be made of quartz. Eleven orifices 1015a (FIG. 10B) are formed through injector ball 1015 (FIGS. 10B and 10C). Other numbers of orifices could be used. Recess 1015b is formed in injector ball 1015 and is threaded. Lip 1015c is formed at an inner end of recess 1015b.

Injector ball top 1016 (FIGS. 10A, 10D and 10E) is circumferentially threaded and has an outer diameter to match the diameter of recess 1015c. Injector ball top 1016 is screwed into recess 1015b of injector ball 1015. Injector ball top 1016 has recess 1016a formed in the side of injector ball top 1016 that contacts lip 1015c. A hole is formed through injector ball top 1016 through which gas injection head extension tube 914 extends and carries gases from gas inlet tube 408a (FIG. 10A).

As seen in FIG. 10A, when gas injection head 1014 is used in reactor 400, gases pass through gas injection head extension tube 914 into cavity 1015d of injector ball 1015. The gases are discharged into reaction chamber 403 through orifices 1015a.

Gas injection head 1014 is attached to gas inlet tube 408a in the same manner as described above for gas injection head 414 (FIG. 9A). Referring to FIG. 10A, gas injection head 1014 is assembled in the following manner. Gas injection head extension tube 914 is inserted through hole 1016b (FIGS. 10D and 10E) in injector ball top 1016 so that injector ball top 1016 rests on lip 914b. Injector ball 1015 is screwed onto injector ball top 1016. Gas injection head extension tube 914 is then attached to gas inlet tube 408a as described above.

Figure 11:
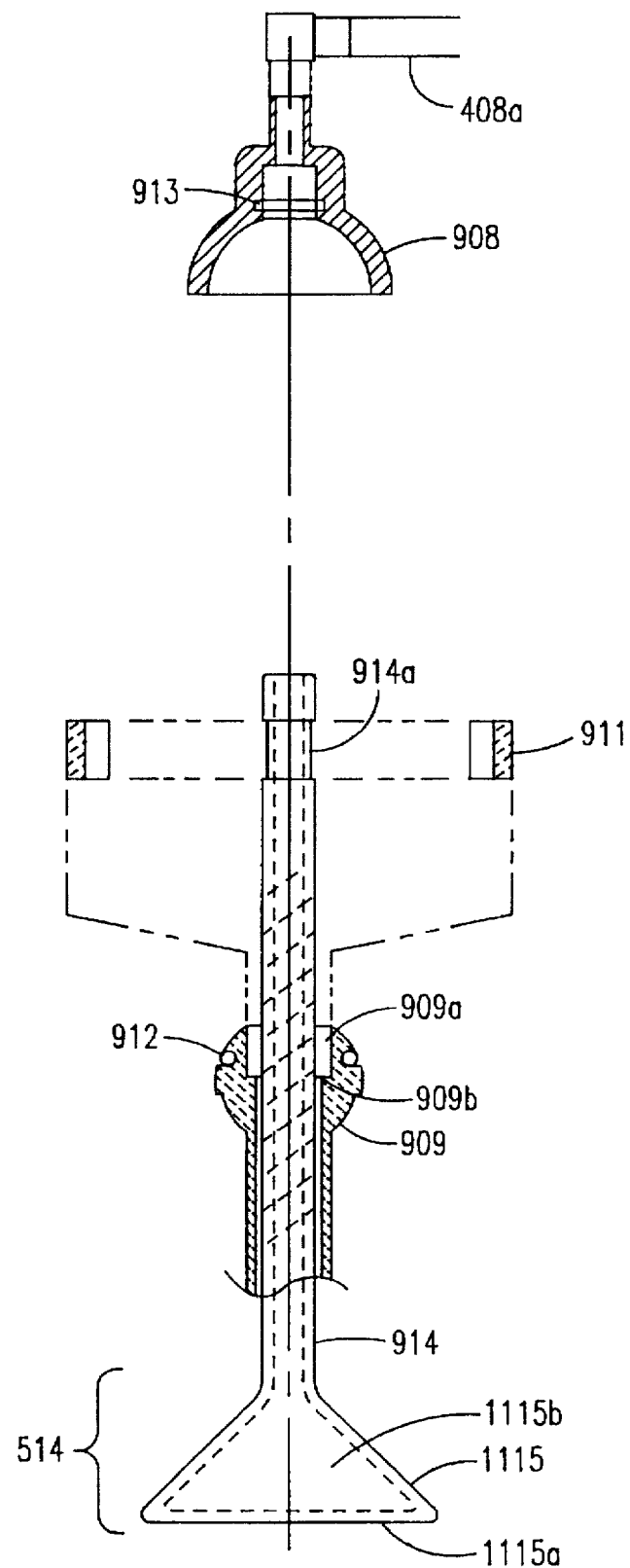
FIG. 11 is an exploded view of a gas injection head and structure for supporting the gas injection head according to another embodiment of the invention.

FIG. 11 is an exploded view of gas injection head 514 illustrating the assembly of gas injection head 514 and structure for hanging gas injection head 514 from gas inlet tube 408a. Gas injection head 514 is a shower head 1115 formed integrally with gas injection head extension tube 914. A plurality of orifices are formed through shower head 1115 to surface 1115a. In one embodiment, 11 orifices are formed through shower head 1115. When gas injection head 514 is used in reactor 400, gases pass through gas injection head extension tube 914 into cavity 1115b of shower head 1115. The gases are discharged into reaction chamber 403 through the orifices. Gas injection head extension tube 914 is attached to gas inlet tube 408a in the same manner as described above for gas injection head 414 (FIG. 9A).

In the side injection method, gases pass through gas inlet tube 408b (FIG. 5B) and are introduced into reaction chamber 403 through ports 521a, 521b, 521c (FIG. 5D) formed in bottom wall 401a via a plurality of gas injection jets, e.g., gas injection jet 421a (FIGS. 5E and 5F) arranged about the periphery of reaction chamber 403. (Hereafter, gas injection jets are referred to generally as gas injection jets 421, though such a numerical designation does not appear in the Figures.) Viewed from above, ports 521a, 521b, 521c are formed symmetrically in bottom wall 401a, near the edge of bottom wall 401a and 120° apart radially. The centerline of each of ports 521a, 521b, 521c is 0.725 inches (1.84 cm) from side wall 401b. The diameter of each of ports 521a, 521b, 521c is 0.75–1.25 inches (1.9–3.2 cm). In one embodiment, the diameter of each of ports 521a, 521b, 521c is 0.875 inches (2.22 cm) Each of the gas injection jets 421, can be rotated and moved up and down through bottom wall 401a so that gases are expelled into reaction chamber 403 at various heights and/or orientations, as desired. The gas injection jets 421 could enter reaction chamber 403 at other locations if desired, e.g., through side wall 401b or upper wall 401c. The location and direction of discharge of gases into reaction chamber 403 is more important than the particular manner in which gas injection jets 421 enter reaction chamber 403.

Gases are introduced into reaction chamber 403 through gas injection jets 421 at flow rates of 10–200 slm, depending on the gases being used. In one embodiment, there are three gas injection jets 421, each of which is made of quartz and has a single circular orifice with a diameter of 0.180 inches (0.46 cm). It is to be understood that use of a different number of gas injection jets 421 is within the ambit of the invention. For instance, 2–10 gas injection jets 421 can be advantageously used to accomplish a desired gas flow through reaction chamber 403. Further, gas jets 421 may have more than orifice and the orifice shape may be other than circular. Additionally, gas injection jets 421 could be made of stainless steel or graphite instead of quartz.

In one embodiment, gas injection jets 421 are oriented so that the gas flows from the gas injection jets 421 are directed to a point just beneath upper wall 401c so that the gas flows collide, producing a gas flow that then descends over wafer 511 so that a uniform deposition is achieved. Alternatively, gas injection jets 421 may be oriented so that the gas flows are directed toward upper wall 401c and interact with the curvature of upper wall 401c to produce yet another gas flow that descends over wafer 511. Since the gases travel the distance from gas injection jets 421 to upper wall 401c and from upper wall 401c to susceptor 402, the gases are well-heated by the time they reach wafer 511. The gases flow down through reaction chamber 403, past susceptor 402 and resistance heater 407 and are exhausted through exhaust ports 509a and 509b.

During operation of reactor 400, gases may leak from reaction chamber 403 through gaps between shaft 416 and annular shaft 419, and annular shaft 419 and bottom wall 401a (FIGS. 5E and 5F). This leakage is minimized as much as possible by making the distances between shaft 416 and annular shaft 419, and annular shaft 419 and bottom wall 401a as small as possible. The minimum spacing between shaft 416 and annular shaft 419 is approximately 0.062 inches (1.6 mm) in this embodiment. The spacing between annular shaft 419 and bottom wall 401a is 0.031 inches (0.8 mm).

Additionally, as noted above, conventional bellows assembly 420, available as Part No. SK-1601-6009 from Metal Fab. Corp. in Ormond Beach, Fla., seals region 427 (see FIGS. 4A and 4B) surrounding shaft 416, annular shaft 419 and associated mechanisms to contain leaking gases. Bellows assembly 420 has an accordion-like section 420b welded between two flange sections (only upper flange section 420a is shown in FIGS. 5E and 5F). Section 420b is made of stainless steel sheet metal and compresses and expands as susceptor 402 is lowered and raised. The flange sections, e.g., upper flange section 420a, are also made of stainless steel. Upper flange section 420a is bolted to bottom wall 401a. The lower flange section (not shown) is attached to shelf 426 (FIG. 4B).

Bellows purge 526 purges gases from region 427. Purge gas is introduced into region 427 through bellows purge 526 at a higher pressure than the pressure in reaction chamber 403. As a result, gases that would otherwise leak from reaction chamber 403 are forced back into reaction chamber 403. The purge gas also enters reaction chamber 403, but, since the purge gas enters the bottom of reaction chamber 403 through bottom wall 403a, and since the flow within reaction chamber 403 is downward toward exhaust lines 409a, 409b, the purge gas is quickly exhausted from reaction chamber 403 through exhaust lines 409a, 409b. The remainder of the purge gas within region 427, and any process gases that may have leaked into region 427, are discharged through exhaust tube 527. In one embodiment, a vacuum pump draws a vacuum of approximately 10 torr through exhaust tube 527 to aid in removal of gases and particulates from region 527. During processing of wafer 511 in reactor 400, hydrogen is used as a purge gas through bellows purge 526 since some of the purge gas enters reaction chamber 403. After processing of wafer 511, nitrogen is used as the purge gas.

As shown in FIGS. 5E and 5F, susceptor 402 is supported by shaft 516. The end of shaft 516 opposite the end attached to the underside of susceptor 402 is conically shaped and is inserted in and attached with a pin (not shown) to a mating conically shaped recess formed in an end of shaft 416. The fit between the conically shaped end of shaft 516 and the conically shaped recess of shaft 416 ensures that susceptor 402 remains level (i.e., does not wobble) when shaft 416 is rotated during operation of reactor 400. Maintenance of a level susceptor 402 is important to ensure that layers of material that may be deposited on the wafer 511 during operation of reactor 400 are deposited evenly over the surface of the wafer 511.

Alternatively, shaft 516 could have been formed with a cylindrical end rather than a conical end, and shaft 416 formed with a cylindrical mating hole if such a connection is found to minimize wobble of susceptor 402 as it rotates. The important point is that the connection between shafts 416 and 516 be made so that susceptor 402 remains level during rotation of susceptor 402.

In an alternative embodiment, the end of shaft 516 inserted into shaft 416 is cylindrical and has a hexagonal cross-section. A mating hexagonally shaped recess is formed in shaft 416. The weight of susceptor 402 holds shaft 516 in place in the recess formed in shaft 416. The fit between the hexagonally shaped end of shaft 516 and the hexagonally shaped recess of shaft 416 ensures that susceptor 402 is properly oriented with respect to the pins used to raise wafer 511 above susceptor 402 (described in more detail below) so that those pins will extend through the corresponding holes in susceptor 402. Alternatively, end 516a could have another cross-sectional shape, e.g., square, that holds susceptor 402 in the proper orientation. End 516a also minimizes wobble of susceptor 402 to maintain the surface of susceptor 402 supporting wafer 511 level during rotation of susceptor 402.

Shaft 516 can be made from, for instance, quartz, graphite or any ceramic material that can withstand the operating conditions (i.e., high temperature, gaseous environment) within reaction chamber 403. In one embodiment of the invention, shaft 516 is made of quartz. Quartz absorbs relatively little heat, as compared to graphite, so that when shaft 516 is made of quartz, there is less likelihood that shaft 516 will heat up and possibly cause temperature non-uniformity in wafer 511 mounted on susceptor 402. Shaft 416 is made from, for instance, stainless steel.

It is desirable that the support for susceptor 402 be formed in two sections, i.e., shafts 416 and 516, because, in the preferred embodiment of the invention, shaft 516 is formed integrally with susceptor 402. As described below, it is desirable to use a different susceptor 402 to process wafers, e.g., wafer 511, of different sizes. Thus, the susceptor support must be formed with two shafts 416, 516 so that shaft 516 may be separated easily from the remainder of the susceptor support when it is desired to change to a different susceptor 402.

As part of processing wafer 511 with reactor 400, it is necessary to place wafer 511 on susceptor 402 in reaction chamber 403 prior to beginning the process, and remove processed wafer 511 from reaction chamber 403 after completion of the process. When it is desired to remove or insert wafer 511 from or into reaction chamber 403, susceptor 402 is rotated to a particular position (denominated the "home" position) that allows removal of wafer 511. When wafer 511 is being placed onto, or removed from, susceptor 402, susceptor 402 is lowered to a position near bottom wall 401a.

FIG. 5E shows susceptor 402 in a lowered position in preparation for loading wafer 511 onto susceptor 402. A plurality of mounting rods, e.g., mounting rods 512a, 512b, are attached to bottom wall 401a. The mounting rods, e.g., mounting rod 512a are made of stainless steel or graphite. Corresponding holes, e.g., holes 531a, 532a, and 533a corresponding to mounting rod 512a, are formed in resistance heater 407, quartz layer 508 and susceptor 402, respectively. Wafer support pins, e.g., wafer support pins 513a, 513b, are mounted in cylindrical recesses formed in the ends of the mounting rods, e.g., mounting rods 512a, 512b for wafer support pins 513a, 513b, respectively. ((Hereafter, unless reference is being made to a particular mounting rod, wafer support pin or corresponding hole, e.g., mounting rod 512a, the mounting rods, wafer support pins and corresponding holes are referred to generally as mounting rods 512, wafer support pins 513 and holes 531, 532 and 533, though those numerical designations do not appear in the FIGS.) When susceptor 402 is in the position shown in FIG. 5E, mounting rods 512 extend through holes 531, 532, 533 and engage wafer support pins 513 so that wafer support pins 513 are raised above the surface of susceptor 402 on which wafer 511 is to be mounted.

Door 413 (not shown in FIGS. 5E and 5F) is provided in one side of vessel 401 through which wafer 511 is inserted into and removed from reaction chamber 403. Wafer 511 may be placed on or removed from susceptor 402 either with a robotic system or with a manual mechanical system. If the robotic system is used, the robot is programmed so that the robot arm extends the proper distance to pick up wafer 511 or accurately place wafer 511 at a predetermined location on susceptor 402. If the manual system is used, mechanical stops are placed so as to limit the motion of the wafer handling arm such that when the arm hits the stops, the arm is properly positioned to pick up or place wafer 511 from or on susceptor 402. Thus, with either system, good control of the positioning of wafer 511 on susceptor 402 is achieved.

Once wafer 511 is placed on wafer support pins 513, the wafer handling arm is removed from reaction chamber 403 and door 413 is shut. Susceptor 402 is raised to the position at which susceptor 402 is held during processing of wafer 511 (FIG. 5F). As susceptor 402 is raised, mounting rods 512 withdraw through holes 531, 532, 533. Wafer support pins 513 withdraw through holes 533. Eventually, wafer support pins 513 are withdrawn so that tapered ends of wafer support pins 513 seat in the tapered sections of holes 533. At this point, wafer support pins 513 are flush with the surface of susceptor 402 on which wafer 511 is mounted so that wafer 511 rests on susceptor 402.

Wafer support pins 513 are made of quartz so that wafer support pins 513 do not absorb heat and create a hot spot within wafer 511. Wafer support pins 513 must seat snugly in the tapered portion of holes 533 so that reactant gases cannot flow into holes 533.

As described in more detail below, wafers of different sizes require a different susceptor 402 since, for each wafer size, the wafers are located at different locations on susceptor 402. Further, the number and location of mounting rods 512, wafer support pins 513, and holes 531, 532, 533 varies with the particular susceptor 402 being used. Consequently, different mounting rods 512 are used to raise and lower wafers of different sizes.

The locations of mounting rods 512 for each wafer size are shown in FIG. 5D. For 125 mm (5 inch), 150 mm (6 inch) and 200 mm (8 inch), mounting rods 512b, 512d and 512e are used. Optionally, mounting rods 512a, 512b, 512c and 512d can be used with 200 mm (8 inch) wafers. For 250 mm (10 inch) wafers, mounting rods 512a, 512c, 512f and 512g are used. For 300 mm (12 inch) wafers, mounting rods 512f, 512g, 512h and 512i are used.

As seen in FIGS. 5E and 5F, almost none of the susceptor support structure is exposed inside reaction chamber 403. Only a small portion of shaft 516 and a variable portion (depending on the position of susceptor 402) of annular shaft 419 are exposed inside reaction chamber 403. The middle portion of shaft 516 is surrounded by quartz cover 507, which also serves to substantially seal shaft 416 and the bottom portion of shaft 516 from reaction chamber 403. Since resistance heater 407 is raised or lowered with susceptor 402, this is true whether susceptor 402 is in a lowered position as in FIG. 5E or a raised position as in FIG. 5F.

Significantly, both motors 415 and 417 (FIGS. 4A and 4B) are outside of reaction chamber 403. Since most of the components of the structure for supporting and moving susceptor 402 are outside reaction chamber 403, there are relatively fewer surfaces on which process gases may be undesirably deposited, as compared to previous reactors. Thus, fewer contaminants are present during subsequent uses of reactor 400 that will detrimentally affect the layer of material deposited on wafer 511 or that may alter the heating characteristics of reactor 400.

As noted above, susceptor 402 can be rotated. Susceptor 402 can be rotated in either the clockwise or counterclockwise directions. The rotation of susceptor 402 causes the position of each point on the surface of wafer 511 (excepting a point coincident with the axis of rotation of susceptor 402) to continually vary, relative to the mean direction of gas flow past wafer 511, during operation of reactor 400. Consequently, the effect of non-uniformities in heating or gas distribution that would otherwise create non-uniformities in a film deposited on wafer 511, as well as dislocations and slip on wafer 511, are substantially negated. The rotation distributes the non-uniformities in heating or gas distribution over the upper surface 511a of wafer 511 (FIG. 5F) rather than allowing them to be localized at a particular spot. Typically, susceptor 402 is rotated at a speed of 0.5–30 rpm. The exact speed is determined empirically as part of the process of "tuning" reactor 400 after reactor 400 has been designated for a particular application.

As seen in FIGS. 5E and 5F, resistance heater 407 is attached to annular shaft 419 so that resistance heater 407 is a small distance beneath susceptor 402. Though resistance heater 407 and susceptor 402 cannot contact each other because the rotation of susceptor 402 would cause abrasion between susceptor 402 and resistance heater 407 that could create undesirable particulates and possibly damage susceptor 402 or resistance heater 407, ideally, there would be minimal separation between resistance heater 407 and susceptor 402. In one embodiment, resistance heater 407 is approximately 0.5 inches (1.3 cm) beneath susceptor 402. Since resistance heater 407 moves up and down with susceptor 402 as susceptor 402 is moved up and down in reaction chamber 403, resistance heater 407 provides, for a given power level, the same amount of heat to wafer 511 independent of the position of susceptor 402 within reaction chamber 403.

At the beginning of processing of wafer 511 in reactor 400, lamps 505 and resistance heater 407 each supply heat such that the temperature of wafer 511 is increased as quickly and uniformly as possible without producing undue stresses in the wafer. Different amounts of heat can be supplied by each of lamps 505 and resistance heater 407. The amount of heat supplied by each lamp 505 and resistance heater 407 is pre-determined based upon prior temperature calibration. When the temperature within reactor 400 reaches a temperature within the operating range of the reactor temperature sensor, e.g., thermocouple 525, groups of lamps 505 and resistance heater 407 are separately controlled, based upon the measured temperature within reactor 400, to supply varying amounts of heat as necessary to maintain substantially uniform temperature throughout wafer 511 as wafer 511 is brought to the process temperature.

A plurality of silicon controlled rectifiers (SCRs) controls the current supplied to both heat sources and, thus, the amount of heat from each of the heat sources. In the embodiment of the invention shown in FIGS. 4A, 4B, 5A, 5B, 5C, 5D, 5E and 5F, seven SCRs are used. SCRs 1 and 2 control resistance heater 407. Since the amount of heat generated by resistance heater 407 is directly proportional to the magnitude of the voltage and current across the heating elements of resistance heater 407, SCRs 1 and 2 change the current through the heating elements of resistance heater 407 to increase or decrease the amount of heat supplied by resistance heater 407. SCRs 3–7 each control a group of lamps 505. The radiant energy from each lamp 505 is directly proportional to the voltage and current applied to lamp 505. Therefore, each of the SCRs 3–7 controls the current to associated lamps 505 to modulate the amount of heat supplied by those lamps 505.

Figure 12:
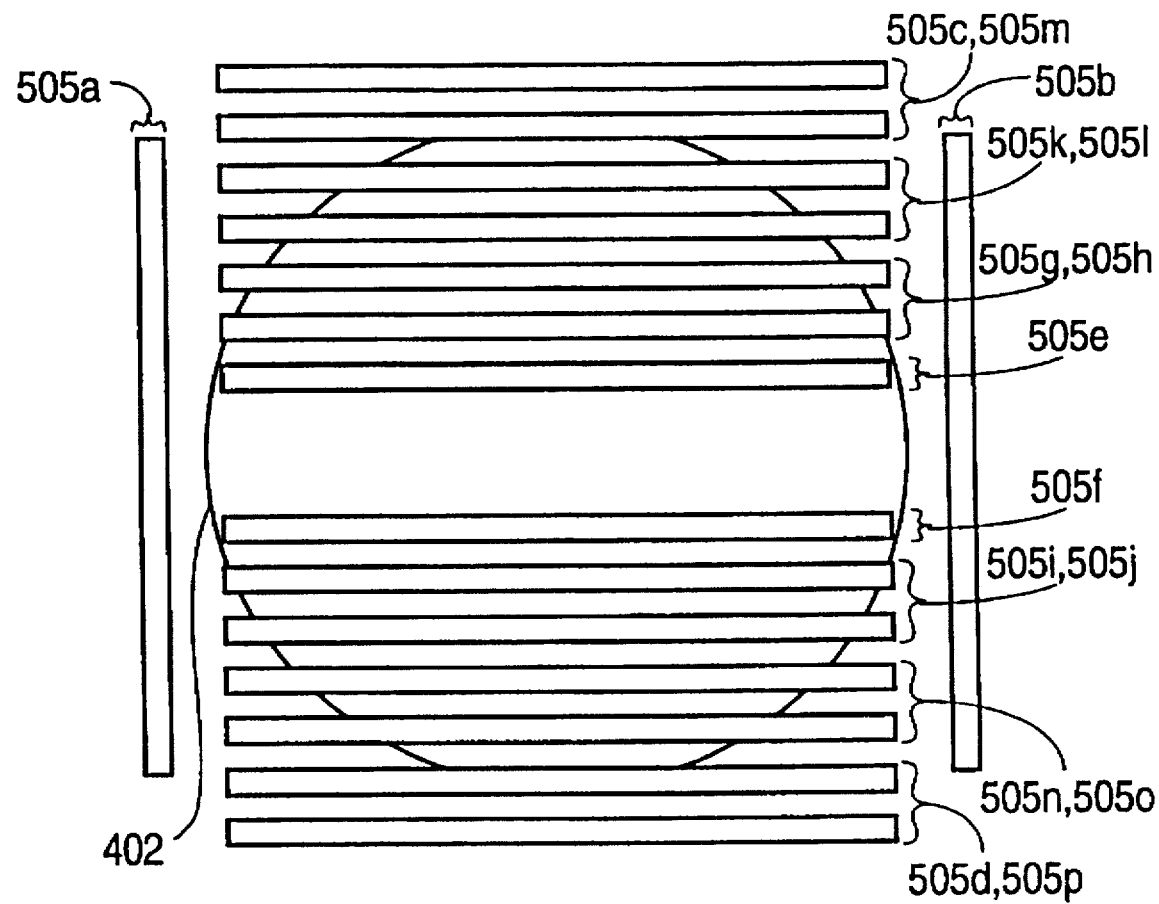
FIG. 12 is a plan view of lamps used with a reactor according to an embodiment of the invention showing the position of the lamps relative to the susceptor.

FIG. 12 is a plan view of the layout of lamps 505. As previously noted, there are sixteen lamps 505, i.e., 505a, 505b, 505c, 505d, 505e, 505f, 505g, 505h, 505i, 505j, 505k, 505l, 505m, 505n, 505o, 505p. The sixteen lamps 505 are formed in five groups. SCR 3 drives two side lamps 505a and 505b. SCR 4 drives four outermost lamps 505c, 505d, 505m and 505p in the middle row of lamps 505. SCR 5 drives two centermost lamps 505e and 505f in the middle row. SCR 6 drives lamps 505g, 505h, 505i and 505j, and SCR 7 drives lamps 505k, 505l, 505n and 505o.

According to the invention, lamps 505 may be connected in parallel or in a series/parallel combination. In the preferred embodiment of the invention, all lamps 505 are connected in parallel and operated using a 480 volt power supply. If, for instance, two lamps 505 were connected in series, it would be necessary to use a 960 volt power supply to run lamps 505.

Control of lamps 505 and resistance heater 407 to modulate the amount of heat supplied by each during operation of reactor 400 is performed by a computer. The computer automatically controls each group of lamps 505 and resistance heater according to parametric information stored in the computer and based upon previous temperature calibrations performed with reactor 400. The parametric information obtained from the calibration runs is used by the computer to change the SCR and resistance heater currents to achieve the proper spatial and temporal heat distributions necessary to maintain substantially uniform temperature throughout wafer 511 during the initial heating of wafer 511.

The computer control allows establishment of a number of different power ramp rates during initial heating of wafer 511. In one embodiment of the invention, up to 30 different ramp rates can be used during initial heating by appropriately pre-programming the computer. The power ramp rates used are determined empirically through a series of test runs of reactor 400 so as to maintain substantially uniform temperature in wafer 511 and, if appropriate to the process, minimize wafer slip.

When the temperature within reaction chamber 403 reaches a level at which the temperature sensor being used operates accurately (e.g., 800°–1100° C. if thermocouple 525 is used as the temperature sensor), the computer switches from the automatic control described above to feedback control. The sensed temperature is monitored by the computer and used, along with stored parametric information about the lamps 505 and resistance heater 407, to make appropriate adjustments to the SCRs and resistance heater 407 currents to appropriately control the heat output from lamps 505 and resistance heater 407 so as to maintain the temperature distribution throughout wafer 511 within predetermined limits. The power to all lamps 505 is either increased or decreased as one; however, the ratio of power between lamps is fixed, so that an increase in power to lamps 505 results in different amounts of increase to individual groups of lamps according to the pre-determined (during the calibration runs) power ratios for the lamp groups.

A side view of the middle row of lamps 505 of FIG. 12 is seen in FIG. 5A. Lamps 505 near the center of the row (and, thus, above the center of the susceptor 402), e.g., lamps 505e and 505f, are located further from the surface of susceptor 402 and, thus, the surface of wafer 511 (not shown in FIG. 12), than lamps 505 at either end of the row, e.g., lamps 505c and 505d. Consequently, though it might be expected that lamps 505c and 505d are operated to supply more heat than lamps 505e and 505f so that more heat is supplied to edge 511c (FIG. 5F) of wafer 511 to counteract the known heat loss at the wafer edge 511c and maintain substantially uniform temperature throughout wafer 511, this is not necessarily the case since the heat from lamps 505e and 505f must traverse a greater distance, as compared to lamps 505c and 505d, before being absorbed by wafer 511.

In embodiments of reactor 400 without resistance heater 407 and including cloth 807 (FIG. 8), during initial heating of wafer 511, lamps 505a, 505b, 505c and 505d (FIGS. 5A and 5B) directed to edge 511c of wafer 511 are controlled to radiate approximately 20–30% more energy than lamps 505e and 505f directed toward an area near the center of wafer 511. As reaction chamber 403 approaches the process temperature, lamps 505a, 505b, 505c and 505d are controlled to radiate approximately twice as much energy as lamps 505e and 505f. The other lamps 505 are controlled to radiate an amount of energy between the energy levels of lamps 505a, 505b, 505c, 505d and lamps 505e, 505f. The exact amount of energy radiated by the other lamps 505 is determined empirically so as to minimize wafer slip and produce acceptably uniform resistivity. The above relationships between the amount of energy radiated by various groups of lamps has been found to yield substantially uniform temperature throughout wafer 511 (or throughout each wafer when more than one wafer is being processed) as wafer 511 is heated up.

In other embodiments of the invention including resistance heater 407 (FIGS. 4A, 4B, 5E, 5F) instead of cloth 807, a similar relationship between the radiated energies of particular lamps 505 exists. The appropriate power ratios can be determined empirically by performing several calibration runs. It would be expected that centermost lamps 505e, 505f would provide more energy relative to outermost lamps 505a, 505b, 505c, 505d.

It is important to note that the lamp array shown in FIG. 12 accommodates embodiments of the invention with or without resistance heater 407. The lamp array remains the same in either embodiment; it is only necessary to perform temperature calibration runs to ascertain the appropriate power ratios for the respective groups of lamps 505 so that substantially uniform temperature is maintained throughout wafer 511.

Additionally, reactors according to the invention that are larger than reactor 400 can utilize the same lamp array similar to the array shown in FIG. 12; again, it is only necessary to perform temperature calibration runs to determine the appropriate lamp power ratios to achieve substantially uniform wafer temperature. Such larger reactors could be used to process larger wafers, or to process at one time more wafers of a given size, than is possible with reactor 400.

Figure 13A:
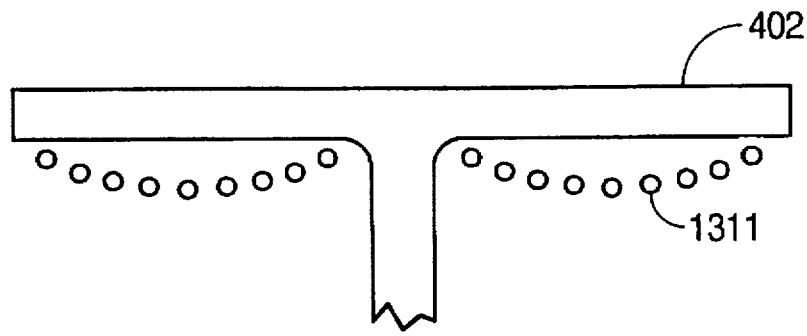
FIGS. 13A and 13B are a side view of an induction coil disposed beneath a susceptor according to an embodiment of the invention and a plan view of the induction coil, respectively.
Figure 13B:
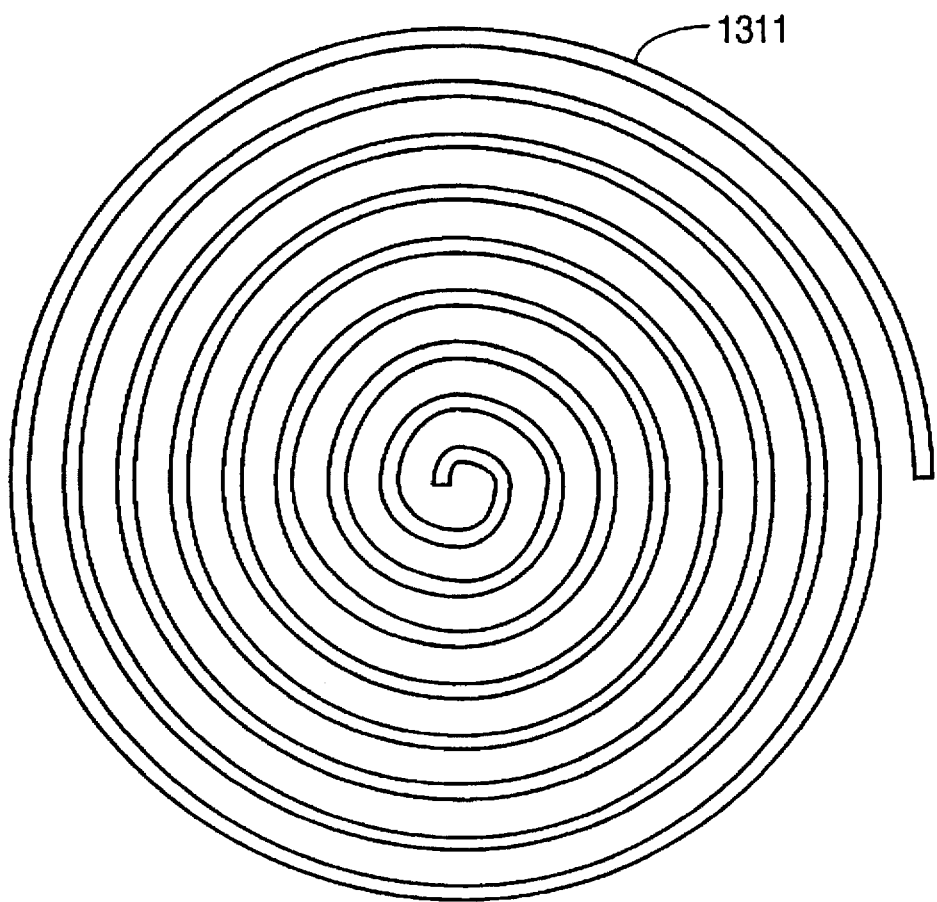

In an alternative embodiment of the invention, instead of using resistance heater 407 underneath susceptor 402, a radio frequency (RF) heat source including an induction coil is disposed below susceptor 402. FIGS. 13A and 13B are a side view of induction coil 1311 disposed beneath susceptor 402 according to an embodiment of the invention, and a plan view of induction coil 1311, respectively. Coil 1311 is wound substantially in a plane that is parallel to the plane of susceptor 402. As seen in FIG. 13A, the turns of coil 1311 have a variable distance from susceptor 402. At the edge of susceptor 402, the turns of coil 1311 are relatively close to susceptor 402. Moving toward the center of susceptor 402, the turns of coil 1311 become relatively farther from susceptor 402. Near the center of susceptor 402, the turns of coil 1311 become relatively close to susceptor 402 again.

Electric current is passed through coil 1311, inducing an electromagnetic field in the vicinity of coil 1311. This electromagnetic field, in turn, induces an electric current in susceptor 402. This current generates heat in susceptor 402. As is well known, the current distribution (and thus heat distribution) in susceptor 402 is a function of the distance between turns of coil 1311, the distance between a given turn of coil 1311 and susceptor 402, and the frequency of current passing through coil 1311. Therefore, these parameters are set so as to yield a desired temperature distribution in susceptor 402.

If an RF heat source is used, susceptor 402 must be graphite (rather than quartz) to absorb the energy from the electromagnetic field set up by the alternating current in coil 1311. Since graphite susceptor 402 must absorb energy to heat wafer 511 mounted on susceptor 402, more time is required to achieve a desired temperature level than is the case with the combination of resistance heater 407 and quartz susceptor 402.

Reactor 400 may be used to process single wafers or a plurality of wafers. Since the wafer or wafers to be processed are mounted in a recess in the susceptor, a different susceptor, e.g., susceptor 402, is required for each different wafer size since the number and size of the recesses are different. A different susceptor 402 is also required because of the different number of wafer support pins 513 (FIGS. 5E and 5F) used to raise the different sizes of wafers above susceptor 402. Typically, this does not present a barrier to achieving high wafer throughput since batches of a particular wafer size are normally processed one after the other, thus minimizing the number of susceptor changes that are required. Each susceptor, e.g., susceptor 402 is 14 inches (35.6 cm) in diameter and approximately 0.375–0.5 inches (0.95–1.27 cm) in thickness (other than at the location of the wafer recesses).

Susceptor 402 can be made of quartz. If susceptor 402 is made of quartz, the surface of susceptor 402 facing lamps 505 is bead blasted to increase heat retention. The surface of susceptor 402 facing resistance heater 407 or cloth 807 is made clear by, for instance, either flame polishing or mechanical polishing, thus allowing more heat to pass through susceptor 402 to wafer 511.

In the embodiment of the invention in which the heat source below susceptor 402 is resistance heater 407, susceptor 402 is preferably made of quartz, which absorbs relatively little of the heat from resistance heater 407. Most of the heat is transmitted through the quartz to wafer 511, thus enabling the wafer or wafers to be heated relatively rapidly (on the order of 15–30 seconds).

In embodiments of the invention in which an RF heat source is used beneath susceptor 402, susceptor 402 must be made of graphite to absorb the RF energy and generate heat that can be transmitted to wafer 511. If susceptor 402 is made of graphite, susceptor 402 is coated with a thin coating of silicon carbide to prevent contamination of wafer 511 with carbon as they sit on susceptor 402.

As has been noted several times, maintenance of a substantially uniform temperature throughout wafer 511 is essential for accurate processing of wafer 511. In particular, at the edge 511c of wafer 511, the heat dissipation from wafer 511 to the lower temperature ambient environment within reaction chamber 403 may give rise to large temperature gradients at the edge 511c which induce an undesirable phenomenon known as "slip" in epitaxial processing. Thus, there is a particular need for a means of controlling the temperature at the edge 511c of wafer 511.

Figure 14A:
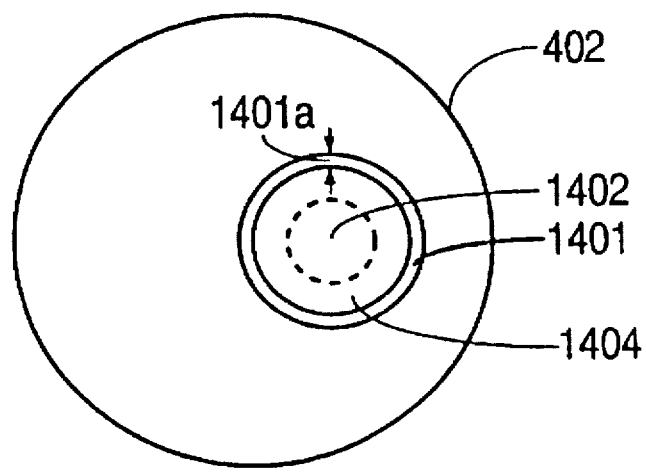
FIGS. 14A and 14B are a plan view and side view, respectively, of wafer and wafer surround ring mounted in a pocket of a susceptor according to an embodiment of the invention.
Figure 14B:
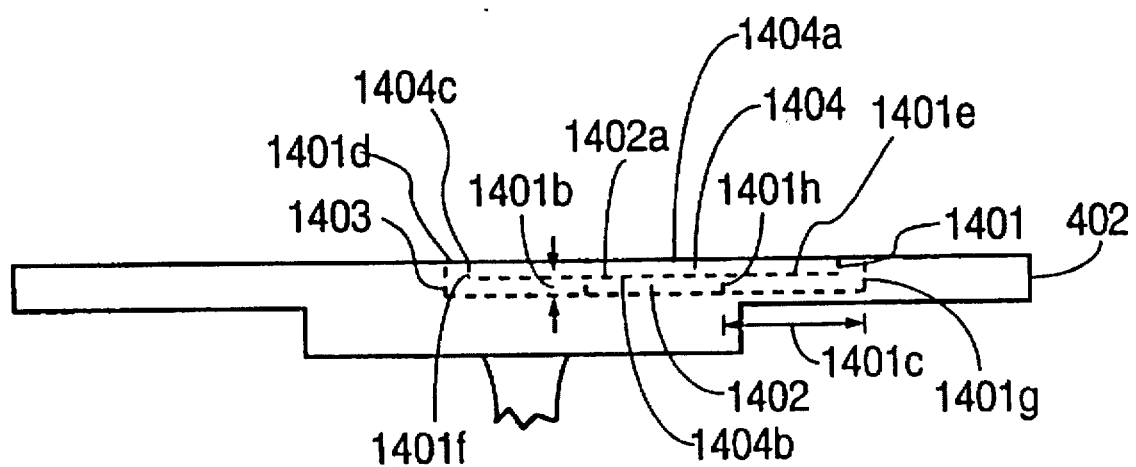

FIGS. 14A and 14B are a plan view and side view, respectively, of susceptor 402 on which wafer surround ring 1401 and wafer 1404 are mounted in pocket 1403 of susceptor 402 according to an embodiment of the invention. Wafer surround ring 1401 is mounted on spindle 1402 of susceptor 402. Spindle 1402 can be formed integrally with the remainder of susceptor 402 or spindle 1402 can be formed as a separate piece that is dropped into pocket 1403. (Hereafter, in the following description of the invention, "spindle" is used to refer to an element that is centrally located within pocket 1403 and can be formed integrally with, or separately from, susceptor 402. "Susceptor insert" is used to refer to an element that is centrally located within pocket 1403 and can only be formed separately from susceptor 402. However, the terms denote elements that are substantially similar, and the use of one or the other terms may encompass formation of the element separately or integrally with susceptor 402.) Wafer 1404 is mounted on top of wafer surround ring 1401 and spindle 1402 such that the upper surface of wafer 1404 is recessed slightly relative to wafer surround ring 1401.

Wafer surround ring 1401 is commercially available from Midland Materials Research of Midland, Mich. Wafer surround ring 1401 is made of a material with relatively low thermal conductivity such as, for instance, graphite or silicon carbide. Wafer surround ring 1401 has a thickness 1401a of 0.125 inches (3.18 mm), a thickness 1401b of 0.10 inches (2.54 mm) and a length 1401c of 0.60 inches (15.2 mm). Other thicknesses 1401a, 1401b and lengths 1401c can be used. If graphite is used, wafer surround ring 1401 is coated with silicon carbide having a thickness sufficient to prevent contamination of wafer 1404 with carbon. The exact thickness of the silicon carbide coating is proprietary information of Midland Materials Research.

FIGS. 14C, 14D, 14E, 14F and 14G are cross-sectional views of additional embodiments of a susceptor and wafer surround ring according to the invention.

Figure 14C:
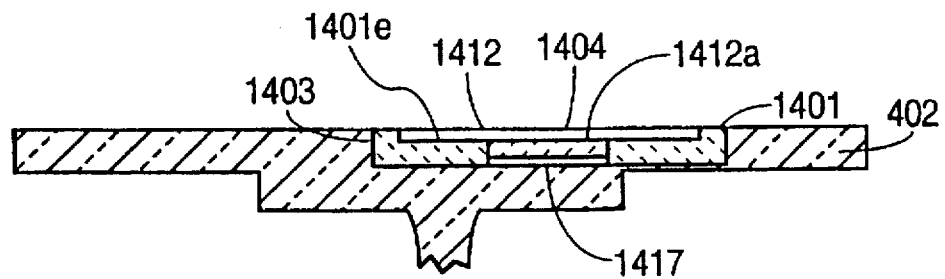
FIG. 14C is a cross-sectional view of a wafer surround ring, cloth, and wafer mounted in a pocket of a susceptor according to another embodiment of the invention.

In FIG. 14C, susceptor cloth 1417, which can be made of, for instance, silicon carbide or graphite, is first placed into pocket 1403. Susceptor insert 1412, which is made of quartz, is placed into the center of pocket 1403 on top of susceptor cloth 1417 so that a recess is formed between outer edge 1450 of susceptor insert 1412 and outer edge 1451 of pocket 1403. Wafer surround ring 1401 has a notch 1452 that has a bottom surface 1453 and an edge surface 1454 that connects bottom surface 1453 to top surface 1455. Bottom surface 1453 of wafer surround ring 1401 is aligned with a top surface 1456 of susceptor insert 1412. Top surface 1455 of wafer surround ring 1401 is aligned with the top surface of susceptor 402. Wafer surround ring 1401, which is made of, for instance, silicon carbide or graphite, is placed into the recess within pocket 1403 so that wafer surround ring 1401 surrounds susceptor insert 1412. Finally, wafer 1404 is placed on top of susceptor insert 1412 and into notch 1452 of wafer surround ring 1401.

Figure 14D:
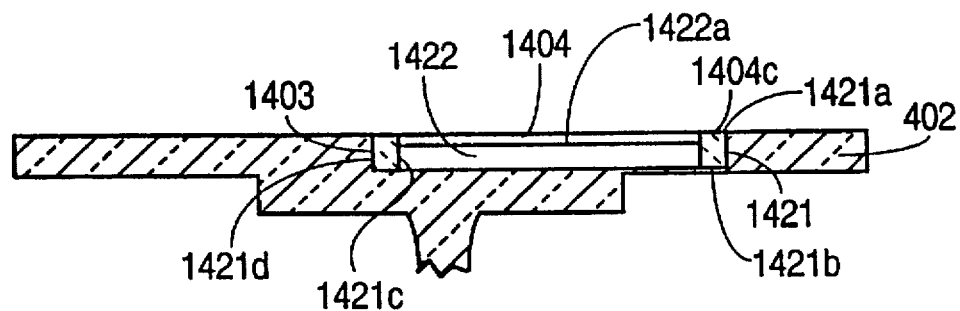
FIG. 14D is a cross-sectional view of a wafer surround ring and wafer mounted in a pocket of a susceptor according to another embodiment of the invention.

In FIG. 14D, wafer surround ring 1421 is placed around spindle 1422 in pocket 1403 of susceptor 402. Spindle 1422 can be made of, for instance, graphite or quartz. If spindle 1422 is made of graphite, spindle 1422 can be formed integrally with the rest of susceptor 402, or spindle 1422 can be formed as a separate piece and dropped into pocket 1403. Wafer surround ring 1421 is made of, for instance, silicon carbide or graphite.

Figure 14E:
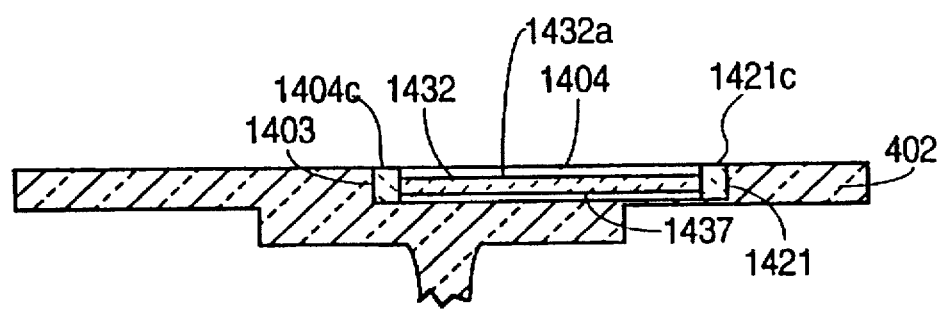
FIG. 14E is a cross-sectional view of a wafer surround ring, cloth, and wafer mounted in a pocket of a susceptor according to another embodiment of the invention.

In FIG. 14E, susceptor-cloth 1437 is dropped into pocket 1403. Susceptor insert 1432 is placed into the center of pocket 1403 on top of susceptor cloth 1437. Wafer surround ring 1421 is placed into pocket 1403 so that wafer surround ring 1421 surrounds susceptor insert 1432 and susceptor cloth 1437. Finally, wafer 1404 is placed on top of susceptor insert 1412 into the recess formed by wafer surround ring 1421. Susceptor cloth 1437 and susceptor insert 1432 are made of the same materials as susceptor cloth 1417 and susceptor insert 1412.

Figure 14F:
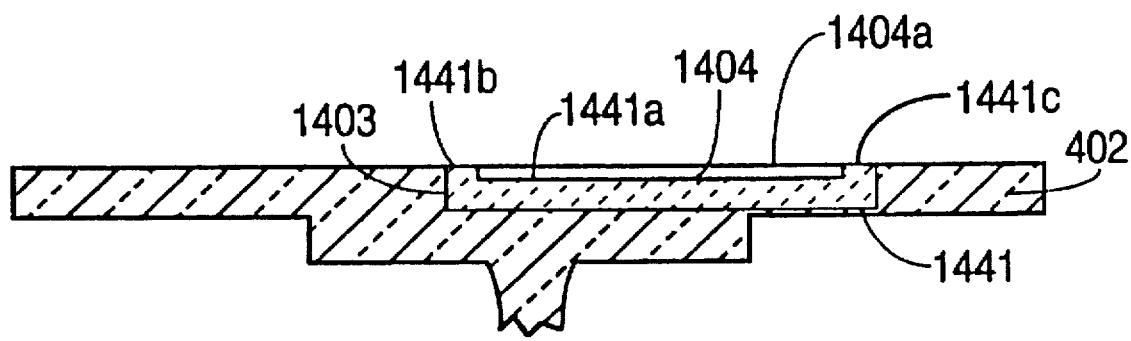
FIGS. 14F is a cross-sectional view of a wafer surround ring with a recess mounted in a pocket of a susceptor according to yet another embodiment of this invention.

In FIG. 14F, wafer surround ring 1441 is placed into pocket 1403. Wafer 1404 is placed into a recess formed in wafer surround ring 1441. Wafer surround ring 1441 can be made of, for instance, silicon carbide or graphite.

Figure 14G:
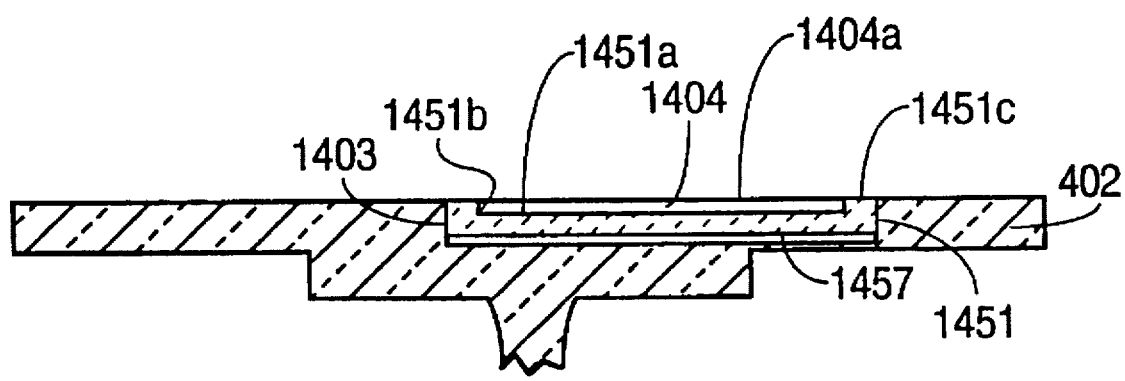
FIGS. 14G is a cross-sectional view of a wafer surround ring with a recess mounted in a pocket of a susceptor with a susceptor cloth placed in the bottom of the pocket according to yet another embodiment of this invention.

In FIG. 14G, susceptor cloth 1457, which is made of, for instance, silicon carbide or graphite, is dropped into pocket 1403. Wafer surround ring 1451, which is made of quartz, is placed on top of susceptor cloth 1457. Wafer 1404 is placed into a recess formed in wafer surround ring 1451.

In the above embodiments of FIGS. 14A–14G, the particular dimensions of the wafer surround ring, susceptor cloth, spindle and susceptor insert are determined empirically to minimize slip and maintain substantially uniform temperature in wafer 1404. Additionally, where quartz can be used in lieu of silicon carbide or graphite, the choice is made as a result of weighing the desirable heat retention of graphite or silicon carbide against the undesirable thermal inertia of those materials. Further, where quartz is used for a susceptor insert, spindle or wafer surround ring, the surface of the quartz can be bead-blasted or clear. Bead-blasting causes the quartz to retain more heat.

Figure 15A:
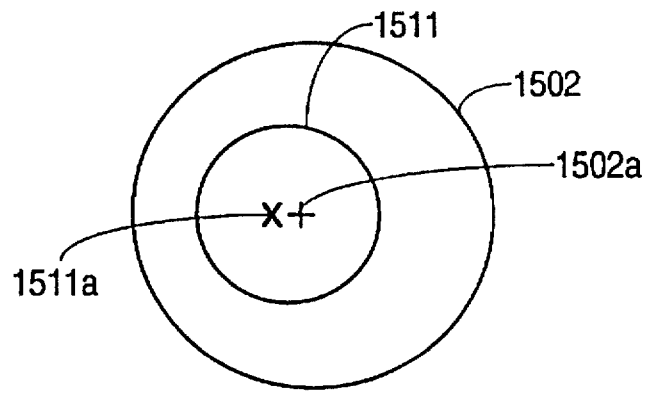
FIGS. 15A, 15B, 15C, 15D and 15E are top views of susceptors for use with a reactor according to the invention illustrating possible ways of mounting a wafer or wafers on a susceptor.
Figure 15B:
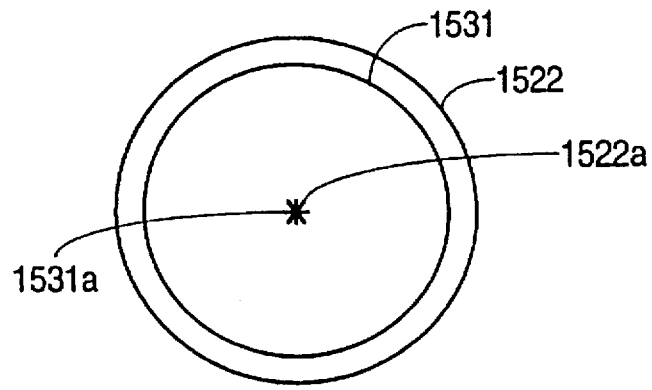
Figure 15C:
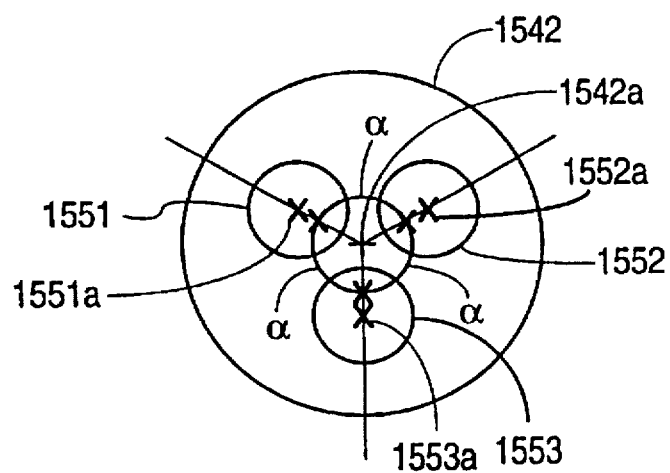

In reactor 400, there is an area of substantially uniform temperature at the center of reaction chamber 403 outside of which the wafer or-wafers being processed must not extend if substantially uniform temperature is to be maintained throughout the wafer or wafers during processing. However, within that region of substantially uniform temperature, a wafer or wafers may be mounted at any location on susceptor 402. FIGS. 15A, 15B and 15C are top views of three susceptors 1502, 1522, 1542 for use with reactor 400 illustrating three possible ways of mounting a wafer or wafers.

In FIG. 15A, wafer 1511 is mounted so that center 1511a of wafer 1511 is 2 inches (5.08 cm) from center 1502a of susceptor 1502. The large region of temperature uniformity established in reactor 400 maintains substantially uniform temperature throughout wafer 1511 even though wafer 1511 is not centered on susceptor 402 (i.e., wafer 1511 is not centered within reaction chamber 403). This off-center mounting is desirable because, with susceptor 1502 rotated into proper position, the distance that the wafer loading arm must travel in order to load wafer 1511 is minimized, thus reducing the chance that problems (e.g., misalignment of wafer 1511 on susceptor 1502) occur in the wafer handling process.

In FIG. 15B, wafer 1531 is mounted such that center 1531a of wafer 1531 is coincident with center 1522a of susceptor 1522 and, therefore, is approximately centered within the region of substantially uniform temperature in reaction chamber 403. Because of this centering, wafers 1531 processed with susceptor 1522 can be larger than wafers 1511 processed with susceptor 1502.

In FIG. 15C, wafers 1551, 1552, 1553 are located symmetrically on susceptor 1542. Centers 1551a, 1552a, 1553a of wafers 1551, 1552, 1553, respectively, are located 3.783 inches (9.609 cm) from center 1542a of susceptor 1542. Centers 1551a, 1552a, 1553a of wafers 1551, 1552, 1553, respectively, are located at an angle α of 120° with respect to each other in a radial direction around susceptor 1542. Since-more than one wafer is being processed at a time, in order to maintain wafers 1551, 1552, 1553 within the region of substantially uniform temperature in reaction chamber 403, the maximum size of wafers 1551, 1552, 1553 is smaller than the maximum size of wafer 1531 in FIG. 15B.

Though FIGS. 15A, 15B and 15C show either one or three wafers on a susceptor, susceptors on which two, four or more wafers are mounted can also be used with reactors according to the invention. However, the number of wafers that may be processed at one time is limited by the size of the wafers being processed.

Figure 15E:
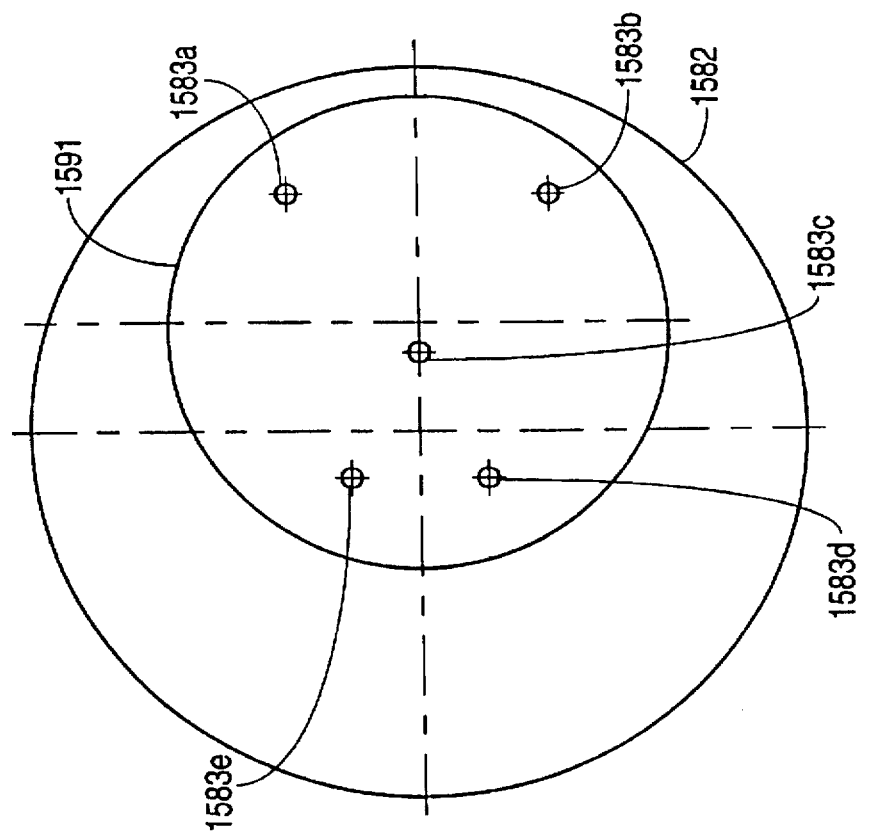
Figure 15D:
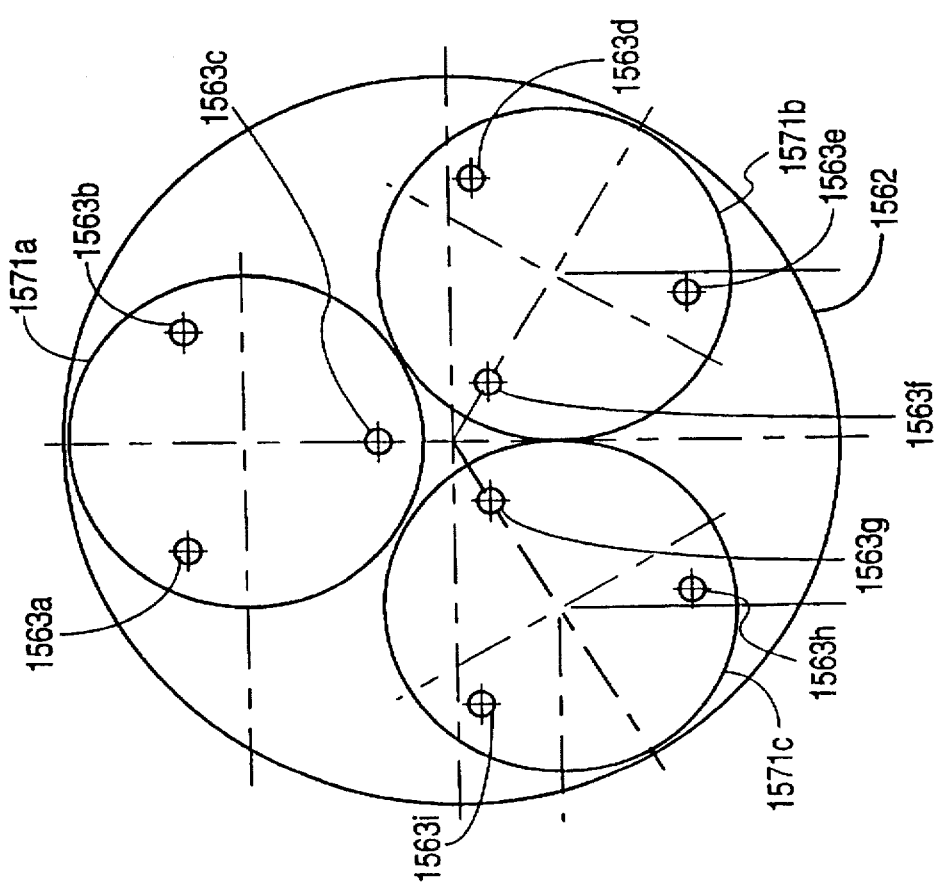

FIGS. 15D and 15E are plan views of susceptors 1562 and 1582, respectively, for use with reactor 400, on which three 150 mm (6 inch) wafers 1571a, 1571b, 1571c and one 200 mm (8 inch) wafer 1591, respectively, are mounted. In FIG. 15D, holes 1563a, 1563b, 1563c, 1563d, 1563e, 1563f, 1563g, 1563h, 1563i, formed through susceptor 1562 to allow wafer support pins 513 to extend to raise wafer 1571a, 1571b, 1571c above susceptor 1562. Each wafer 1571a, 1571b, 1571c is raised by rotating susceptor 1562 so that wafer 1571a, 1571b or 1571c is in position above mounting rods 512b, 512c, 512d. In FIG. 15E, holes 1583a, 1583b, 1583c, 1583d, 1583e are formed through susceptor 1582 to allow wafer support pins 513 to extend so that they can raise wafer 1591 above susceptor 1582. Wafer 1591 is raised by rotating susceptor 1582 so that wafer 1591 is in position above mounting rods 512a, 512b, 512c, 512d, 512e. Mounting rods 512a, 512b, 512c, 512d or mounting rods 512b, 512c, 512e can be used to raise wafer 1591.

As previously described, reactant gases from a gas panel are inlet into reaction chamber 403 through gas inlet tube 408a through either a gas injection head, e.g., gas injection head 414, or gas injection jets 421, and exhausted through exhaust lines 409a, 409b, 409c out of reactor 400 to a scrubber that cleans the gases before exhausting them to the atmosphere. In previous reactors, separate computers have been used to control the gas distribution system and scrubber individually.

Figure 16:
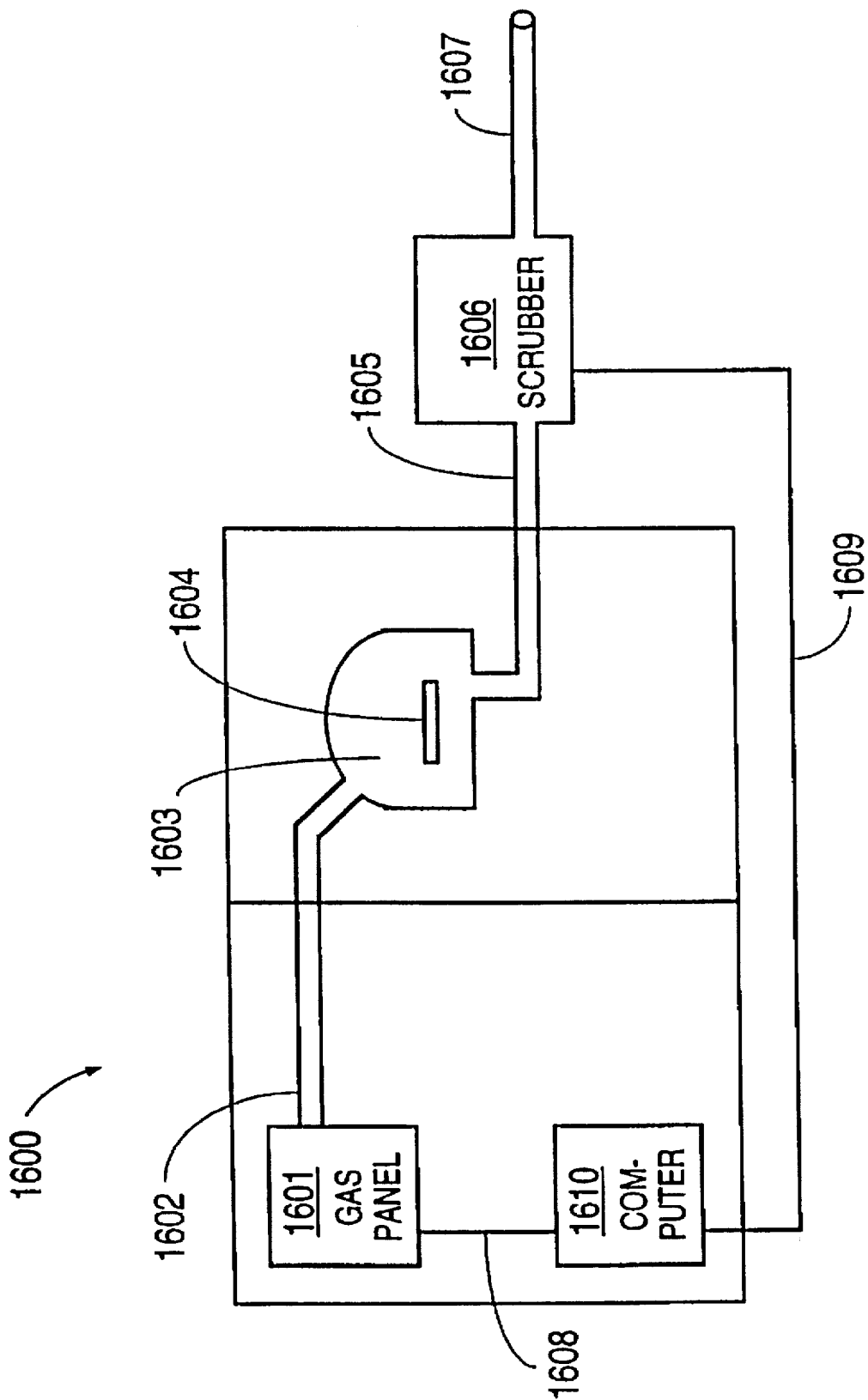
FIG. 16 is a simplified view of a reactor according to the invention in which a single computer is used to control both the gas panel and the scrubber.

FIG. 16 is a simplified view of a reactor 1600 according to the invention in which a single computer 1610 is used to control both gas panel 1601 and scrubber 1606. Reactant gases are distributed from gas panel 1601 through gas inlet 1602 to reaction chamber 1603. The gases flow through reaction chamber 1603 past wafer 1604 and are exhausted through gas exhaust 1605 to scrubber 1606. Scrubber 1606 cleans the gases and discharges them through scrubber exhaust 1607 to the atmosphere.

Computer 1610 controls the type and flow rate of gases distributed from gas panel 1601 via gas distribution control line 1608 according to operator specified data stored in computer 1610 for the desired process. Likewise, computer 1610 controls the cleansing operation of scrubber 1606 via scrubber control line 1609 according to other operator specified data stored in computer 1610 that are appropriate for the process gases used. Thus, in reactor 1600, unlike previous reactors, computer control of gas distribution and scrubbing, which are interrelated operations, is made easier since the data for each operation is stored and manipulated by one device.

In one embodiment of this invention, the process computer, as described above, controls the interlocks used in operation of the reactor as well as the temperature process controls, power control, etc. While the reactor of this invention includes many novel features, the operation of the process computer is similar to other reactors when the novel features described herein are taken into consideration. Nevertheless, an example of software used in the process computer for initial operational testing is presented in Microfiche Appendix A, which is incorporated herein by reference in its entirety. A computer suitable for this invention is manufactured by Prolog and is available from Western Technology Marketing of Mountain View, Calif. as Model No. CR345-01.

In another embodiment, in addition to process control of the reactor, the process computer includes a database of statistical data for each process run as well as the reactor configuration for each process run. When the database contains sufficient data for significant statistical analysis, the process computer takes complete control of the process cycle. The reactor operator simply enters information concerning the batch size, the desired process, and the required uniformities. The process computer takes this information and analyzes the database to determine the correct process parameters for the run. The process computer then automatically configures the reactor and automatically runs the process to obtain the results specified by the reactor operator.

Further, unlike prior art systems that had a computer for the reactor, another computer to control the gas cabinets, and yet another computer to control the scrubbers, the process computer of this invention will handle all of these operations. Thus, from a single console, the reactor operator can configure the gas panel to deliver gases in a particular sequence for a particular process and can configure the scrubber to process the exhaust gases as required. Centralization of these operations into a single computer reduces the hardware costs and more importantly reduces the time required to configure the entire system thereby further enhancing the batch cycle time.

Figure 17:
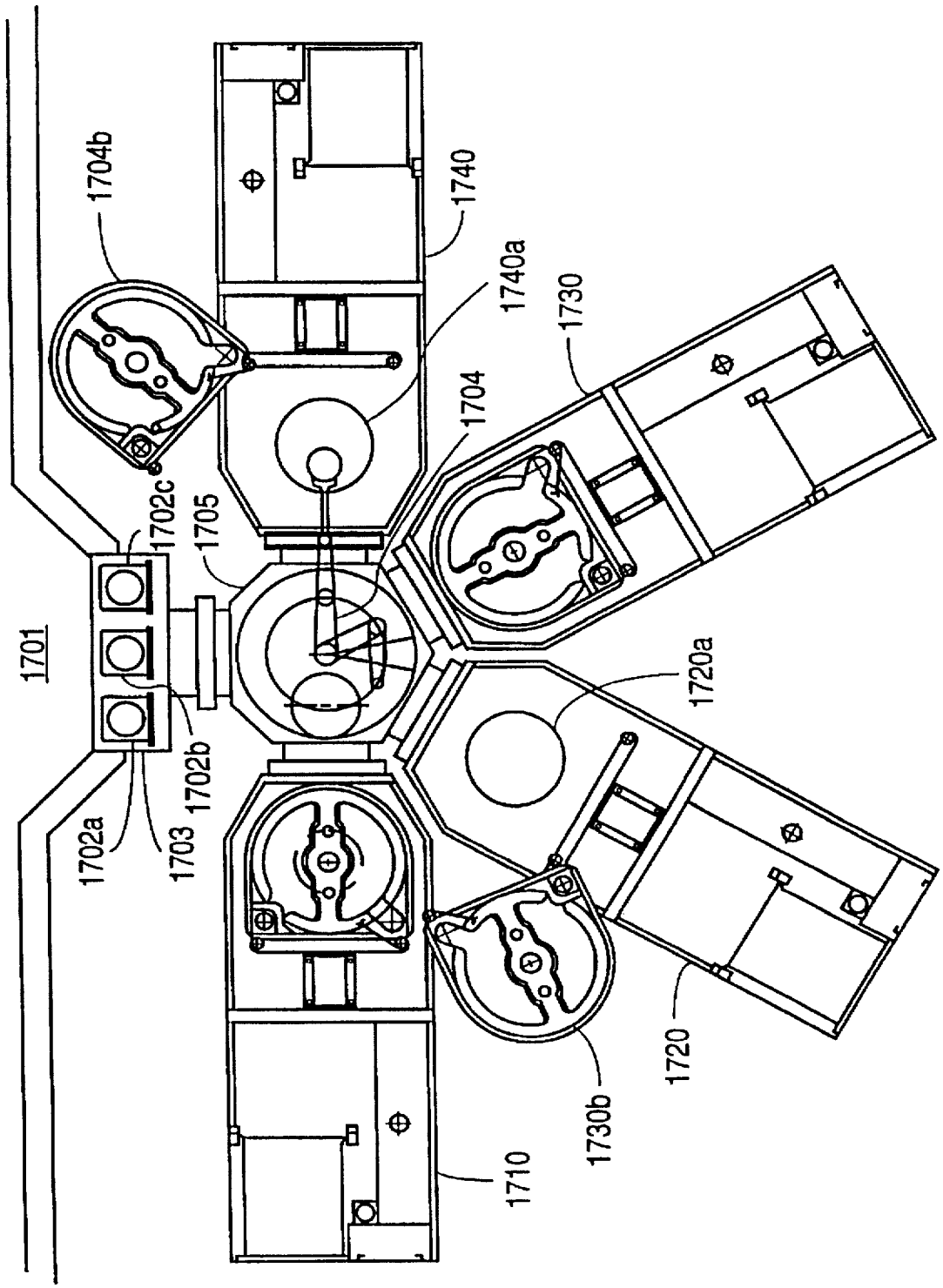
FIG. 17 is a top view of a cluster of reactors according to the invention, each of which is used to perform a particular semiconductor process, arranged around a sealed chamber containing a robot which transfers wafers between a cassette room and a reactor, or between two reactors.

Since, as noted above, a reactor according to the invention can be used for any of a number of semiconductor processes, it is possible to assemble a group of reactors to perform a sequential set of steps in a semiconductor process flow. FIG. 17 is a top view of a cluster of reactors 1710, 1720, 1730, 1740 according to the invention, each of which is used to perform a particular semiconductor process (e.g., deposition, annealing, etc.). Reactors 1710, 1720, 1730 and 1740 are arranged around sealed chamber 1705 in which robot 1704 is located. A plurality of wafer cassettes 1702a, 1702b, 1702c, each containing a plurality of wafers stacked on top of each other, are located in cassette room 1703 adjacent clean room 1701. Wafer cassettes 1702a, 1702b, 1702c are first transferred from clean room 1701 to cassette room 1703. A computer control system is used to direct robot 1704 to take an appropriate wafer from a wafer cassette, e.g., wafer cassette 1702a, from cassette room 1703 and load it into an appropriate reaction chamber, e.g., reaction chamber 1740a, of a reactor, e.g., reactor 1740. Robot 1704 is also controlled to transfer wafers from one reaction chamber, e.g., reaction chamber 1740a, to another reaction chamber, e.g., reaction chamber 1720a. Consequently, a semiconductor process flow can be automated and quickly performed using robot 1704 and a group of reactors, e.g., reactors 1710, 1720, 1730, 1740 according to the invention. Though four reactors 1710, 1720, 1730, 1740 are shown in FIG. 17, it is to be understood that two, three, five or more reactors according to the invention could be arranged in a similar manner.

As noted above with respect to reactor 400 of FIG. 4A and 4B, it is desirable to be able to pivot shell 452 of reactor 400 away from vessel 401 when maintenance is to be performed on reactor 400. Space limitations may make it preferable to pivot shell 452 to one side or the other of reactor 400. According to the invention, shell 452 may be easily pivoted to either side of reactor 400. In FIG. 17, reactor 1720 is shown with shell 1720*b* pivoted to a first side of reactor 1720, and reactor 1740 is shown with shell 1740*b* pivoted to a second side of reactor 1740.

Above, various embodiments of the invention have been described. The descriptions are intended to be illustrative, not limitative. Thus, it will be apparent to one skilled in the art that certain modifications may be made to the invention as described without departing from the scope of the claims set out below.

We claim:

1. In a reactor for processing a substrate, a structure comprising:

a susceptor having a first surface adapted for mounting a substrate thereon; a second surface; and a plurality of openings extending through said susceptor from said first surface to said second surface wherein each opening in said plurality of openings extending through said susceptor from said first surface to said second surface has a surface; and a plurality of substrate support pins;

wherein a substrate support pin is movably mounted in each of said plurality of openings and in a first position said substrate support pins are seated in said susceptor when said substrate is supported by said susceptor, and in a second position said substrate support pins hold said substrate above said first surface; and each substrate support pin in said plurality of substrate support pins has a surface wherein in said first position, the surface on the substrate support pin mates with the surface of the opening so as to inhibit gas flow through said plurality of openings in said susceptor during processing.

2. In a reactor for processing a substrate, the structure of claim 1 further comprising:

a plurality of supports, one for each substrate support pin, mounted in said reactor so that when said susceptor is in a third position, said plurality of supports hold said plurality of substrate support pins in said second position.

3. In a reactor for processing a substrate, the structure of claim 2 wherein when said susceptor is in a fourth position, said plurality of substrate support pins are in said first position.

4. In a reactor for processing a substrate, a structure as in claim 1 wherein said surface of said opening and said surface of said substrate support pin are both tapered so that said tapered surface of said substrate support pin mates with tapered surface of said opening is said first position.

5. A rapid thermal process reactor comprising:

a reaction chamber;

a rotatable susceptor mounted within the reaction chamber, and having:

a first surface adapted for supporting at least one substrate;

a second surface;

a plurality of openings extending through said rotatable susceptor from said first surface to said second surface with each opening in said plurality of openings extending through said rotatable susceptor from said first surface to said second surface having a surface; and a plurality of substrate support pins wherein a substrate support pin is movably mounted in each of said plurality of openings and in a first position said substrate support pins are seated in said susceptor when said at least one substrate is supported by said susceptor, and in a second position said substrate support pins hold said at least one substrate above said first surface; and each substrate support pin in said plurality of substrate support pins has a surface wherein in said first position, the surface on the substrate support pin mates with the surface of the opening so as to inhibit gas flow through said plurality of openings in said susceptor during processing; and a radiant heat source mounted outside said reaction chamber so that radiant heat from said heat source directly heats said at least one substrate.

6. A rapid thermal process reactor as in claim 5 further comprising:

a plurality of gas jets mounted within said rapid thermal process reaction chamber about an outer circumference of said rotatable rapid thermal process susceptor.

* * * * *